(12) United States Patent
Shibata et al.

(10) Patent No.: US 11,378,838 B2
(45) Date of Patent: Jul. 5, 2022

(54) METHOD FOR MANUFACTURING OPTICAL LAMINATE, OPTICAL LAMINATE, AND IMAGE DISPLAY DEVICE

(71) Applicant: FUJIFILM Corporation, Tokyo (JP)

(72) Inventors: Naoya Shibata, Kanagawa (JP); Naoya Nishimura, Kanagawa (JP); Wataru Hoshino, Kanagawa (JP); Yuzo Fujiki, Kanagawa (JP); Takashi Yonemoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/911,832

(22) Filed: Jun. 25, 2020

(65) Prior Publication Data
US 2020/0326590 A1    Oct. 15, 2020

Related U.S. Application Data

(63) Continuation of application No. PCT/JP2018/048318, filed on Dec. 27, 2018.

(30) Foreign Application Priority Data

Dec. 28, 2017  (JP) .............................. JP2017-254390
Dec. 13, 2018  (JP) .............................. JP2018-233812

(51) Int. Cl.
*G02F 1/1335*     (2006.01)
*C09K 19/60*      (2006.01)
(Continued)

(52) U.S. Cl.
CPC ...... *G02F 1/133528* (2013.01); *C09K 19/601* (2013.01); *G02F 1/1347* (2013.01);
(Continued)

(58) Field of Classification Search
CPC ......... G02F 1/133528; G02F 1/133788; G02F 2202/2043; G02F 1/13475; C09K 19/60;
(Continued)

(56) References Cited

U.S. PATENT DOCUMENTS

| 2007/0007492 A1 | 1/2007 | Takaku et al. |
| 2009/0323012 A1 | 12/2009 | He et al. |

(Continued)

FOREIGN PATENT DOCUMENTS

| CN | 102822142 B | * 11/2014 | ........... C07C 43/215 |
| JP | 2001-091737 A | 4/2001 | |

(Continued)

OTHER PUBLICATIONS

Office Action, issued by the Japanese Patent Office dated May 11, 2021, in connection with Japanese Patent Application No. 2019-562205.

(Continued)

*Primary Examiner* — Jessica M Merlin
(74) *Attorney, Agent, or Firm* — Edwards Neils LLC; Jean C. Edwards, Esq.

(57) ABSTRACT

An object of the present invention is to provide a method for manufacturing an optical laminate in which an alignment defect is less likely to occur in a light-absorbing anisotropic layer even in a case where a surface of a photo-alignment layer is rubbed; an optical laminate; and an image display device. The method for manufacturing an optical laminate according to an embodiment of the present invention is a method for manufacturing an optical laminate in which an optical laminate including a photo-alignment layer and a light-absorbing anisotropic layer and having a front transmittance of 60% or less is produced and which includes a photo-alignment layer formation step of forming a photo-alignment layer on a polymer film, and a light-absorbing (Continued)

anisotropic layer formation step of applying a liquid crystal composition containing a dichroic substance and a high-molecular liquid crystalline compound onto the photo-alignment layer to form a light-absorbing anisotropic layer.

12 Claims, 1 Drawing Sheet

(51) Int. Cl.
*G02F 1/1337* (2006.01)
*G02F 1/1347* (2006.01)

(52) U.S. Cl.
CPC .. *G02F 1/133784* (2013.01); *G02F 1/133788* (2013.01); *C09K 2219/03* (2013.01); *G02F 1/133541* (2021.01); *G02F 2201/08* (2013.01); *G02F 2202/023* (2013.01); *G02F 2202/043* (2013.01)

(58) Field of Classification Search
CPC .............. C09K 19/601; C09K 2219/03; C09K 2019/0448; C09K 19/3491; C09K 19/3497; C09K 19/3852; C90K 2019/546
See application file for complete search history.

(56) References Cited

U.S. PATENT DOCUMENTS

| | | | |
|---|---|---|---|
| 2013/0070899 | A1 | 3/2013 | Morishima et al. |
| 2014/0360860 | A1* | 12/2014 | Miyachi ............ C08F 122/1006 204/158.14 |
| 2017/0068031 | A1 | 3/2017 | Yoshizawa et al. |
| 2018/0346633 | A1 | 12/2018 | Hoshino et al. |
| 2018/0355179 | A1* | 12/2018 | Chang ................... C09B 35/027 |
| 2019/0101676 | A1 | 4/2019 | Katou et al. |

FOREIGN PATENT DOCUMENTS

| | | |
|---|---|---|
| JP | 2006-285197 A | 10/2006 |
| JP | 2007-009120 A | 1/2007 |
| JP | 2011-526321 A | 10/2011 |
| JP | 5300776 B2 | 9/2013 |
| JP | 5437744 B2 | 3/2014 |
| JP | 2014-066964 A | 4/2014 |
| JP | 2015-227947 A | 12/2015 |
| JP | 5923941 B2 | 5/2016 |
| JP | 2017-102479 A | 6/2017 |
| KR | 10-2005-0000572 A | 1/2005 |
| WO | 2017/154907 A1 | 9/2017 |
| WO | 2017/170036 A1 | 10/2017 |

OTHER PUBLICATIONS

International Search Report issued in PCT/JP2018/048318 dated Apr. 9, 2019.
Written Opinion issued in PCT/JP2018/048318 dated Apr. 9, 2019.
International Preliminary Report on Patentability completed by WIPO on Jun. 30, 2020 in connection with International Patent Application No. PCT/JP2018/048318.
Office Action, issued by the State Intellectual Property Office dated Aug. 4, 2021, in connection with Chinese Patent Application No. 201880083645.2.
Office Action, issued by the Korean Intellectual Property Office dated Jan. 17, 2022, in connection with corresponding Korean Patent Application No. 10-2020-7018202.
Notification of Reasons for Refusal that was issued by the Japanese Patent Office dated Nov. 2, 2021, in connection with Japanese Patent Application No. 2019-562205.
Office Action, issued by the Japanese Patent Office dated Mar. 8, 2022, in connection with corresponding Japanese Patent Application No. 2019-562205.
Office Action, issued by the State Intellectual Property Office dated Apr. 8, 2022, in connection with Chinese Patent Application No. 201880083645.2.

* cited by examiner

METHOD FOR MANUFACTURING OPTICAL LAMINATE, OPTICAL LAMINATE, AND IMAGE DISPLAY DEVICE

CROSS-REFERENCE TO RELATED APPLICATIONS

This application is a Continuation of PCT International Application No. PCT/JP2018/048318 filed on Dec. 27, 2018, which was published under Article 21(2) in Japanese, and which claims priority under 35 U.S.C. § 119(a) to Japanese Patent Application No. 2017-254390 filed on Dec. 28, 2017 and Japanese Patent Application No. 2018-233812 filed on Dec. 13, 2018. The above applications are hereby expressly incorporated by reference, in their entirety, into the present application.

BACKGROUND OF THE INVENTION

1. Field of the Invention

The present invention relates to a method for manufacturing an optical laminate, an optical laminate, and an image display device.

2. Description of the Related Art

In recent years, development of an organic light emitting diode (OLED) has been in process and enhancement of flexibility for each member used has been in progress. Above all, a circularly polarizing plate used for preventing the reflection of external light is required to have a high degree of polarization and flexibility.

In the related art, an iodine polarizer has been used in the circularly polarizing plate, but since the iodine polarizer is produced by dissolving or adsorbing iodine in or onto a high-molecular material such as polyvinyl alcohol to stretch the film at a high ratio in one direction into a shape of a film, sufficient flexibility was not attained.

In this regard, a polarizer in which a dichroic coloring agent is applied onto a substrate such as a transparent film and aligned using an intermolecular interaction or the like has been studied.

For example, JP5923941B proposes a polarizing element which has a high dichroic ratio by compatibilizing a dichroic azo coloring agent in a liquid crystal matrix having high alignment properties.

Moreover, JP5437744B proposes a polarizer which has a high concentration, is a thin film, and a high degree of polarization by using a dichroic azo coloring agent.

Furthermore, JP5300776B describes that alignment of the dichroic coloring agent can be controlled using a photo-alignment layer for regulating alignment by light irradiation.

SUMMARY OF THE INVENTION

The present inventors carried out a study in which a polarizer is produced by aligning a photo-alignment layer containing a photoactive compound on a support by light irradiation and then laminating a light-absorbing anisotropic layer containing a dichroic substance thereon.

As a result of the study, the present inventors have found that in a case where the surface of the photo-alignment layer is rubbed by a transporting roll or the like, an alignment defect occurs in the laminated light-absorbing anisotropic layer.

Therefore, an object of the present invention is to provide a method for manufacturing an optical laminate in which an alignment defect is less likely to occur in a light-absorbing anisotropic layer even in a case where a surface of a photo-alignment layer is rubbed; an optical laminate; and an image display device.

The present inventors have conducted extensive studies to achieve the object, and as a result, have found that by applying a liquid crystal composition containing a dichroic substance and a high-molecular liquid crystalline compound onto a photo-alignment layer to form a light-absorbing anisotropic layer, an alignment defect is less likely to occur in the light-absorbing anisotropic layer even in a case where a surface of the photo-alignment layer is rubbed, thereby completing the present invention.

That is, the present inventors have found that the object can be achieved by the following configuration.

[1] A method for manufacturing an optical laminate, in which an optical laminate including a photo-alignment layer and a light-absorbing anisotropic layer and having a front transmittance of 60% or less is produced, the method comprising: a photo-alignment layer formation step of forming a photo-alignment layer on a polymer film; and a light-absorbing anisotropic layer formation step of applying a liquid crystal composition containing a dichroic substance and a high-molecular liquid crystalline compound onto the photo-alignment layer to form a light-absorbing anisotropic layer.

[2] The method for manufacturing an optical laminate as described in [1], further comprising a step of bringing a surface of the photo-alignment layer on a side where the liquid crystal composition is applied into contact with a transporting roll, between the photo-alignment layer formation step and the light-absorbing anisotropic layer formation step.

[3] The method for manufacturing an optical laminate as described in [1] or [2], further comprising a step of winding the polymer film on which the photo-alignment layer is formed, between the photo-alignment layer formation step and the light-absorbing anisotropic layer formation step.

[4] The method for manufacturing an optical laminate as described in any one of [1] to [3], in which the photo-alignment layer formation step includes a step of applying a composition for forming a photo-alignment layer, which contains a compound having a photoreactive group, onto the polymer film to form a coating film, a step of drying the coating film by heating, and a step of irradiating the dried coating film with polarized light or irradiating a surface of the coating film with non-polarized light in an oblique direction.

[5] The method for manufacturing an optical laminate as described in [4], in which the composition for forming a photo-alignment layer is a composition which contains a compound having a photoreactive group and a crosslinkable group and does not contain a radical polymerization initiator.

[6] The method for manufacturing an optical laminate as described in any one of [1] to [5], in which the light-absorbing anisotropic layer formation step includes a step of applying the liquid crystal composition onto the photo-alignment layer to form a coating film and a step of aligning liquid crystalline components contained in the coating film.

[7] An optical laminate comprising: a photo-alignment layer, and a light-absorbing anisotropic layer, in which a front transmittance of the optical laminate is 60% or less, and the light-absorbing anisotropic layer is a layer formed of a liquid crystal composition containing a dichroic substance and a high-molecular liquid crystalline compound.

[8] The optical laminate as described in [7], in which in the liquid crystal composition, a proportion of a solid content of the high-molecular liquid crystalline compound is 55% to 95% by mass and a proportion of a solid content of the dichroic substance is 2% to 35% by mass.

[9] The optical laminate as described in [7] or [8], in which in the liquid crystal composition, the proportion of the solid content of the high-molecular liquid crystalline compound is 75% to 95% by mass and the proportion of the solid content of the dichroic substance is 5% to 25% by mass.

[10] The optical laminate according to any one of claims 7 to 9, in which the liquid crystal composition contains a high-molecular liquid crystalline compound having a repeating unit represented by Formula (1).

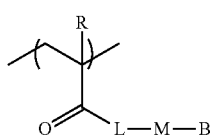
(1)

In Formula (1),

R represents a hydrogen atom or a methyl group.

L represents a single bond or a divalent linking group.

B represents a hydrogen atom, a halogen atom, a cyano group, an alkyl group, an alkoxy group, an amino group, an oxycarbonyl group, an acyloxy group, an acylamino group, an alkoxycarbonylamino group, a sulfonylamino group, a sulfamoyl group, a carbamoyl group, an alkylthio group, a sulfonyl group, a sulfinyl group, a ureido group, or a crosslinkable group.

M represents a mesogenic group represented by Formula (1-1).

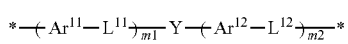
(1-1)

In Formula (1-1), $Ar^{11}$ and $Ar^{12}$ each independently represent a phenylene group or a biphenylene group which may have a substituent.

$L^{11}$ and $L^{12}$ each independently represent a single bond or a divalent linking group including no an azo group.

Y represents an imino group, a —OCO—CH=CH— group, or a —CH=CH—CO$_2$— group.

m1 and m2 each independently represent an integer of 1 to 3.

In a case where m1 is an integer of 2 or 3, a plurality of $Ar^{11}$'s may be the same as or different from each other and a plurality of L's may be the same as or different from each other.

In a case where m2 is an integer of 2 or 3, a plurality of $Ar^{12}$'s may be the same as or different from each other and a plurality of $L^{12}$'s may be the same as or different from each other.

[11] The optical laminate as described in any one of [7] to [9], in which the liquid crystal composition contains a high-molecular liquid crystalline compound having a repeating unit represented by Formula (2), and in Formula (2), a difference between a log P value of P1, L1, and SP1 and a log P value of M1 is 4 or more.

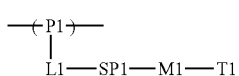
(2)

In Formula (2),

P1 represents a main chain of the repeating unit, L1 represents a single bond or a divalent linking group, SP1 represents a spacer group, M1 represents a mesogenic group, and T1 represents a terminal group.

Provided that in a case where M1 has a linking group, an azo group is not included as a linking group.

[12] The optical laminate as described in any one of [7] to [11], in which the liquid crystal composition contains a high-molecular liquid crystalline compound having a radically polymerizable group.

[13] The optical laminate as described in any one of [7] to [12], in which the liquid crystal composition contains a low-molecular liquid crystalline compound having a radically polymerizable group.

[14] The optical laminate as described in any one of [7] to [13], in which the photo-alignment layer is a layer formed of a composition containing a compound having a cinnamoyl group.

[15] The optical laminate as described in any one of [7] to [14], in which the photo-alignment layer is a layer formed of a composition containing a compound having a cinnamoyl group and a crosslinkable group.

[16] The optical laminate as described in any one of [7] to [15], in which the photo-alignment layer is a layer formed of a composition containing a compound having a cinnamoyl group and a radically polymerizable group.

[17] The optical laminate as described in any one of [7] to [13], in which the photo-alignment layer is a photo-alignment layer which contains a photoactive compound having an azo group as a photoactive group, and the photoactive compound is a low-molecular compound which has a molecular weight of 1,000 or less and does not have a polymerizable group.

[18] The optical laminate as described in any one of [7] to [17], further comprising a λ/4 plate.

[19] An image display device comprising the optical laminate as described in any one of [7] to [18].

According to the present invention, it is possible to provide a method for manufacturing an optical laminate in which an alignment defect is less likely to occur in a light-absorbing anisotropic layer even in a case where a surface of a photo-alignment layer is rubbed; an optical laminate; and an image display device.

DESCRIPTION OF THE PREFERRED EMBODIMENTS

Figure 1A:
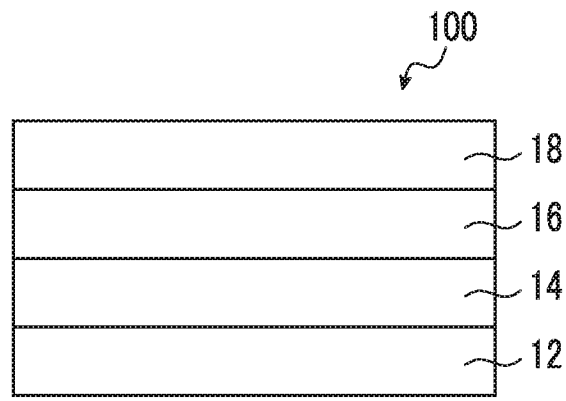
FIG. 1A is a schematic cross-sectional view showing an example of an optical laminate according to an embodiment of the present invention.

Hereinafter, the present invention will be described in detail.

Description of configuration requirements described below may be made based on representative embodiments of the present invention, but the present invention is not limited to such an embodiment.

Furthermore, in the present specification, a numerical range expressed using "to" means a range which includes the preceding and succeeding numerical values of "to" as a lower limit value and an upper limit value, respectively.

In addition, in the present specification, as each component, a substance corresponding to each component may be used alone or in combination of two or more kinds thereof. Here, in a case where two or more kinds of substances are used in combination for each component, a content of the component refers to a total content of the substances used in combination unless otherwise specified.

Moreover, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Method for Manufacturing Optical Laminate]

A method for manufacturing an optical laminate according to the embodiment of the present invention is a method for manufacturing an optical laminate in which an optical laminate including a photo-alignment layer and a light-absorbing anisotropic layer and having a front transmittance of 60% or less is produced.

The method for manufacturing an optical laminate according to the embodiment of the present invention includes a photo-alignment layer formation step of forming a photo-alignment layer on a polymer film, and a light-absorbing anisotropic layer formation step of applying a liquid crystal composition containing a dichroic substance and a high-molecular liquid crystalline compound onto the photo-alignment layer to form a light-absorbing anisotropic layer.

In the method for manufacturing an optical laminate according to the embodiment of the present invention, as described above, by applying the liquid crystal composition containing a dichroic substance and a high-molecular liquid crystalline compound onto the photo-alignment layer to form the light-absorbing anisotropic layer, it is possible to suppress occurrence of an alignment defect in the light-absorbing anisotropic layer even in a case where a surface of the photo-alignment layer is rubbed.

Details of a reason thereof are not yet clear, but the present inventors presume that the reason is as follows.

First, it is thought that in a case where the surface of the photo-alignment layer is rubbed, local disturbance occurs in alignment of the portion.

Therefore, it can be inferred that in a case where the liquid crystal composition containing a dichroic substance and a high-molecular liquid crystalline compound is used, alignment regulating force imparted to the photo-alignment layer can be propagated to surroundings by a large number of mesogenic moieties in the high-molecular liquid crystalline compound, and as a result, the same alignment as that of the surroundings can be realized without being affected by local disturbance of alignment present in the photo-alignment layer.

Next, the photo-alignment layer formation step, the light-absorbing anisotropic layer formation step, and other optional steps included in the method for manufacturing an optical laminate according to the embodiment of the present invention will be described in detail.

[Photo-Alignment Layer Formation Step]

The photo-alignment layer formation step included in the method for manufacturing an optical laminate according to the embodiment of the present invention is a step of forming a photo-alignment layer on a polymer film.

<Polymer Film>

The polymer film is not particularly limited, and a generally used polymer film (for example, a polarizer protective film) can be used.

Specific examples of a polymer constituting the polymer film include a cellulose-based polymer; an acrylic polymer having an acrylic acid ester polymer, such as polymethyl methacrylate and a lactone ring-containing polymer; a thermoplastic norbornene-based polymer; a polycarbonate-based polymer; a polyester-based polymer such as polyethylene terephthalate and polyethylene naphthalate; a styrene-based polymer such as polystyrene and an acrylonitrile-styrene copolymer (AS resin); a polyolefin-based polymer such as polyethylene, polypropylene, and an ethylene-propylene copolymer; a vinyl chloride-based polymer; an amide-based polymer such as nylon and aromatic polyamide; an imide-based polymer, a sulfone-based polymer; a polyethersulfone-based polymer, a polyetheretherketone-based polymer; a polyphenylene sulfide-based polymer; a vinylidene chloride-based polymer; a vinyl alcohol-based polymer, a vinyl butyral-based polymer; an arylate-based polymer, a polyoxymethylene-based polymer, an epoxy-based polymer, or a polymer obtained by mixing these polymers.

Among these, a cellulose-based polymer (hereinafter, also referred to as "cellulose acylate") represented by triacetyl cellulose can be preferably used.

Moreover, from the viewpoint of workability and optical performance, it is also preferable to use an acrylic polymer.

Examples of the acrylic polymer include polymethyl methacrylate or the lactone ring-containing polymer described in paragraphs [0017] to [0107] of JP2009-098605A.

In the present invention, in a case of an aspect in which a polymer film which can be peeled from the produced optical laminate is used, a cellulose-based polymer or a polyester-based polymer can be preferably used.

In addition, in the present invention, the polymer film is preferably transparent.

Here, "transparent" in the present invention indicates that a transmittance of visible light is 60% or more, preferably 80% or more, and particularly preferably 90% or more.

A thickness of the polymer film is not particularly limited, but is preferably 40 m or less for a reason that a thickness of the optical laminate can be reduced. The lower limit is not particularly limited, but is usually 5 μm or more.

<Photo-Alignment Layer>

The photo-alignment layer formed on the above-described polymer film is a photo-alignment layer containing a photoactive compound (compound having a photoreactive group).

In the present invention, the photo-alignment layer is preferably an alignment layer which is obtained through a step of applying a composition (hereinafter, also simply referred to as a "composition for forming a photo-alignment layer") which contains a compound having a photoreactive group onto the above-described polymer film to form a coating film, a step of drying the coating film by heating, and a step of irradiating the dried coating film with polarized light or irradiating a surface of the coating film with non-polarized light in an oblique direction, and to which the alignment regulating force is imparted.

The photoreactive group refers to a group generating a liquid crystal alignment capability by irradiation with light. Specifically, the photoreactive group causes alignment induction of molecules (called a photoactive compound) generated by irradiation with light, or a photoreaction which is an origin of a liquid crystal alignment capability, such as an isomerization reaction, a dimerization reaction, a photo-crosslinking reaction, or a photodegradation reaction.

The photoreactive group preferably has an unsaturated bond, particularly a double bond, and examples thereof includes a group having at least one bond selected from the group consisting of a carbon-carbon double bond (C=C bond), a carbon-nitrogen double bond (C=N bond), a nitrogen-nitrogen double bond (N=N bond), and a carbon-oxygen double bond (C=O bond).

Examples of the photoreactive group having a C=C bond include a vinyl group, a polyene group, a stilbene group, a stilbazole group, a stilbazolium group, a chalcone group, and a cinnamoyl group.

Examples of the photoreactive group having a C=N bond include a group having a structure of an aromatic Schiff's base, an aromatic hydrazone, or the like.

Examples of the photoreactive group having a C=O bond include a benzophenone group, a coumarine group, an anthraquinone group, and a maleimide group.

Examples of the photoreactive group (hereinafter, also simply referred to as an "azo group") having an N=N bond include an azobenzene group, an azonaphthalene group, an aromatic heterocyclic azo group, a bisazo group, a formazan group, and a group having azoxybenzene as a basic structure.

These groups may have a substituent such as an alkyl group, an alkoxy group, an aryl group, an allyloxy group, a cyano group, an alkoxycarbonyl group, a hydroxyl group, a sulfonic acid group, and a halogenated alkyl group.

Among these groups, a cinnamoyl group or an azobenzene group is preferable since a polarization irradiation amount required for photo-alignment is relatively small and a photo-alignment layer having excellent heat stability or temporal stability is easily obtained.

The photoactive compound having an azobenzene group is particularly preferably a photoactive compound represented by General Formula (I).

General Formula (I)

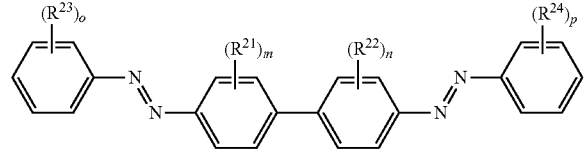

In the formula, $R^{21}$ to $R^{24}$ each independently represent a hydrogen atom or a substituent, provided that at least one of the groups represented by $R^{21}$ to $R^{24}$ represents a carboxyl group or a sulfo group; and m represents an integer of 1 to 4, n represents an integer of 1 to 4, o represents an integer of 1 to 5, p represents an integer of 1 to 5, but in a case where m, n, o, and p represent an integer of 2 or more, a plurality of $R^{21}$'s to $R^{24}$'s may be the same as or different from each other, respectively.

In General Formula (I), examples of the substituent represented by each of $R^{21}$ to $R^{24}$ include the following groups.

A carboxyl group (which may form a salt together with an alkali metal, and is preferably a carboxyl group not forming a salt or forming a sodium salt and more preferably the carboxyl group forming a sodium salt), a sulfo group (which may form a salt together with an alkali metal, and is preferably a sulfo group not forming a salt or forming a sodium salt and more preferably the sulfo group forming a sodium salt), an alkyl group (preferably an alkyl group having 1 to 20 carbon atoms, more preferably an alkyl group having 1 to 12 carbon atoms, and particularly preferably an alkyl group having 1 to 8 carbon atoms; and examples of the alkyl group include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms; and examples of the alkenyl group include a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms; and examples of the alkynyl group include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms; and examples of the aryl group include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms; and examples of the amino group include an unsubstituted amino group, a methylamino group, a dimethylamino group, a diethylamino group, and an anilino group), an alkoxy group (preferably an alkoxy group having 1 to 20 carbon atoms, more preferably an alkoxy group having 1 to 10 carbon atoms, and particularly preferably an alkoxy group having 1 to 6 carbon atoms; and examples of the alkoxy group include a methoxy group, an ethoxy group, and a butoxy group), an alkoxycarbonyl group (preferably an alkoxycarbonyl group having 2 to 20 carbon atoms, more preferably an alkoxycarbonyl group having 2 to 10 carbon atoms, and particularly preferably an alkoxycarbonyl group having 2 to 6 carbon atoms; and examples of the alkoxycarbonyl group include a methoxycarbonyl group and an ethoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms; and examples of the acyloxy group include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms; and examples of the acylamino group include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms; and examples of the alkoxycarbonylamino group include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms; and examples of the aryloxycarbonylamino group include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms; and examples of the sulfonylamino group include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms; and examples of the sulfamoyl group include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms; and examples of the carbamoyl group include an unsubstituted carbamoyl group, a methylcarbamoyl group, a diethylcarbamoyl group, and a phenylcarbamoyl group),
an alkylthio group (preferably an alkylthio group having 1 to 20 carbon atoms, more preferably an alkylthio group having 1 to 10 carbon atoms, and particularly preferably an alkylthio group having 1 to 6 carbon atoms; and examples of the alkylthio group include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms; and examples of the arylthio group include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms; and examples of the sulfonyl group include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms; and examples of the sulfinyl group include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms; and examples of the ureido group include an unsubstituted ureido group, a methylureido group, and a phenylureido group), a phosphoric acid amido group (preferably a phosphoric acid amido group having 1 to 20 carbon atoms, more preferably a phosphoric acid amido group having 1 to 10 carbon atoms, and particularly preferably a phosphoric acid amido group having 1 to 6 carbon atoms; and examples of the phosphoric acid amido group include a diethyl phosphoric acid amido group and a phenyl phosphoric acid amido group), a hydroxy group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, a heterocyclic group (preferably a heterocyclic group having 1 to 30 carbon atoms and more preferably a heterocyclic group having 1 to 12 carbon atoms, for example, a heterocyclic group having a heteroatom such as a nitrogen atom, an oxygen atom, and a sulfur atom; and examples of the heterocyclic group include an imidazolyl group, a pyridyl group, a quinolyl group, a furyl group, a piperidyl group, a morpholino group, a benzoxazolyl group, a benzimidazolyl group, and a benzothiazolyl group), and a silyl group (preferably a silyl group having 3 to 40 carbon atoms, more preferably a silyl group having 3 to 30 carbon atoms, and particularly preferably a silyl group having 3 to 24 carbon atoms; and examples of the silyl group include a trimethylsilyl group and a triphenylsilyl group) are included.

These substituents may be further substituted with these substituents. In addition, in a case where two or more of the substituents are contained, the substituents may be the same as or different from each other. Furthermore, if possible, the substituents may be bonded to each other to form a ring. The group represented by each of $R^2$ to R may be a polymerizable group or a substituent containing a polymerizable group.

In General Formula (I), the group represented by each of $R^2$ to $R^{24}$ is preferably a hydrogen atom, a carboxyl group, a sulfo group, a halogen atom, an alkyl group, an alkoxy group, a cyano group, a nitro group, an alkoxycarbonyl group, or a carbamoyl group, more preferably a hydrogen atom, a carboxyl group, a sulfo group, a halogen atom, a halogenated methyl group, a halogenated methoxy group, a cyano group, a nitro group, or a methoxycarbonyl group, and particularly preferably a hydrogen atom, a carboxyl group, a sulfo group, a halogen atom, a cyano group, or a nitro group.

At least one of groups represented by $R^2$ to $R^{24}$ is a carboxyl group or a sulfo group. The substitution position of the carboxyl group or the sulfo group is not particularly limited, but from the viewpoint of a photoactive action, it is preferable that at least one $R^2$ and/or at least one $R^2$ is a sulfo group, and more preferable that at least one $R^2$ and at least one $R^2$ are each a sulfo group. Furthermore, from the same viewpoint, it is preferable that at least one $R^2$ and/or at least one $R^{24}$ is a carboxyl group, and more preferable that at least one $R^2$ and at least one $R^2$ are each a carboxyl group. It is still more preferable that the carboxyl group is $R^{23}$ or $R^{24}$ substituted at the meta position with respect to the azo group.

In General Formula (I), m represents an integer of 1 to 4, n represents an integer of 1 to 4, o represents an integer of 1 to 5, and p represents an integer of 1 to 5. Preferably, m is an integer of 1 or 2, n is an integer of 1 or 2, o is an integer of 1 or 2, and p is an integer of 1 or 2.

Specific examples of the compound represented by General Formula (I) are shown below, but the compound is not limited to the following specific examples.

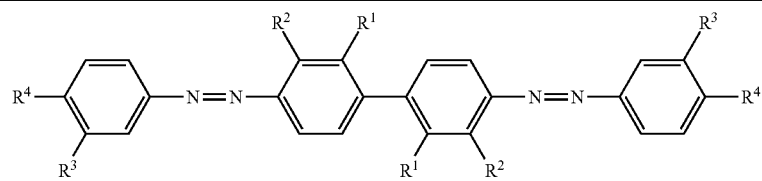

| No. | $R^1$ | $R^2$ | $R^3$ | $R^4$ |
|-----|-------|-------|-------|-------|
| E-1 | —SO$_3$Na | —H | —COOH | —OH |
| E-2 | —H | —SO$_3$Na | —COOH | —OH |

-continued

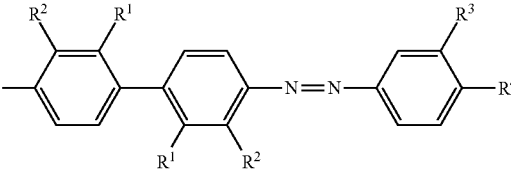

| No. | R¹ | R² | R³ | R⁴ |
|---|---|---|---|---|
| E-3 | —SO₃Na | —H | —COONa | —OH |
| E-4 | —H | —SO₃Na | —COONa | —OH |
| E-5 | —CH₃ | —H | —COONa | —OH |
| E-6 | —H | —CH₃ | —COONa | —OH |
| E-7 | —H | —OCH₃ | —COONa | —OH |
| E-8 | —H | —OCF₃ | —COONa | —OH |
| E-9 | —H | —Cl | —COONa | —OH |
| E-10 | —H | —CN | —COONa | —OH |
| E-11 | —H | —NO₂ | —COONa | —OH |
| E-12 | —COOCH₃ | —H | —COONa | —OH |
| E-13 | —CONH₂ | —H | —COONa | —OH |
| E-14 | —SO₂NH₂ | —H | —COONa | —OH |
| E-15 | —SO₃Na | —H | —COONa | —OH |
| E-16 | —SO₃Na | —H | —CH₂OH | —OH |
| E-17 | —H | —SO₃Na | —CH₂OH | —OH |

| E-18 | —SO₃Na | —H | —COOH | 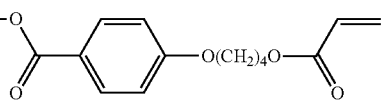 |
| E-19 | —H | —SO₃Na | —COOH | 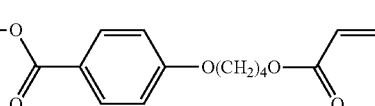 |
| E-20 | —CH₃ | —H | —COONa | 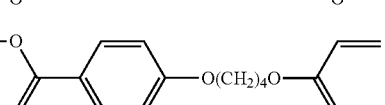 |
| E-21 | —H | —CH₃ | —COONa | 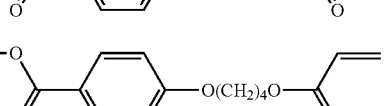 |
| E-22 | —SO₃Na | —H | —CF₃ | 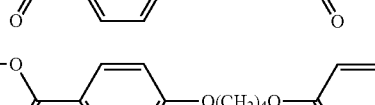 |
| E-23 | —H | —SO₃Na | —CF₃ | 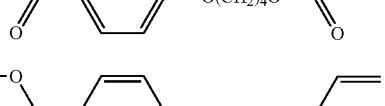 |
| E-24 | —SO₃Na | —H | —COOH | 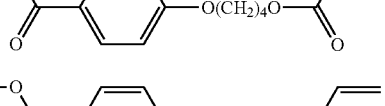 |
| E-25 | —CH₃ | —H | —COONa | 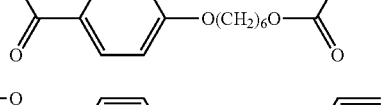 |
| E-26 | —SO₃Na | —H | —CF₃ | 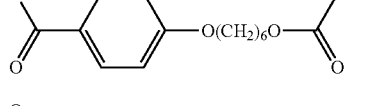 |

In the present invention, for a reason that a degree of alignment is excellent, a compound having an azo group (particularly, an azobenzene group) having a nitrogen-nitrogen double bond (N=N bond) is preferably a low-molecular-weight compound which is represented by each of E-1 to E-17 or the like, has a molecular weight of 1,000 or less, and does not have a polymerizable group.

On the other hand, the photoactive compound having a cinnamoyl group is preferably a polymer for a reason that an influence by contact of the photo-alignment layer is small.

Moreover, for a reason that the influence by the contact of the photo-alignment layer is further reduced, a polymer having a crosslinkable group together with a cinnamoyl group is preferable.

The crosslinkable group may a group which causes a crosslinking reaction to be cross-linked, and examples thereof include a cationically polymerizable group such as an epoxy group; a radically polymerizable group such as acrylate and methacrylate; or the like.

On the other hand, in order to improve adhesiveness described later, it is more preferable that a hard film of the photo-alignment layer has both a cationically polymerizable group and a radically polymerizable group from the viewpoint that functions can be separately used.

(Photo-Alignment Copolymer)

Suitable examples of the polymer having a crosslinkable group together with a cinnamoyl group include a photo-alignment copolymer which has a repeating unit A containing a cinnamoyl group and represented by Formula (A) and a repeating unit B containing a crosslinkable group and represented by Formula (B).

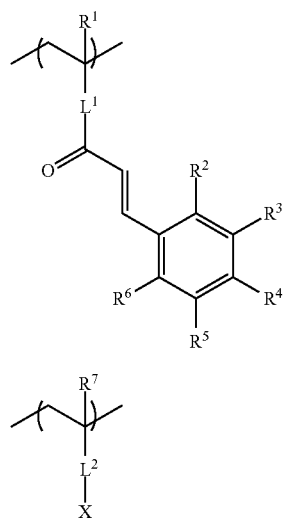

In Formula (A), $R^1$ represents a hydrogen atom or a methyl group. $L^1$ represents a divalent linking group containing a nitrogen atom and a cycloalkane ring, and some of carbon atoms constituting the cycloalkane ring may be substituted with a heteroatom selected from the group consisting of nitrogen, oxygen, and sulfur.

$R^2$, $R^3$, $R^4$, $R^5$, and $R^6$ each independently represent a hydrogen atom or a substituent, and among $R^2$, $R^3$, $R^4$, $R^5$, and $R^6$, two adjacent groups may be bonded to each other to form a ring.

In Formula (B), $R^7$ represents a hydrogen atom or a methyl group, $L^2$ represents a divalent linking group, and X represents a crosslinkable group.

In the present invention, by using the photo-alignment copolymer which has the repeating unit A containing a cinnamoyl group and represented by Formula (A) and the repeating unit B containing a crosslinkable group and represented by Formula (B), solvent resistance of the obtained photo-alignment layer and alignment properties (hereinafter, simply referred to as "liquid crystal alignment properties") of the high-molecular liquid crystalline compound in a case where a light-absorbing anisotropic layer described later are formed are improved.

This is not clear in detail, but the present inventors presume as follows.

That is, it is thought that in a case where a divalent linking group represented by L in Formula (A) contains a nitrogen atom and a cycloalkane ring, hydrogen bonding properties and molecular rigidity are increased to suppress molecular motion, and as a result, solvent resistance is improved.

Similarly, it is thought that in a case where a divalent linking group represented by $L^1$ in Formula (A) contains a nitrogen atom and a cycloalkane ring, a glass transition temperature of a copolymer rises, temporal stability of the obtained photo-alignment layer is improved, and as a result, liquid crystal alignment properties are improved irrespective of a timing of forming the optically anisotropic layer.

Next, the divalent linking group containing a nitrogen atom and a cycloalkane ring and represented by $L^1$ in Formula (A) will be described. Furthermore, in the present invention, as described above, some of carbon atoms constituting the cycloalkane ring may be substituted with a heteroatom selected from the group consisting of nitrogen, oxygen, and sulfur. Moreover, in a case where some of carbon atoms constituting the cycloalkane ring are substituted with a nitrogen atom, a nitrogen atom may not be contained separately from the cycloalkane ring.

In addition, the cycloalkane ring contained in the divalent linking group represented by $L^1$ in Formula (A) is preferably a cycloalkane ring having 6 or more carbon atoms, and specific examples thereof include a cyclohexane ring, a cyclopeptane ring, a cyclooctane ring, a cyclododecane ring, and a cyclodocosane ring.

In the present invention, for a reason that the liquid crystal alignment properties are further improved, $L^1$ in Formula (A) is preferably a divalent linking group represented by any one of Formula (1), . . . , or (10).

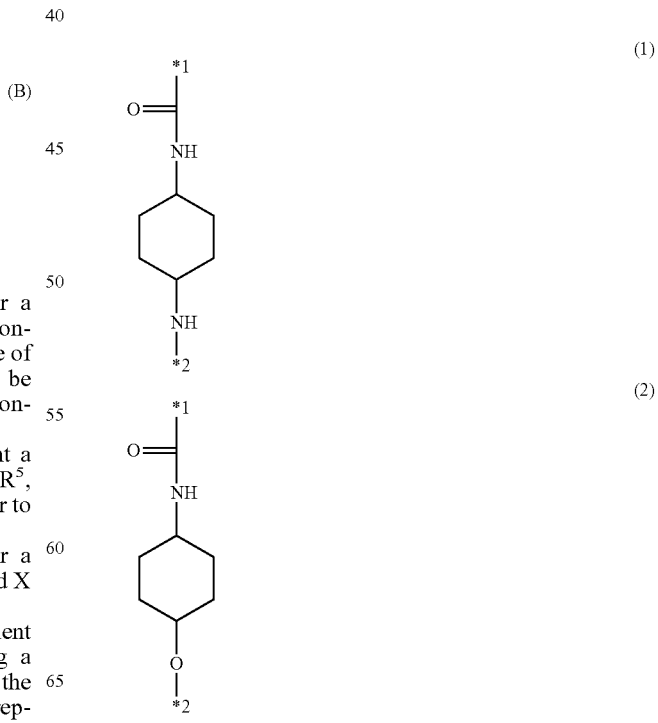

-continued (3)
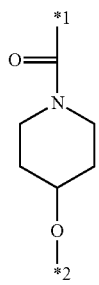

(4)
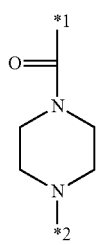

(5)
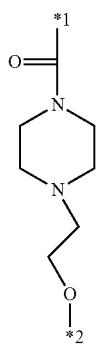

(6)
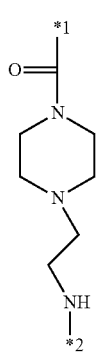

(7)
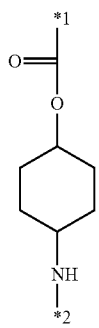

-continued (8)
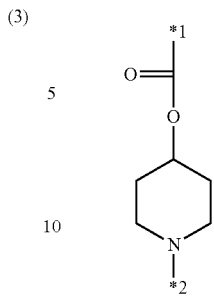

(9)
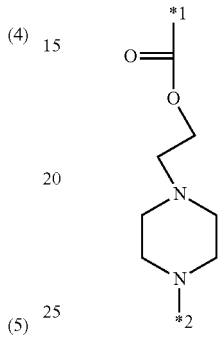

(10)
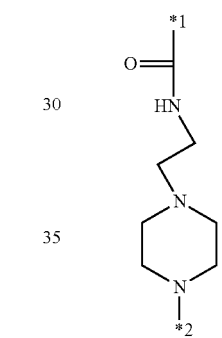

In Formulae (1) to (10), *1 represents a bonding position to a carbon atom constituting a main chain in Formula (A), and *2 represents a bonding position to a carbon atom constituting a carbonyl group in Formula (A).

Among the divalent linking groups represented by any of Formulae (1) and (10), for a reason that balance between a solubility in a solvent used in a case where the photo-alignment layer is formed and solvent resistance of the obtained photo-alignment layer is improved, a divalent linking group represented by any one of Formula (2), (3), (7), or (8) is preferable.

Next, the substituents represented by one aspect of $R^2$, $R^3$, $R^4$, $R^5$, and $R^6$ in Formula (A) will be described. Furthermore, as described above, $R^2$, $R^3$, $R^4$, $R^5$, and $R^6$ in Formula (A) may be a hydrogen atom instead of a substituent.

For a reason that a cinnamoyl group easily interacts with a liquid crystalline compound and liquid crystal alignment properties are further improved, the substituents represented by one aspect of $R^2$, $R^3$, $R^4$, $R^5$, and $R^6$ in Formula (A) are each independently preferably a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, an amino group, or a group represented by Formula (11).

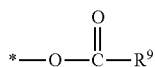
(11)

Here, in Formula (11), * represents a bonding position to the benzene ring in Formula (A), $R^9$ represents a monovalent organic group.

Examples of the halogen atom include a fluorine atom, a chlorine atom, a bromine atom, and an iodine atom, and among these, a fluorine atom or a chlorine atom is preferable.

With regard to the linear, branched, or cyclic alkyl group having 1 to 20 carbon atoms, as the linear alkyl group, an alkyl group having 1 to 6 carbon atoms is preferable, and specific examples thereof include a methyl group, an ethyl group, and an n-propyl group.

As the branched alkyl group, an alkyl group having 3 to 6 carbon atoms is preferable, and specific examples thereof include an isopropyl group and a tert-butyl group.

As the cyclic alkyl group, an alkyl group having 3 to 6 carbon atoms is preferable, and specific examples thereof include a cyclopropyl group, a cyclopentyl group, and a cyclohexyl group.

As the linear halogenated alkyl group having 1 to 20 carbon atoms, a fluoroalkyl group having 1 to 4 carbon atoms is preferable, specific examples thereof include a trifluoromethyl group, a perfluoroethyl group, a perfluoropropyl group, and a perfluorobutyl group, and among these, a trifluoromethyl group is preferable.

As the alkoxy group having 1 to 20 carbon atoms, an alkoxy group having 1 to 18 carbon atoms is preferable, an alkoxy group having 6 to 18 carbon atoms is more preferable, and an alkoxy group having 6 to 14 carbon atoms is still more preferable. Suitable specific examples thereof include a methoxy group, an ethoxy group, an n-butoxy group, a methoxyethoxy group, an n-hexyloxy group, an n-octyloxy group, an n-decyloxy group, an n-dodecyloxy group, and an n-tetradecyloxy group, and among these, an n-hexyloxy group, an n-octyloxy group, an n-decyloxy group, an n-dodecyloxy group, and an n-tetradecyloxy group are more preferable.

As the aryl group having 6 to 20 carbon atoms, an aryl group having 6 to 12 carbon atoms is preferable, specific examples thereof include a phenyl group, an α-methylphenyl group, and a naphthyl group, and among these, a phenyl group is preferable.

As the aryloxy group having 6 to 20 carbon atoms, an aryloxy group having 6 to 12 carbon atoms is preferable, specific examples thereof include a phenyloxy group and a 2-naphthyloxy group, and among these, a phenyloxy group is preferable.

Examples of the amino group include a primary amino group ($-NH_2$); a secondary amino group such as a methylamino group; and a tertiary amino group such as a dimethylamino group, a diethylamino group, a dibenzylamino group, and a group containing a nitrogen atom of a nitrogen-containing heterocyclic compound (for example, pyrrolidine, piperidine, and piperazine) as a bond.

With regard to the group represented by Formula (11), examples of the monovalent organic group represented by $R^9$ in Formula (11) include a linear or cyclic alkyl group having 1 to 20 carbon atoms.

As the linear alkyl group, an alkyl group having 1 to 6 carbon atoms is preferable, specific examples thereof include a methyl group, an ethyl group, and an n-propyl group, and among these, a methyl group or an ethyl group is preferable.

As the cyclic alkyl group, an alkyl group having 3 to 6 carbon atoms is preferable, specific examples thereof include a cyclopropyl group, a cyclopentyl group, and a cyclohexyl group, and among these, a cyclohexyl group is preferable.

Furthermore, the monovalent organic group represented by $R^9$ in Formula (11) may be a group obtained by combining a plurality of the above-described linear alkyl groups and cyclic alkyl groups directly or via a single bond.

In the present invention, for a reason that a cinnamoyl group easily interacts with a liquid crystalline compound and liquid crystal alignment properties are further improved, among $R^2$, $R^3$, $R^4$, $R^5$, and $R^6$ in Formula (A), it is preferable that at least $R^4$ represents the above-described substituent, and for a reason that linearity of the obtained photo-alignment copolymer is improved, an interaction with a liquid crystalline compound becomes easy, and liquid crystal alignment properties are further improved, it is more preferable that all of $R^2$, $R^3$, $R^5$, and $R^6$ represent hydrogen atoms.

In the present invention, for a reason that reaction efficiency is improved in a case where the obtained photo-alignment layer is irradiated with light, R in Formula (A) is preferably an electron-donating substituent.

Here, the electron-donating substituent (electron-donating group) refers to a substituent having a Hammett value (Hammett substituent constant σp) of 0 or less, and examples thereof include an alkyl group, a halogenated alkyl group, and an alkoxy group among the above-described substituents.

Among these, an alkoxy group is preferable, and for a reason that liquid crystal alignment properties are further improved, an alkoxy group having 6 to 16 carbon atoms is more preferable and an alkoxy group having 7 to 10 carbon atoms is still more preferable.

Next, the divalent linking group represented by $L^2$ in Formula (B) will be described.

For a reason that a cinnamoyl group easily interacts with a liquid crystalline compound and liquid crystal alignment properties are further improved, the divalent linking group is preferably a divalent linking group obtained by combining at least two groups selected from the group consisting of a linear, branched, or cyclic alkylene group having 1 to 18 carbon atoms, which may have a substituent, an arylene group having 6 to 12 carbon atoms, which may have a substituent, an ether group (—O—), a carbonyl group (—C(=O)—), and imino group (—NH—) which may have a substituent.

Here, examples of the substituent which may be contained in the alkylene group, the arylene group, and the imino group include a halogen atom, an alkyl group, an alkoxy group, an aryl group, an aryloxy group, a cyano group, a carboxy group, an alkoxycarbonyl group, and a hydroxyl group.

Examples of the halogen atom include a fluorine atom, a chlorine atom, a bromine atom, and an iodine atom, and among these, a fluorine atom or a chlorine atom is preferable.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and a methyl group or an ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and a methoxy group or an ethoxy group is particularly preferable.

Examples of the aryl group include an aryl group having 6 to 12 carbon atoms, specific examples thereof include a phenyl group, an α-methylphenyl group, and a naphthyl group, and among these, a phenyl group is preferable.

Examples of the aryloxy group include phenoxy, naphthoxy, imidazoyloxy, benzimidazoyloxy, pyridin-4-yloxy, pyrimidinyloxy, quinazolinyloxy, purinyloxy, and thiophen-3-yloxy.

Examples of the alkoxycarbonyl group include methoxycarbonyl and ethoxycarbonyl.

With regard to the linear, branched, or cyclic alkylene group having 1 to 18 carbon atoms, specific examples of the linear alkylene group include a methylene group, an ethylene group, a propylene group, a butylene group, a pentylene group, a hexylene group, a decylene group, an undecylene group, a dodecylene group, a tridecylene group, a tetradecylene group, a pentadecylene group, a hexadecylene group, a heptadecylene group, and an octadecylene group.

Moreover, specific examples of the branched alkylene group include a dimethylmethylene group, a methylethylene group, a 2,2-dimethylpropylene group, and a 2-ethyl-2-methylpropylene group.

Furthermore, specific examples of the cyclic alkylene group include a cyclopropylene group, a cyclobutylene group, a cyclopentylene group, a cyclohexylene group, a cyclooctylene group, a cyclodecylene group, an adamantane-diyl group, a norbornane-diyl group, and an exo-tetrahydrodicyclopentadiene-diyl group, and among these, a cyclohexylene group is preferable.

Specific examples of the arylene group having 6 to 12 carbon atoms include a phenylene group, a xylylene group, a biphenylene group, a naphthylene group, and a 2,2'-methylenebisphenyl group, and among these, a phenylene group is preferable.

Next, the crosslinkable group represented by X in Formula (B) will be described.

Specific examples of X (crosslinkable group) in Formula (B) include an epoxy group, an epoxycyclohexyl group, an oxetanyl group, and a functional group having an ethylenically unsaturated double bond, and among these, at least one kind of crosslinkable group selected from the group consisting of Formulae (X1) to (X4) is preferable.

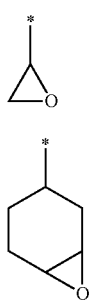

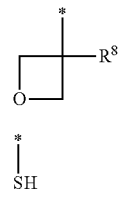

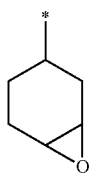

In Formulae (X1) to (X4), * represents a bonding position to $L^2$ in Formula (B), $R^8$ represents any one of a hydrogen atom, a methyl group, or an ethyl group, and S in Formula (X4) represents a functional group having an ethylenically unsaturated double bond.

Here, specific examples of the functional group having an ethylenically unsaturated double bond include a vinyl group, an allyl group, a styryl group, an acryloyl group, and a methacryloyl group, and an acryloyl group or a methacryloyl group is preferable.

In the present invention, for a reason that a strength of an optical laminate according to the embodiment of the present invention described later is increased and handleability in a case where other layers are formed using the optical laminate according to the embodiment of the present invention described later is improved, the repeating unit B preferably contains a repeating unit (hereinafter, also simply referred to as a "repeating unit B") in which X in Formula (B) is a crosslinkable group represented by any one of Formula (X1), . . . , or (X3) and a repeating unit (hereinafter, also simply referred to as a "repeating unit B2") in which X in Formula (B) is a crosslinkable group represented by Formula (X4).

Specific examples of the repeating unit A containing a cinnamoyl group and represented by Formula (A) include the following repeating units A-1 to A-44. Moreover, in the following formulae, Me represents a methyl group and Et represents an ethyl group. Furthermore, in the following specific examples, a "1,4-cyclohexyl group" contained in each divalent linking group of the repeating units A-1 to A-10 may be any one of a cis-isomer or a trans-isomer, but a trans-isomer is preferable.

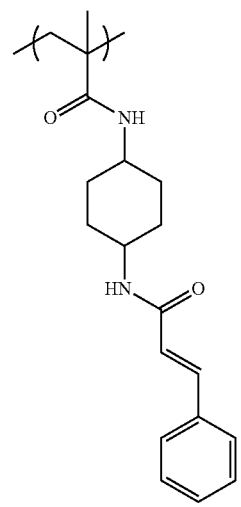

A-1

A-2
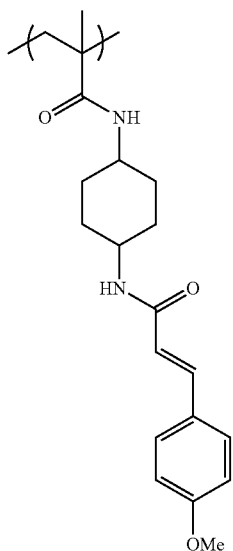
A-3
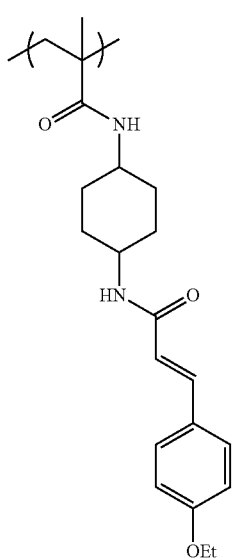
A-4
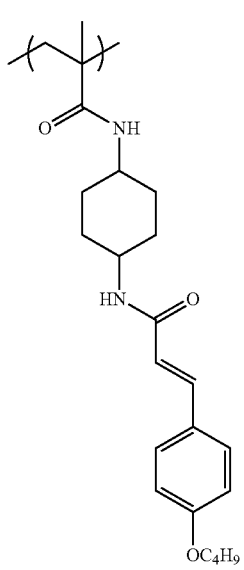
A-5
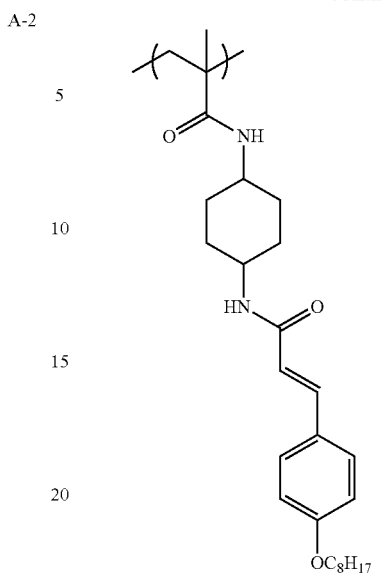
A-6
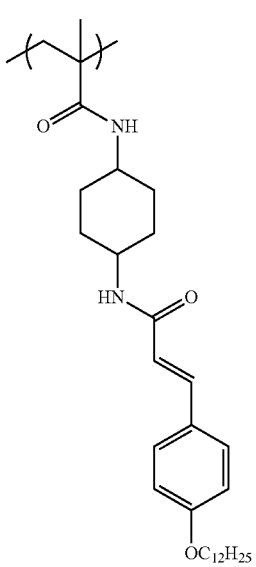
A-7
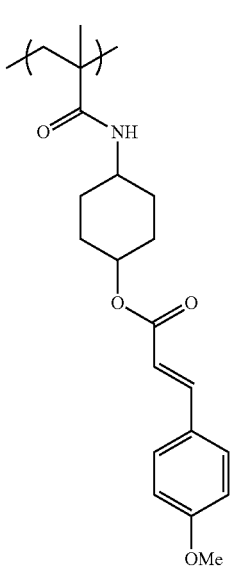

A-8
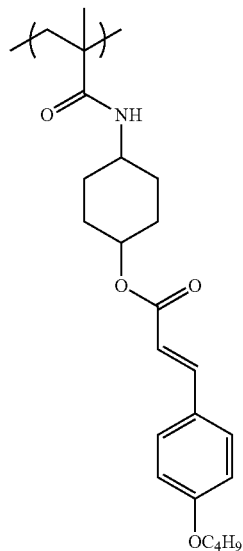
A-9
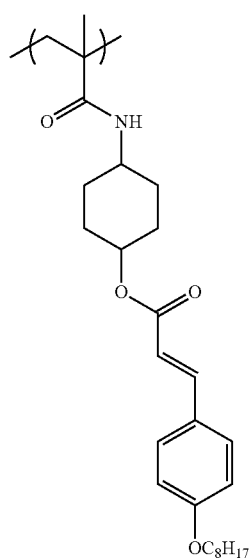
A-10
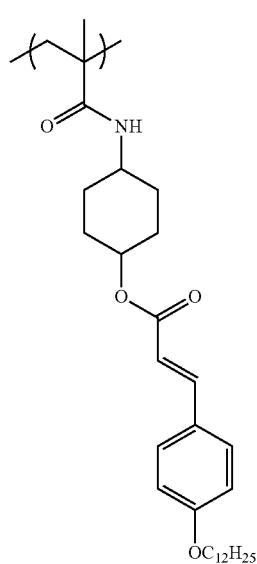
A-11
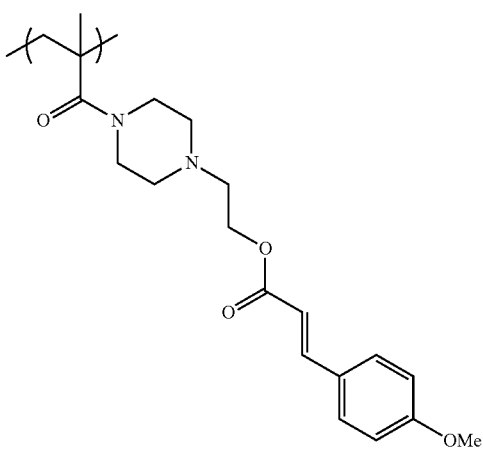
A-12
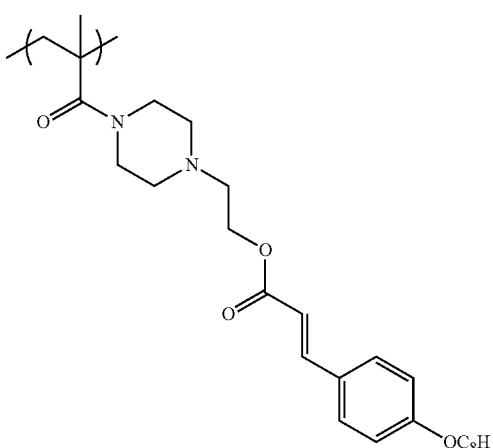
A-13
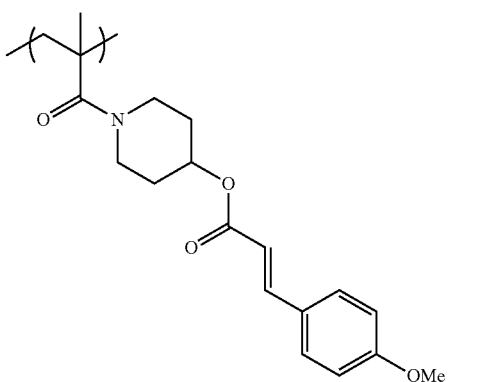

A-14
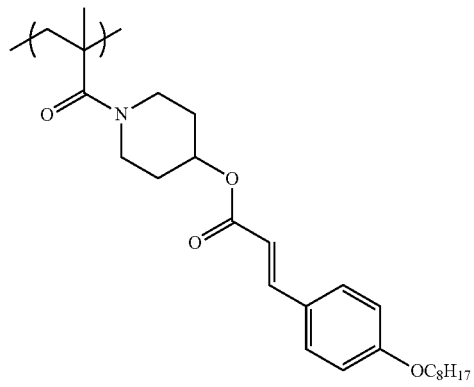
A-15
A-16
A-17
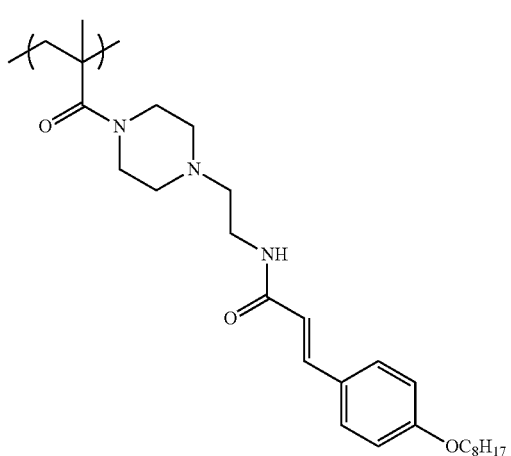
A-18
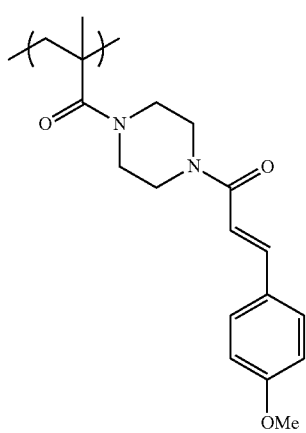
A-19
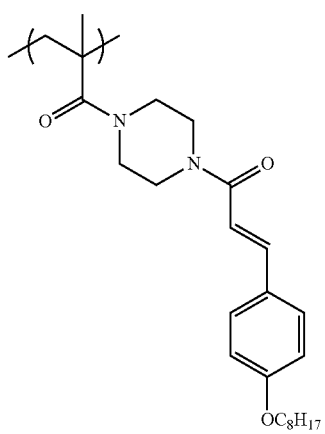

A-20
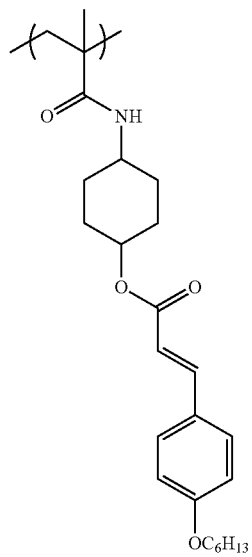
A-21
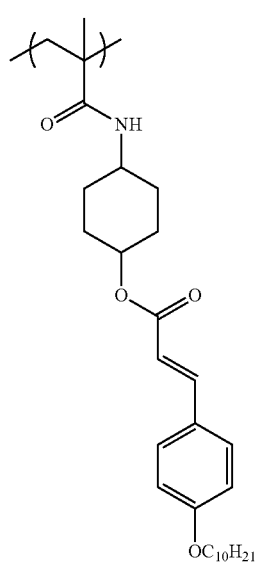
A-22
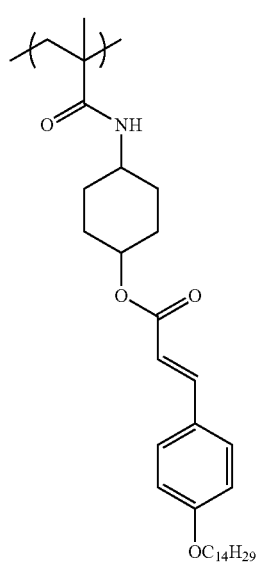
A-23
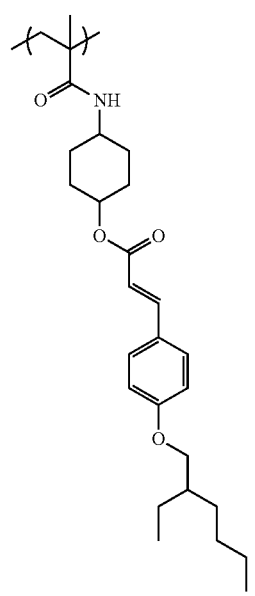
A-24
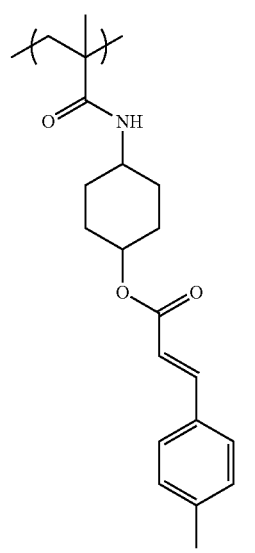

A-25
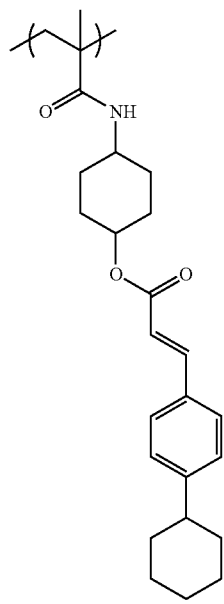
A-26
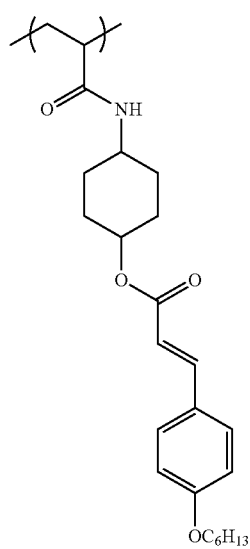
A-27
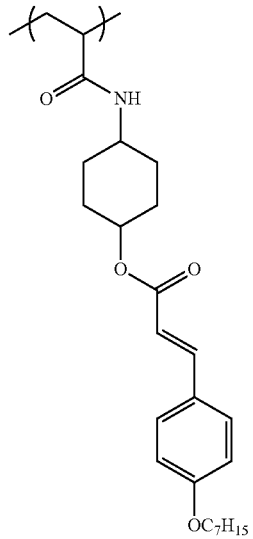
A-28
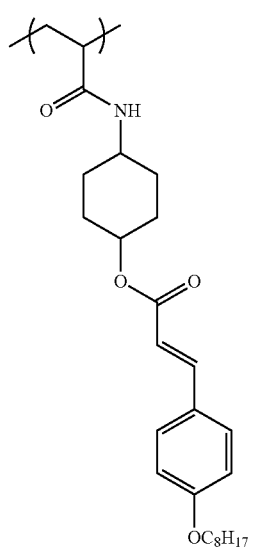

A-29
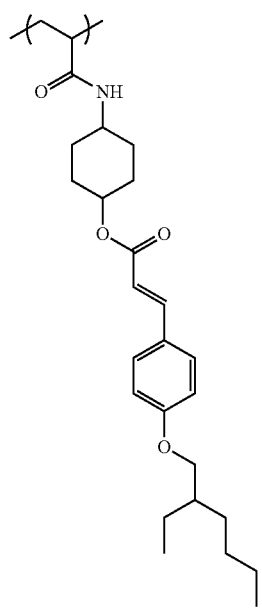
A-30
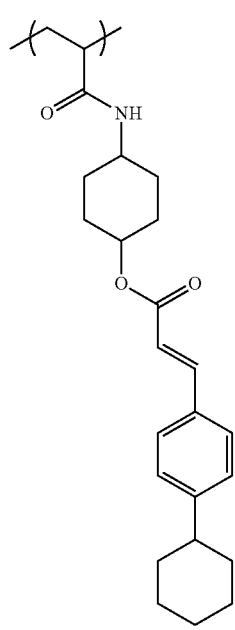
A-31
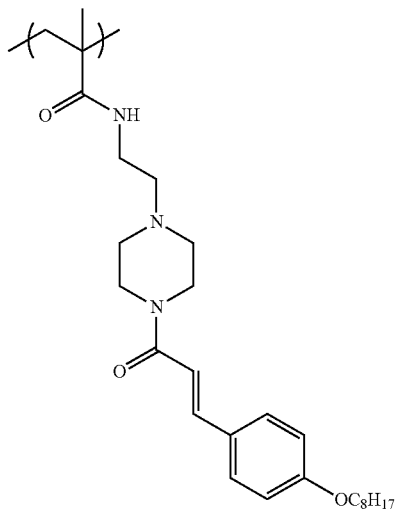
A-32
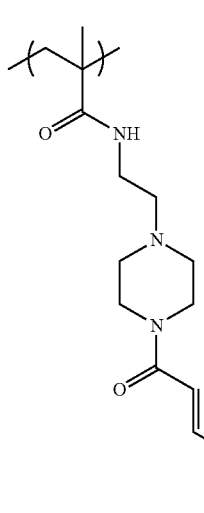
A-33
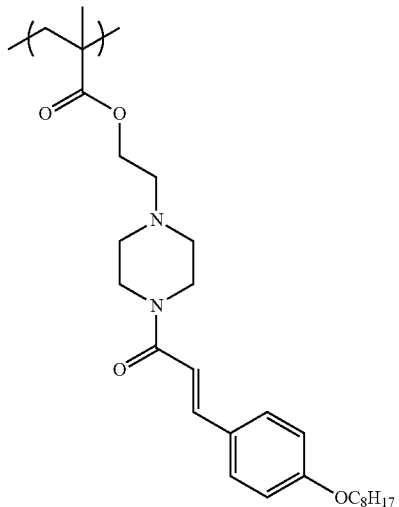

-continued
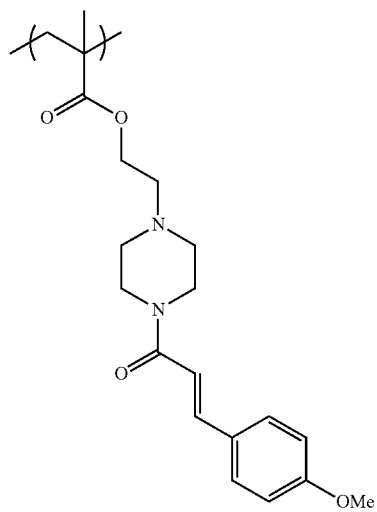
A-34
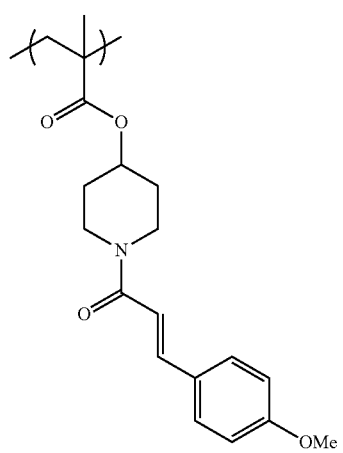
A-35
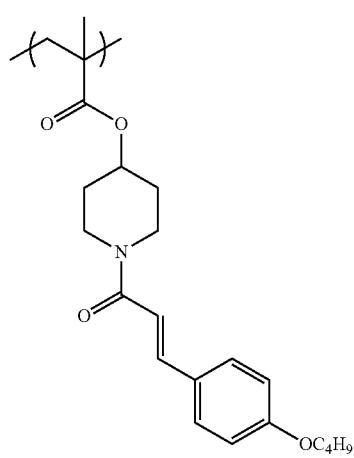
A-36
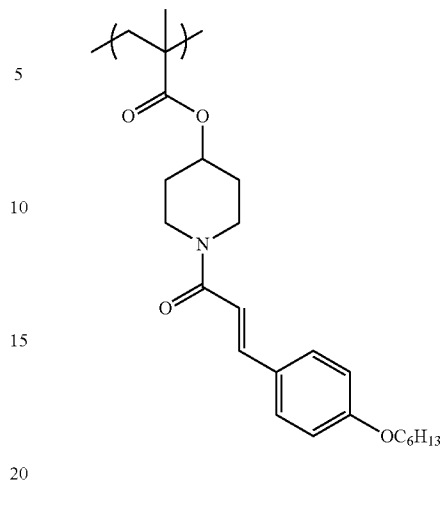
A-37
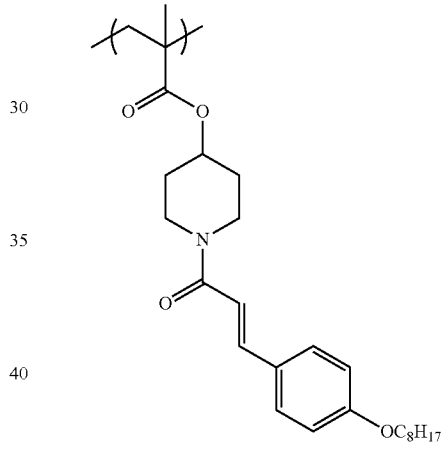
A-38
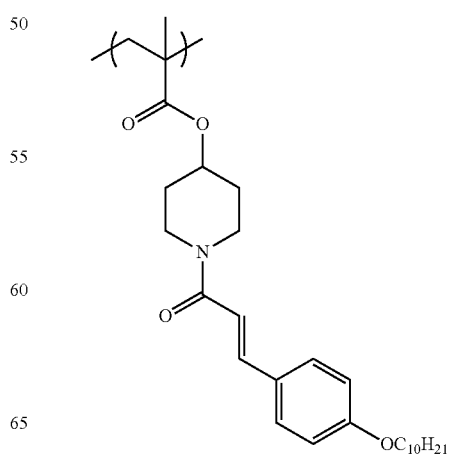
A-39

A-40
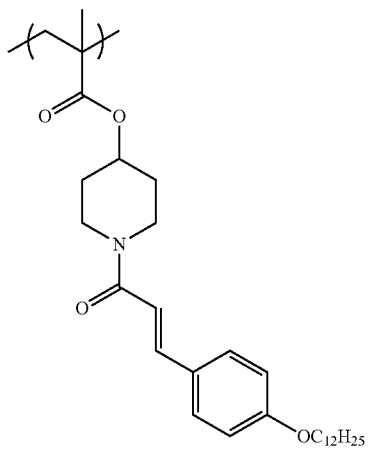
A-41
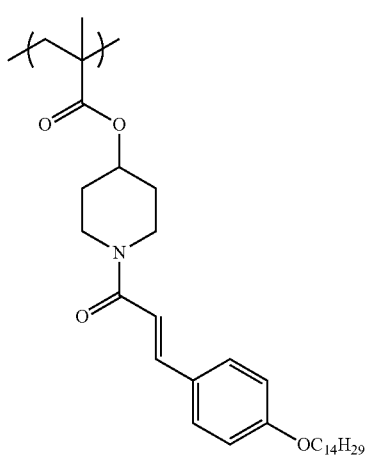
A-42
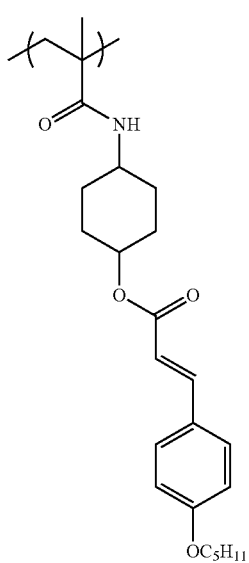
A-43
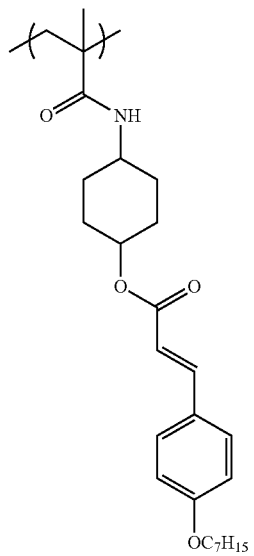
A-44
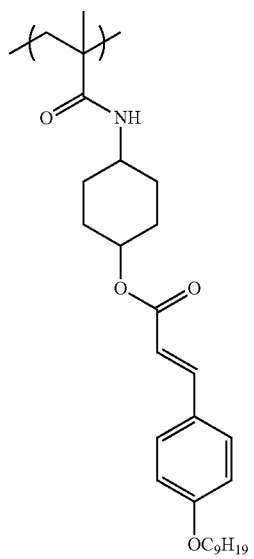
On the other hand, specific examples of the repeating unit B (repeating unit B1) containing a crosslinkable group and represented by Formula (B) include the following repeating units B-1 to B-17.
B-1
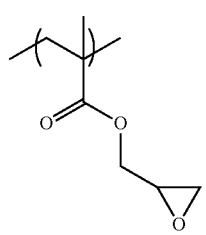

-continued
B-2
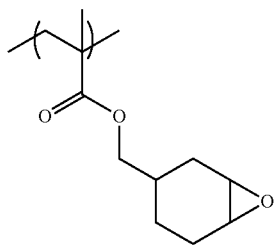
B-3
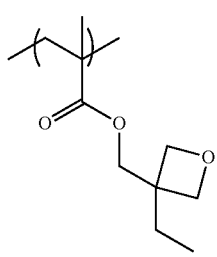
B-4
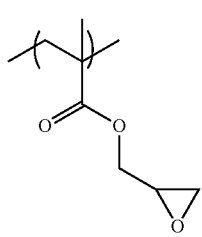
B-5
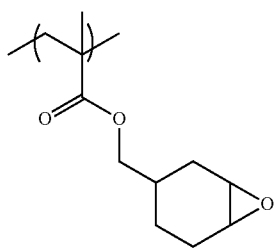
B-6
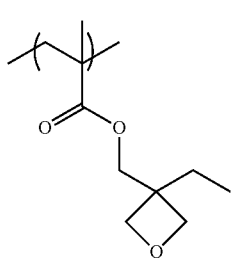
-continued
B-7
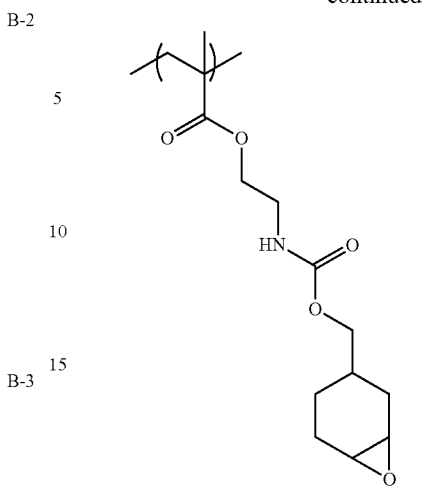
B-8
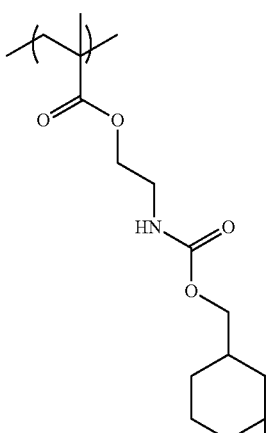
B-9
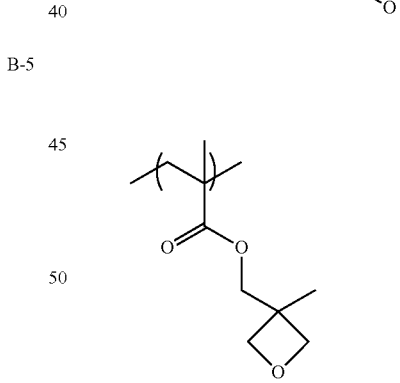
B-10
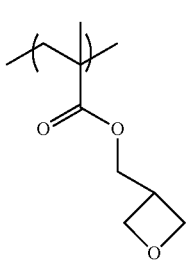

B-11
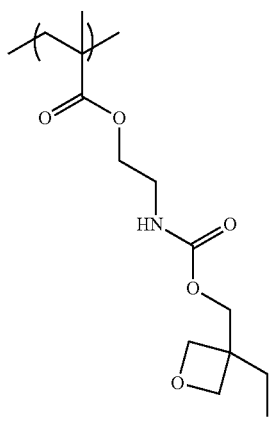
B-12
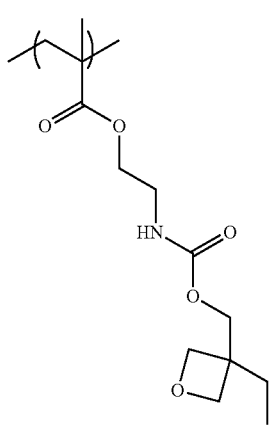
B-13
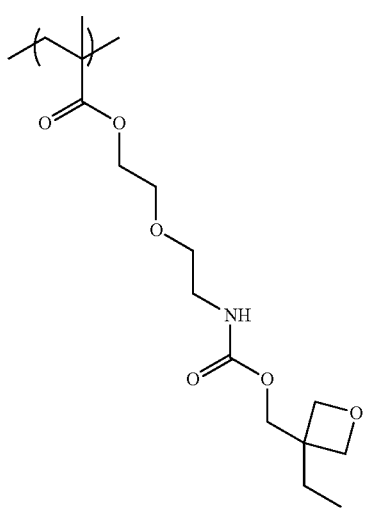
B-14
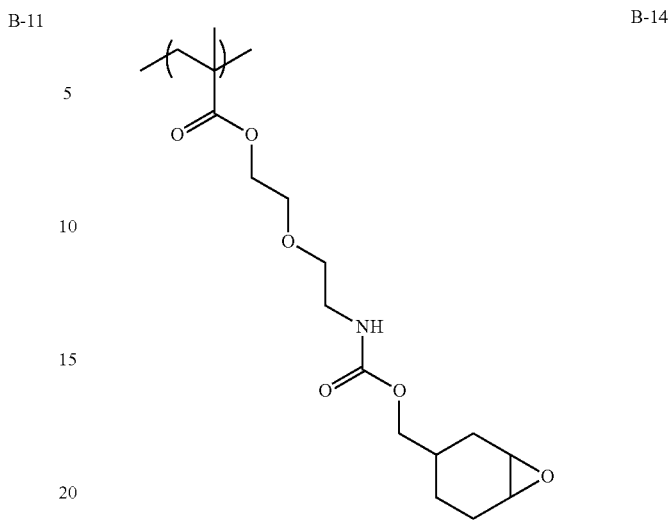
B-15
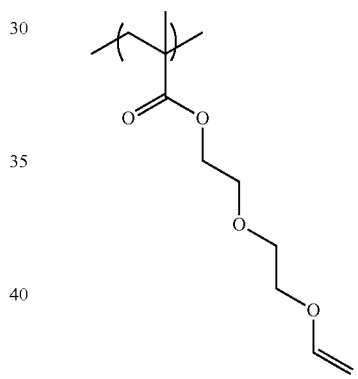
B-16
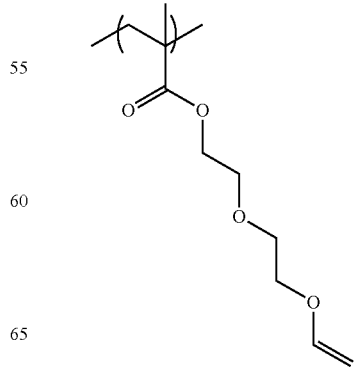

B-17
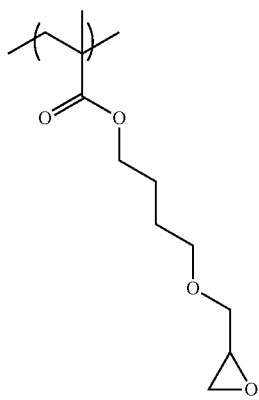
In addition, specific examples of the repeating unit B (repeating unit B2) containing a crosslinkable group and represented by Formula (B) include the following repeating units B-18 to B-47.
B-18
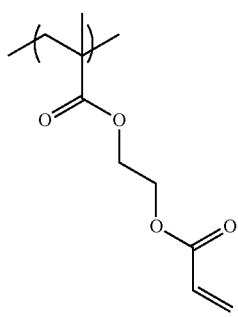
B-19
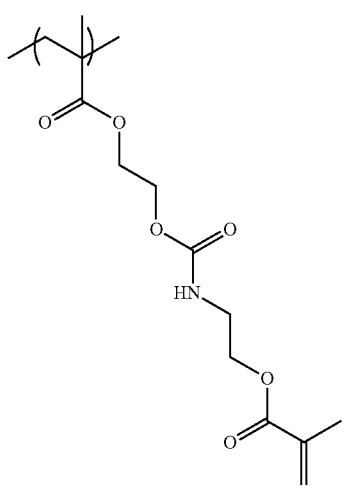
B-20
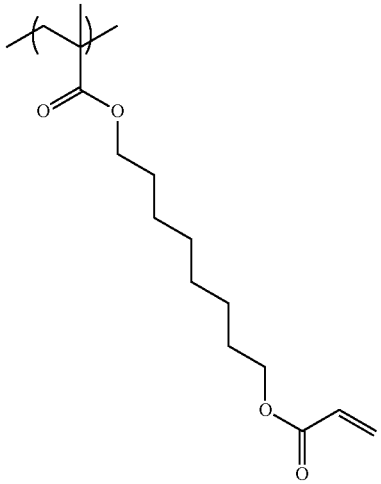
B-21
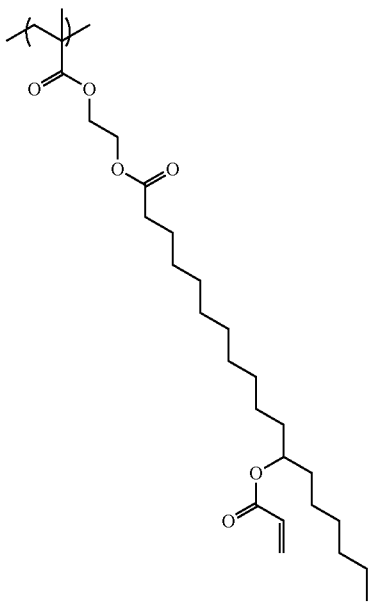
B-22
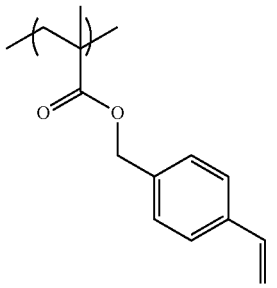

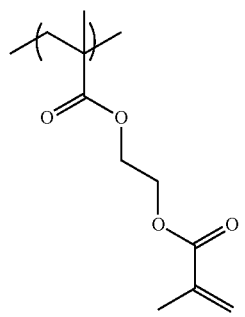
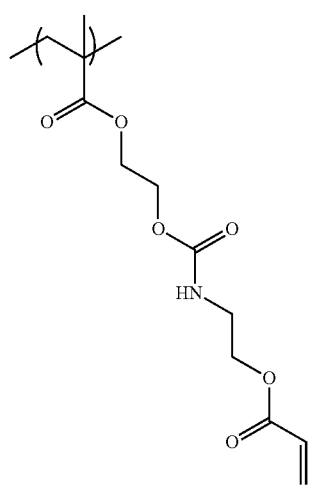
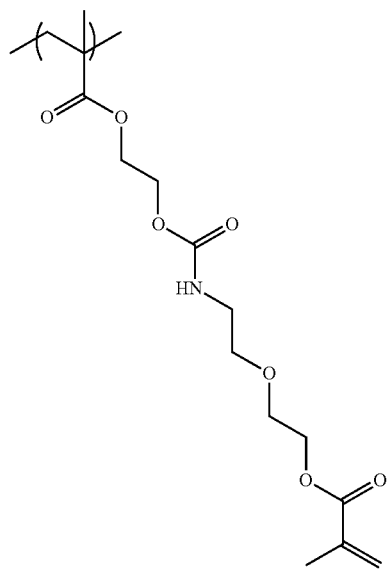
B-26: n = 2
B-27: n = 4.5
B-28: n = 8
B-23
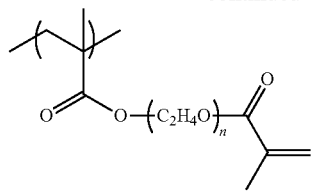
B-29: n = 2
B-30: n = 4.5
B-31: n = 8
B-24
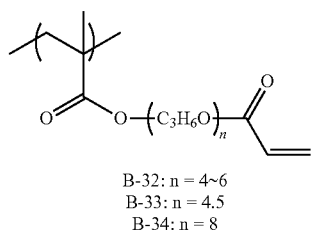
B-32: n = 4~6
B-33: n = 4.5
B-34: n = 8
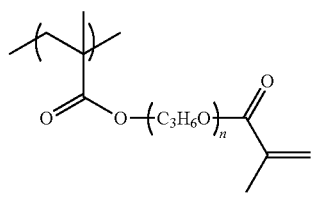
B-35: n = 4~6
B-36: n = 4.5
B-37: n = 8
B-25
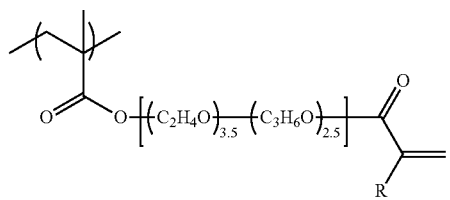
B-38: R = H
B-39: R = CH$_3$
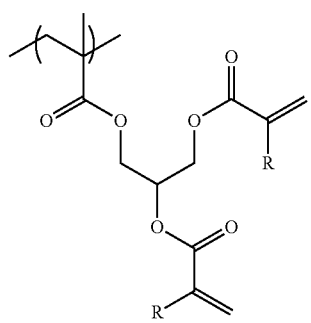
B-40: R = H
B-41: R = CH$_3$
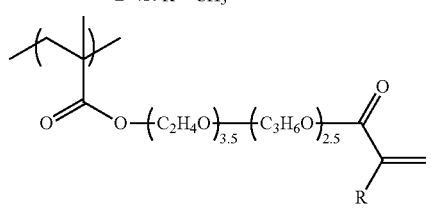
B-42: R = H
B-43: R = CH$_3$

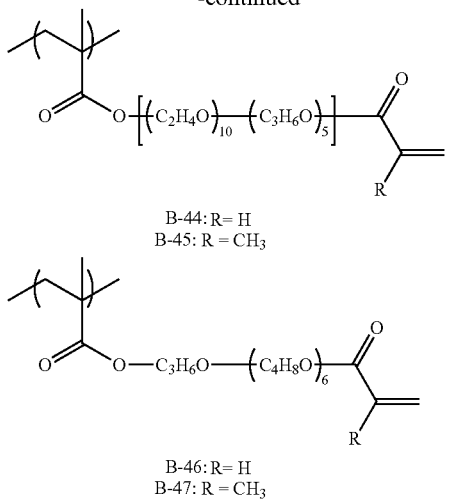

B-44: R = H
B-45: R = CH$_3$

B-46: R = H
B-47: R = CH$_3$

In the photo-alignment copolymer, a content a of the above-described repeating unit A and a content b of the above-described repeating unit B preferably satisfy Formula (12), more preferably satisfy Formula (13), still more preferably satisfy Formula (14), and particularly preferably satisfy Formula (15), in terms of a mass ratio.

$$0.03 \leq a/(a+b) \leq 0.5 \tag{12}$$

$$0.03 \leq a/(a+b) \leq 0.3 \tag{13}$$

$$0.03 \leq a/(a+b) \leq 0.2 \tag{14}$$

$$0.05 \leq a/(a+b) \leq 0.2 \tag{15}$$

In addition, in a case where the photo-alignment copolymer has the above-described repeating unit B2 together with the above-described repeating unit B1, for a reason that a strength of the optically anisotropic layer including the photo-alignment layer is further increased while maintaining favorable liquid crystal alignment properties and adhesiveness, the content a of the above-described repeating unit A, a content b1 of the above-described repeating unit B1, and a content b2 of the above-described repeating unit B2 preferably satisfy Formula (16), more preferably satisfy Formula (17), and still more preferably satisfy Formula (18), in terms of a mass ratio.

$$0.05 \leq b2/(a+b1+b2) \leq 0.7 \tag{16}$$

$$0.10 \leq b2/(a+b1+b2) \leq 0.5 \tag{17}$$

$$0.12 \leq b2/(a+b1+b2) \leq 0.35 \tag{18}$$

As long as the effects of the present invention are not impaired, the photo-alignment copolymer may have other repeating units in addition to the above-described repeating units A and B.

Examples of a monomer (radically polymerizable monomer) forming the other repeating units include an acrylic acid ester compound, a methacrylic acid ester compound, a maleimide compound, an acrylamide compound, acrylonitrile, maleic acid anhydride, a styrene compound, and a vinyl compound.

A method for synthesizing the photo-alignment copolymer is not particularly limited, and for example, the photo-alignment copolymer can be synthesized by mixing a monomer forming the above-described repeating unit A, a monomer forming the above-described repeating unit B, and a monomer forming any other repeating units, and polymerizing the mixture using a radical polymerization initiator in an organic solvent.

A weight-average molecular weight (Mw) of the photo-alignment copolymer is preferably 10,000 to 500,000 and more preferably 30,000 to 300,000, for a reason that liquid crystal alignment properties are further improved.

In a case where the photo-alignment copolymer is used, a content of the photo-alignment copolymer in the composition for forming a photo-alignment layer is not particularly limited, but in a case where an organic solvent described later is contained, the content of the photo-alignment copolymer is preferably 0.1 to 50 parts by mass and more preferably 0.5 to 10 parts by mass with respect to 100 parts by mass of the organic solvent.

(Additive)

The composition for forming a photo-alignment layer may contain one or more kinds of other additives in addition to the photoactive compound. For example, the additive is added for the purpose of adjustment of a refractive index of the composition for forming a photo-alignment layer. From the viewpoint of compatibility with the photoactive compound, the additive is preferably a compound having a hydrophilic group and a (meth)acryloyloxy group, and can be added to an extent such that an alignment capability is not remarkably lowered. Examples of the hydrophilic group include a hydroxyl group, a carboxyl group, a sulfo group, and an amino group.

(Organic Solvent)

The composition for forming a photo-alignment layer preferably contains an organic solvent from the viewpoint of workability for producing the photo-alignment layer or the like.

Specific examples of the organic solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these organic solvents may be used alone or in combination of two or more kinds thereof.

The composition for forming a photo-alignment layer may contain components other than components described above, and examples thereof include a crosslinking catalyst (for example, a thermoreactive acid generator), an adhesion improver, a leveling agent, a surfactant, and a plasticizer.

In a case where the additive is used for the purpose of adjustment of the refractive index of the composition for forming a photo-alignment layer, a refractive index of the additive is preferably 1.4 to 1.6 and more preferably 1.4 to 1.55.

In the present invention, for a reason that adhesiveness between the photo-alignment layer and a light-absorbing anisotropic layer described later is improved, the composition for forming a photo-alignment layer is preferably a composition which contains a compound (for example, the above-described photo-alignment copolymer) having a photoreactive group and a crosslinkable group and does not contain a radical polymerization initiator.

(Application Step)

As a method of applying the composition for forming a photo-alignment layer onto the above-described polymer film, a known method including, for example, a coating method such as a spin coating method, an extrusion method, a gravure coating method, a die-coating method, a bar coating method, and an applicator method, or a printing method such as a flexographic method is employed.

Furthermore, in a case where the manufacturing of the optical laminate is performed by a continuous manufacturing method in a roll-to-roll mode, as an application method, the gravure coating method, the die-coating method, or the printing method such as the flexographic method is usually employed.

(Drying Step)

A method of drying a coating film formed by the application step by heating is not particularly limited, and a drying temperature is preferably in a range of 50° C. to 180° C. and more preferably in a range of 80° C. to 150° C.

A drying time is preferably 10 seconds to 10 minutes and more preferably 30 seconds to 5 minutes.

In a case where the composition for forming a photo-alignment layer contains a crosslinking catalyst such as a thermoreactive acid generator and a compound having a cationically-polymerizable crosslinkable group, in this step, curing of the coating film by a crosslinking reaction preferably proceed by heat.

(Light Irradiation Step)

Polarized light radiated to the coating film after the drying step is not particularly limited, examples thereof include linearly polarized light, circularly polarized light, and elliptically polarized light, and among these, linearly polarized light is preferable.

Moreover, an "oblique direction" for radiating non-polarized light is not particularly limited as long as the direction is a direction inclined by a polar angle θ (0°<θ<90°) with respect to a normal direction of the surface of the coating film, and θ can be appropriately selected according to the purpose but is preferably 20° to 80°.

In the present specification, "irradiation with linearly polarized light" and "irradiation with non-polarized light" are operations for causing a photoreaction to occur in a photoactive compound. A wavelength of the light to be used depends on the photoactive compound to be used, and is not particularly limited as long as the wavelength is a wavelength necessary for the photoreaction. A peak wavelength of light used for light irradiation is preferably 200 nm to 700 nm, and ultraviolet light having a peak wavelength of light of 400 nm or less is more preferable.

As a light source used for light irradiation, a generally used light source can be used, for example, a lamp such as a tungsten lamp, a halogen lamp, a xenon lamp, a xenon flash lamp, a mercury lamp, a mercury xenon lamp, and a carbon arc lamp, various lasers [for example, a semiconductor laser, a helium neon laser, an argon ion laser, a helium cadmium laser, and an yttrium-aluminum-garnet (YAG) laser], a light emitting diode, and a cathode ray tube can be exemplified.

As a method for obtaining linearly polarized light, a method using a polarizing plate (for example, an iodine polarizing plate, a two-color coloring agent polarizing plate, and a wire grid polarizing plate), a method using a prism-based element (for example, a Glan-Thompson prism) or a reflective-type polarizer utilizing Brewster's angle, or a method using light emitted from a laser light source having polarized light can be employed. Moreover, only light having a required wavelength may be selectively radiated using a filter, a wavelength conversion element, or the like.

In a case where the light to be radiated is linearly polarized light, a method of irradiating an alignment layer with light from an upper surface or a back surface and irradiating a surface of the alignment layer with light perpendicularly or obliquely is employed. An incidence angle of the light varies depending on the photoactive compound, but is preferably 0° to 90° (perpendicular) and more preferably 40 to 90°.

In a case of non-polarized light, the alignment layer is irradiated with non-polarized light obliquely. An incidence angle thereof is preferably 10° to 80°, more preferably 20° to 60°, and still more preferably 30° to 50°.

An irradiation time is preferably 1 minute to 60 minutes and more preferably 1 minute to 10 minutes.

In a case where patterning is necessary, a method of performing light irradiation using a photo mask as many times as necessary for pattern production or a method of writing a pattern by laser light scanning can be employed.

The photo-alignment layer used in the present invention is preferably an alignment layer having an average refractive index at a wavelength of 550 nm of 1.55 to 1.8. From the viewpoint that antireflection performance is further improved, in order to reduce a refractive index difference from the light-absorbing anisotropic layer, the average refractive index at a wavelength of 550 nm is more preferably 1.55 to 1.7.

In addition, in the photo-alignment layer used in the present invention, an in-plane refractive index anisotropy $\Delta n$ at a wavelength of 550 nm is preferably 0.05 to 0.45. The in-plane refractive index anisotropy $\Delta n$ is more preferably 0.1 to 0.4 and still more preferably 0.1 to 0.3.

By appropriately controlling the refractive index anisotropy of the photo-alignment layer, an antireflection function can be further improved.

In the present invention, a thickness of the photo-alignment layer is preferably in a range of 10 nm to 10,000 nm, more preferably in a range of 10 nm to 1,000 nm, and still more preferably in a range of 10 to 300 nm. By appropriately controlling the thickness of the photo-alignment layer, interference is utilized and the antireflection performance can be further enhanced.

[Light-Absorbing Anisotropic Layer Formation Step]

The light-absorbing anisotropic layer formation step included in the method for manufacturing an optical laminate according to the embodiment of the present invention is a step of applying a liquid crystal composition containing a dichroic substance and a high-molecular liquid crystalline compound onto the photo-alignment layer to form a light-absorbing anisotropic layer.

Hereinafter, respective components contained in the liquid crystal composition used for forming the light-absorbing anisotropic layer will be described in detail.

<High-Molecular Liquid Crystalline Compound>

The liquid crystal composition used for forming the light-absorbing anisotropic layer contains a high-molecular liquid crystalline compound. By containing the high-molecular liquid crystalline compound, a dichroic substance can be aligned at a high degree of alignment while restraining the dichroic substance from being precipitated.

Here, the "high-molecular liquid crystalline compound" refers to a liquid crystalline compound having a repeating unit in the chemical structure. The liquid crystalline compound in the present invention is a liquid crystalline compound that does not exhibit dichroism.

Examples of the high-molecular liquid crystalline compound include the thermotropic liquid crystalline polymers described in JP2011-237513A. Moreover, the high-molecular liquid crystalline compound may have a crosslinkable group (for example, an acryloyl group and a methacryloyl group) at the terminal.

The high-molecular liquid crystalline compound may be used alone or in combination of two or more kinds thereof.

In a case where the high-molecular liquid crystalline compound is contained, a content of the high-molecular liquid crystalline compound is preferably 75 to 95 parts by mass, more preferably 75 to 90 parts by mass, and still more preferably 80 to 90 parts by mass, in terms of a solid content proportion. By setting the content of the high-molecular liquid crystalline compound to be within the above range, a degree of alignment of the light-absorbing anisotropic layer is further improved.

As a structure of the high-molecular liquid crystalline compound, a high-molecular liquid crystalline compound containing a repeating unit represented by Formula (1) is preferably contained.

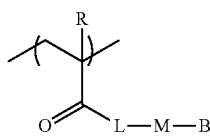
(1)

Here, in Formula (1),

R represents a hydrogen atom or a methyl group.

L represents a single bond or a divalent linking group.

B represents a hydrogen atom, a halogen atom, a cyano group, an alkyl group, an alkoxy group, an amino group, an oxycarbonyl group, an acyloxy group, an acylamino group, an alkoxycarbonylamino group, a sulfonylamino group, a sulfamoyl group, a carbamoyl group, an alkylthio group, a sulfonyl group, a sulfinyl group, a ureido group, or a crosslinkable group.

M represents a mesogenic group represented by Formula (1-1).

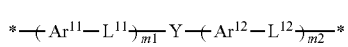
(1-1)

In Formula (1-1), $Ar^{11}$ and $Ar^{12}$ each independently represent a phenylene group or a biphenylene group which may have a substituent.

$L^{11}$ and $L^{12}$ each independently represent a single bond or a divalent linking group including no an azo group.

Y represents an imino group, a —OCO—CH=CH— group, or a —CH=CH—CO$_2$— group.

m1 and m2 each independently represent an integer of 1 to 3.

In a case where m1 is an integer of 2 or 3, a plurality of $Ar^{11}$'s may be the same as or different from each other and a plurality of $L^{11}$'s may be the same as or different from each other.

In a case where m2 is an integer of 2 or 3, a plurality of $Ar^{12}$'s may be the same as or different from each other and a plurality of $L^{12}$'s may be the same as or different from each other.

The divalent linking group represented by L in Formula (1) will be described.

Examples of the divalent linking group include —O—, —S—, —COO—, —OCO—, —O—CO—O—, —NR$^N$CO—, —CONR$^N$—, an alkylene group, and a divalent group obtained by combining two or more of these groups. Moreover, R$^N$ represents a hydrogen atom or an alkyl group.

Among these, a divalent group obtained by combining one or more kinds of groups selected from the group consisting of —O—, —COO—, and —OCO—, and an alkylene group is preferable.

Furthermore, the number of carbon atoms in the alkylene group is preferably 2 to 16.

The mesogenic group represented by Formula (1-1), which is represented by M in Formula (1), will be described. Moreover, in Formula (1-1), * represents a bonding position to L or B in Formula (1).

In Formula (1-1), $Ar^{11}$ and $Ar^{12}$ each independently represent a phenylene group or a biphenylene group which may have a substituent.

Here, the substituent is not particularly limited, and examples thereof include a halogen atom, an alkyl group, an alkyloxy group, an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, and a ureido group.

In Formula (1-1), $L^{11}$ and $L^{12}$ each independently represent a single bond or a divalent linking group including no an azo group.

Here, examples of the divalent linking group include —O—, —S—, —COO—, —OCO—, —O—CO—O—, —NR$^N$CO—, —CONR$^N$—, an alkylene group, and a divalent group obtained by combining two or more of these groups. Moreover, R$^N$ represents a hydrogen atom or an alkyl group.

In Formula (1-1), Y represents an imino group, a —OCO—CH=CH— group, or a —CH=CH—CO$_2$— group.

In Formula (1-1), m1 and m2 each independently represent an integer of 1 to 3.

Here, m1 and m2 are preferably an integer of 2 to 5 in total and more preferably an integer of 2 to 4 in total.

B in Formula (1) will be described.

B represents a hydrogen atom, a halogen atom, a cyano group, an alkyl group, an alkoxy group, an amino group, an oxycarbonyl group, an alkoxycarbonyl group, an acyloxy group, a (poly)alkyleneoxy group, an acylamino group, an alkoxycarbonylamino group, a sulfonylamino group, a sulfamoyl group, a carbamoyl group, an alkylthio group, a sulfonyl group, a sulfinyl group, or a ureido group.

Among these, from the viewpoint of adjustment of a phase transition temperature and the viewpoint of a solubility, a cyano group, an alkyl group, an alkoxy group, an oxycarbonyl group, an alkoxycarbonyl group, a (poly)alkyleneoxy group, or an alkylthio group is preferable, and an alkyl group, an alkoxy group, or a (poly)alkyleneoxy group is more preferable.

Furthermore, in B, an alkyl group or the like except for a hydrogen atom, a halogen atom, and a cyano group has preferably 1 to 20 carbon atoms and more preferably 1 to 11 carbon atoms, from the viewpoint of adjustment of a phase transition temperature and the viewpoint of a solubility.

A case where B in Formula (1) represents a crosslinkable group will be described.

Examples of the crosslinkable group include the polymerizable groups described in paragraphs [0040] to [0050] of JP2010-244038A, and among these, from the viewpoint of reactivity and synthesis suitability, a radically polymerizable group is preferable, an acryloyl group, a methacryloyl group, an epoxy group, an oxetanyl group, or a styryl group is more preferable, and an acryloyl group or a methacryloyl group (hereinafter, also simply referred to as a "(meth) acryloyl group") is still more preferable.

Liquid crystallinity of the high-molecular liquid crystalline compound may exhibit any one of nematicity or smecticity, and preferably exhibits at least nematicity.

The temperature range at which a nematic phase is exhibited is preferably room temperature (23° C.) to 300° C., and from the viewpoint of handling or manufacturing suitability, is preferably 50° C. to 200° C.

In addition, in the present invention, a weight-average molecular weight (Mw) of the high-molecular liquid crystalline compound is preferably 1,000 to 100,000 and more preferably 2,000 to 60,000. Moreover, a number-average molecular weight (Mn) thereof is preferably 500 to 80,000 and more preferably 1,000 to 30,000.

Here, the weight-average molecular weight and the number-average molecular weight in the present invention are values measured by a gel permeation chromatography (GPC) method.

Solvent (eluent): tetrahydrofuran
Device name: TOSOH HLC-8220GPC
Column: three TOSOH TSKgel Super HZM-H (4.6 mm×15 cm) are connected and used
Column temperature: 25° C.
Sample concentration: 0.1% by mass
Flow rate: 0.35 ml/min
Calibration curve: calibration curve obtained by seven samples of TSK standard polystyrene manufactured by Tosoh Corporation having Mw of 2,800,000 to 1,050 (Mw/Mn=1.03 to 1.06) is used In the present invention, for a reason that absorption in a visible light range is small and the alignment of the dichroic substance in the visible light range is more easily maintained, a maximum absorption wavelength of the high-molecular liquid crystalline compound is preferably 380 nm or less.

In addition, in the present invention, for a reason that a dichroic ratio of the light-absorbing anisotropic layer is further improved, the number of benzene rings contained in the mesogenic group of the high-molecular liquid crystalline compound is preferably 3 or more.

Specific examples of the high-molecular liquid crystalline compound having the repeating unit represented by Formula (1) include high-molecular liquid crystalline compounds represented by the following structural formulae. Moreover, in the following structural formulae, R represents a hydrogen atom or a methyl group.

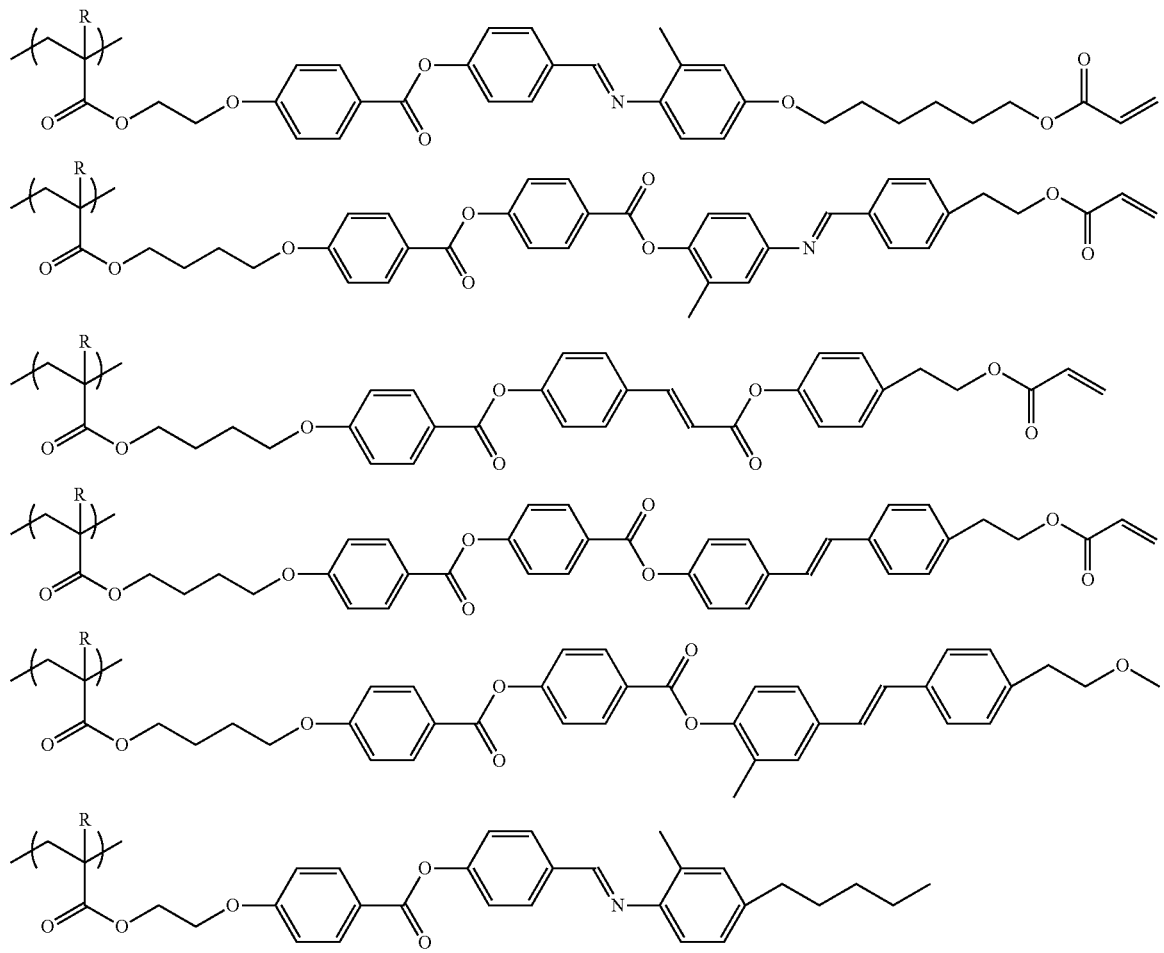

In the present invention, as a more preferred high-molecular liquid crystalline compound, a high-molecular liquid crystalline compound containing a repeating unit represented by Formula (2) is preferably contained. In Formula (2), a difference between a log P value of P1 (hereinafter, also referred to as a "main chain"), L1, and SP1 (hereinafter, also referred to as a "spacer group") and a log P value of M1 (hereinafter, also referred to as a "mesogenic group") is 4 or more.

By using the high-molecular liquid crystalline compound, a light-absorbing anisotropic layer having a high degree of alignment can be formed. Details of a reason thereof are not clear, but are generally estimated as follows.

The log P value is an index expressing properties of hydrophilicity and hydrophobicity of a chemical structure. Since the log P value of the main chain, L1, and the spacer group is separated from the log P value of the mesogenic group by a predetermined value or more, the repeating unit represented by Formula (2) is in a state where compatibility between a structure from the main chain to the spacer group and the mesogenic group is low. Thereby, crystallinity of the high-molecular liquid crystalline compound is increased and it is presumed to be in a state where the degree of alignment of the high-molecular liquid crystalline compound is high. As described above, in a case where the degree of alignment of the high-molecular liquid crystalline compound is high, it is presumed that compatibility between the high-molecular liquid crystalline compound and the dichroic substance is reduced (that is, crystallinity of the dichroic substance is improved), and a degree of alignment of the dichroic substance is improved. As a result, it is thought that the obtained degree of alignment of the light-absorbing anisotropic layer is increased.

A preferred high-molecular liquid crystalline compound in the present invention contains the repeating unit represented by Formula (2) (in the present specification, also referred to as a "repeating unit (2)"). Moreover, in the repeating unit (2), the difference between the log P value of P1, L1, and SP1 and the log P value of M1 is 4 or more.

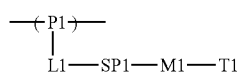

(2)

In Formula (2), P1 represents a main chain of the repeating unit, L1 represents a single bond or a divalent linking group, SP1 represents a spacer group, M1 represents a mesogenic group, and T1 represents a terminal group.

Provided that in a case where M1 has a linking group, an azo group is not included as a linking group.

Specific examples of the main chain of the repeating unit represented by P1 include groups represented by Formulae (P1-A) to (P1-D), and among these, from the viewpoint of a diversity of monomers used as raw materials and easy handling, a group represented by Formula (P1-A) is preferable.

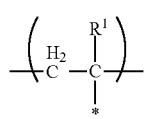

(P1-A)

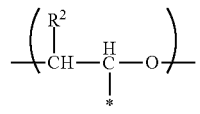

(P1-B)

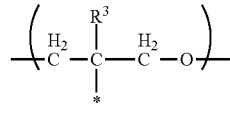

(P1-C)

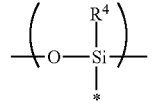

(P1-D)

In Formulae (P1-A) to (P1-D), "*" represents a bonding position to L1 in Formula (2).

In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or an alkyl group (cycloalkyl group) having a cyclic structure. Moreover, the number of carbon atoms in the alkyl group is preferably 1 to 5.

A group represented by Formula (P1-A) is preferably one unit of a partial structure of poly(meth)acrylic acid ester obtained by polymerization of (meth)acrylic acid ester.

A group represented by Formula (P1-B) is preferably an ethylene glycol unit formed by ring-opening polymerization of an epoxy group of a compound having the epoxy group.

A group represented by Formula (P1-C) is preferably a propylene glycol unit formed by ring-opening polymerization of an oxetane group of a compound having the oxetane group.

A group represented by Formula (P1-D) is preferably a siloxane unit of a polysiloxane obtained by condensation polymerization of a compound having at least one group of an alkoxysilyl group or a silanol group. Here, examples of the compound having at least one group of an alkoxysilyl group or a silanol group include a compound having a group represented by a formula of $SiR^4(OR^5)_2$—. In the formula, $R^4$ has the same definition as $R^4$ in Formula (P1-D), and a plurality of $R^3$'s each independently represent a hydrogen atom or an alkyl group having 1 to 10 carbon atoms.

L1 is a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom, or an alkyl group having 1 to 6 carbon atoms which may have a substituent.

In a case where P1 is a group represented by Formula (P1-A), L1 is preferably a group represented by —C(O)O—.

In a case where P1 is a group represented by each of Formulae (P1-B) to (P1-D), L1 is preferably a single bond.

For a reason of easy exhibition of liquid crystallinity or availability of a raw material, the spacer group represented by SP1 preferably contains at least one kind of structure selected from the group consisting of an oxyethylene structure, an oxypropylene structure, a polysiloxane structure, and an alkylene fluoride structure.

Here, the oxyethylene structure represented by SP1 is preferably a group represented by —(CH$_2$—CH$_2$O)$_{n1}$—*. In the formula, n1 represents an integer of 1 to 20, and * represents a bonding position to L1 or M1.

The oxypropylene structure represented by SP1 is preferably a group represented by *—(CH(CH$_3$)—CH$_2$O)$_{n2}$—*. In the formula, n2 represents an integer of 1 to 3, and * represents a bonding position to L1 or M1.

The polysiloxane structure represented by SP1 is preferably a group represented by *—(Si(CH$_3$)$_2$—O)$_{n3}$—*. In the formula, n3 represents an integer of 6 to 10, and * represents a bonding position to L1 or M1.

The alkylene fluoride structure represented by SP1 is preferably a group represented by *—(CF$_2$—CF$_2$)$_{n4}$—*. In the formula, n4 represents an integer of 6 to 10, and * represents a bonding position to L1 or M1.

The mesogenic group represented by M is a group indicating a main skeleton of a liquid crystal molecule which contributes to liquid crystal formation. The liquid crystal molecule exhibits liquid crystallinity which is an intermediate state (mesophase) between a crystalline state and an isotropic liquid state. The mesogenic group is not particularly limited, and reference can be made to, for example, "Flussige Kristalle in Tabellen II" (VEB Deutsche Verlag furGrundstoff Industrie, Leipzig, published in 1984), particularly the descriptions on pages 7 to 16, and Editorial committee of Liquid Crystal Handbook, liquid crystal handbook (Maruzen, Publishing Co., Ltd. published in 2000), particularly the descriptions in Chapter 3.

As the mesogenic group, for example, a group having at least one kind of cyclic structure selected from the group consisting of an aromatic hydrocarbon group, a heterocyclic group, and an alicyclic group is preferable.

As the mesogenic group, from the viewpoint of exhibition of liquid crystallinity, adjustment of a liquid crystal phase transition temperature, availability of a raw material, and synthesis suitability, a group represented by Formula (M1-A) or Formula (M1-B) is preferable.

(M1-A)

(M1-B)

In Formula (M1-A), A1 is a divalent group selected from the group consisting of an aromatic hydrocarbon group, a heterocyclic group, and an alicyclic group. These groups may be substituted with a substituent such as an alkyl group, an alkyl fluoride group, or an alkoxy group.

The divalent group represented by A1 is preferably a 4- to 6-membered ring. Moreover, the divalent group represented by A1 may be a single ring or a condensed ring.

* represents a bonding position to SP1 or T1.

Examples of the divalent aromatic hydrocarbon group represented by A1 include a phenylene group, a naphthylene group, a fluorene-diyl group, an anthracene-diyl group, and a tetracene-diyl group, and from the viewpoint of a diversity of design of a mesogenic skeleton or availability of a raw material, a phenylene group or a naphthylene group is preferable and a phenylene group is more preferable.

The divalent heterocyclic group represented by A1 may be either aromatic or non-aromatic, but is preferably a divalent aromatic heterocyclic group from the viewpoint that the degree of alignment is further improved.

Examples of an atom constituting the divalent aromatic heterocyclic group, other than carbon, include a nitrogen atom, a sulfur atom, and an oxygen atom. In a case where the aromatic heterocyclic group has a plurality of atoms constituting a ring other than carbon, these atoms may be the same as or different from each other.

Specific examples of the divalent aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same as or different from each other.

In Formula (M1-B), A2 and A3 are each independently a divalent group selected from the group consisting of an aromatic hydrocarbon group, a heterocyclic group, and an alicyclic group. Specific examples and suitable aspects of A2 and A3 are the same as those of A1 in Formula (M1-A), and thus descriptions thereof will be omitted.

In Formula (M1-B), a2 represents an integer of 1 to 10, and in a case where a2 is 2 or more, a plurality of A2's may be the same as or different from each other, a plurality of A3's may be the same as or different from each other, and a plurality of LA1's may be the same as or different from each other.

In Formula (M1-B), in a case where a2 is 1, LA1 is a divalent linking group. In a case where a2 is 2 or more, the plurality of LA1's are each independently a single bond or a divalent linking group, and at least one among the plurality of LA1's is a divalent linking group.

In Formula (M1-B), examples of the divalent linking group represented by LA1 include —O—, —(CH$_2$)$_g$—, —(CF$_2$)$_g$, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)—C(Z')—, —C(Z)—C(Z')—C(O)—S—, —S—C(O)—C(Z)=C(Z')— (Z, Z', and Z" independently represent hydrogen, a C1 to C4 alkyl group, a cycloalkyl group, an aryl group, a cyano group, or a halogen atom), —C=C—, —S—, —S(O)—, —S(O)(O)—, —(O)S(O)O—, —O(O)S(O)O—, —SC(O)—, and —C(O)S—. LA1 may be a group obtained by combining two or more of these groups.

Furthermore, in a case where an azo group is included as the divalent linking group represented by LA1, the absorption in the visible light range is high, which is not preferable.

Specific examples of M1 include the following structures. Moreover, in the following specific examples, "Ac" represents an acetyl group.
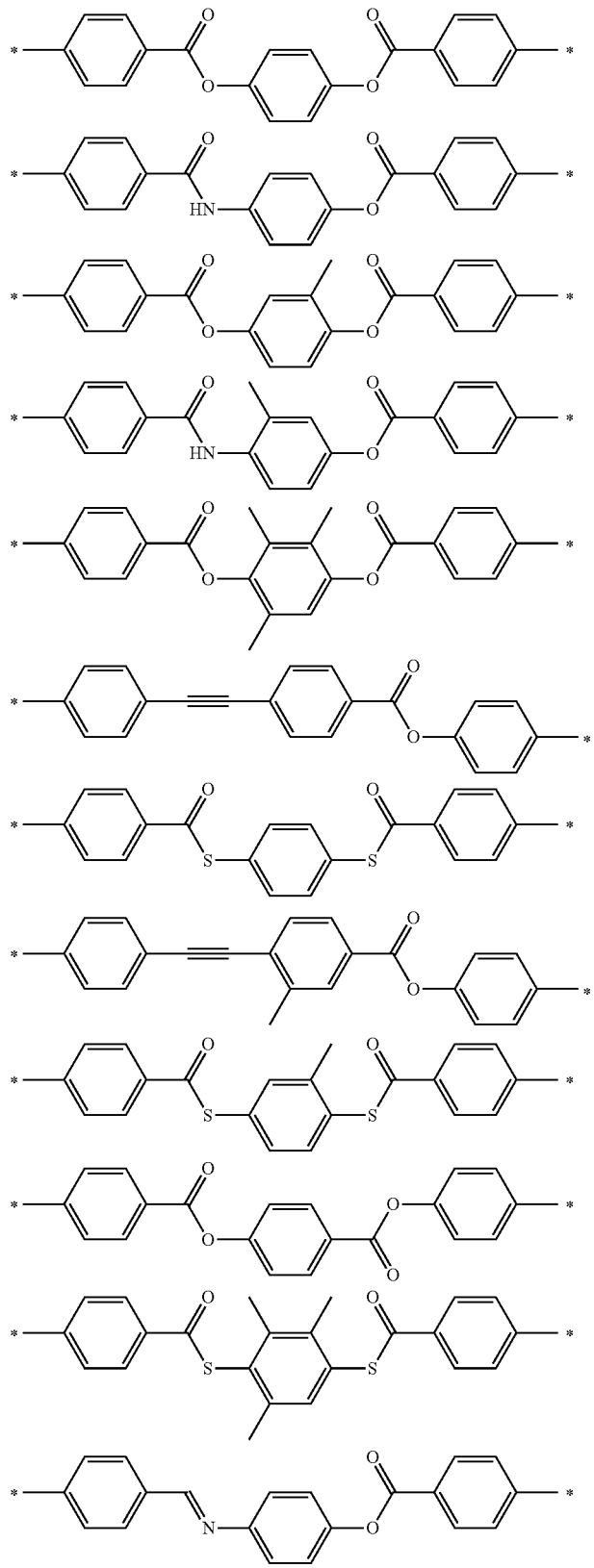

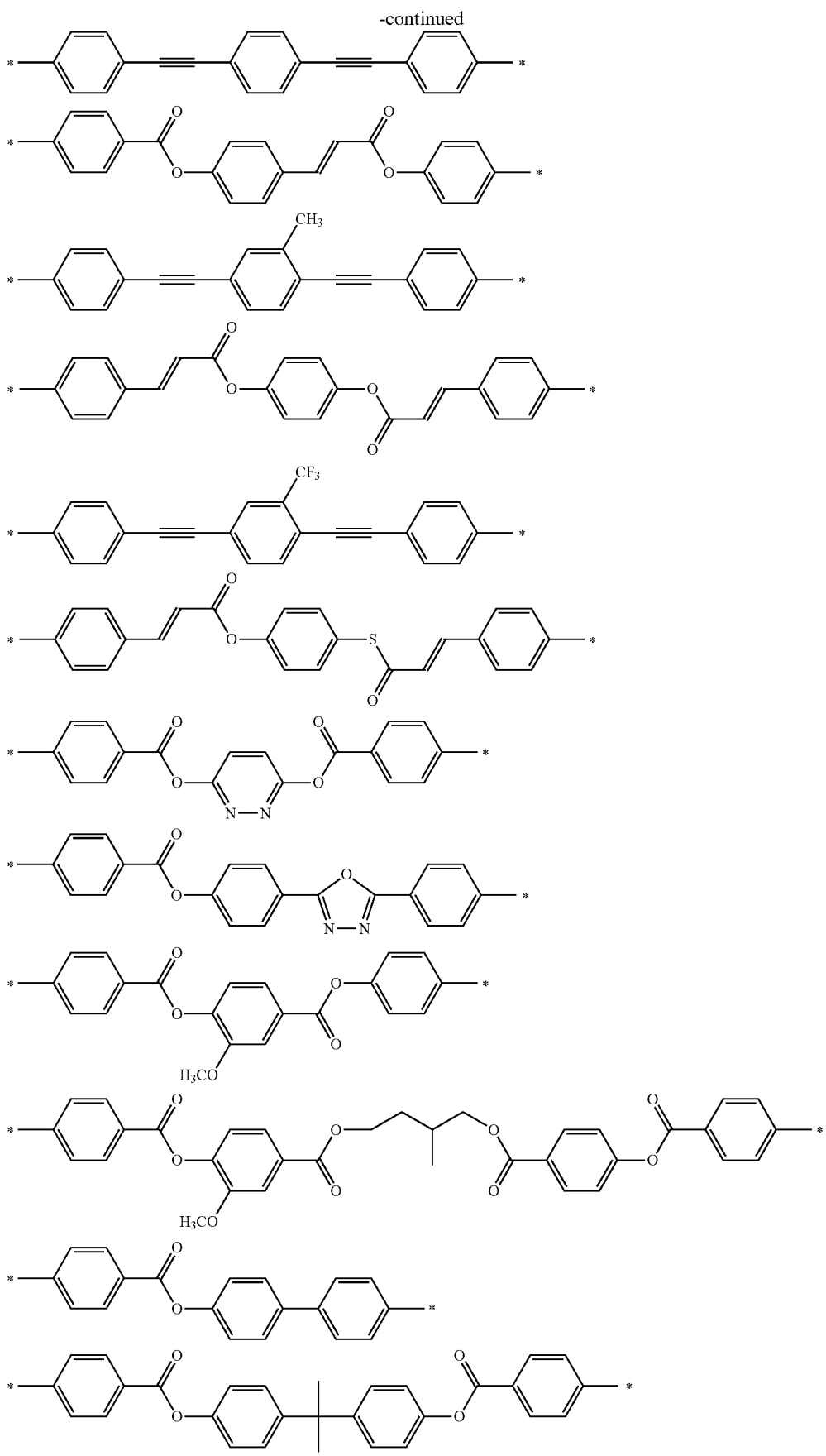

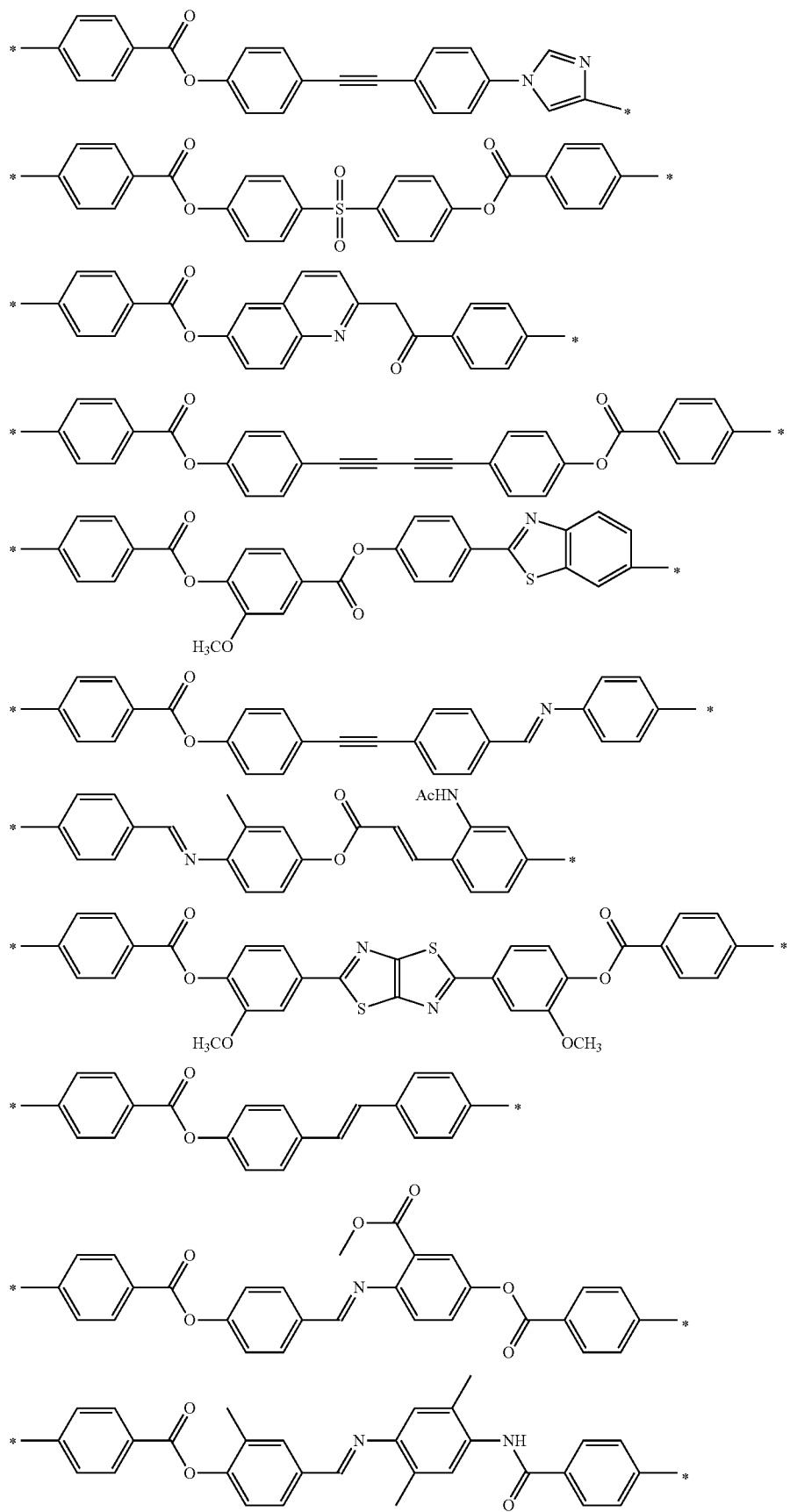

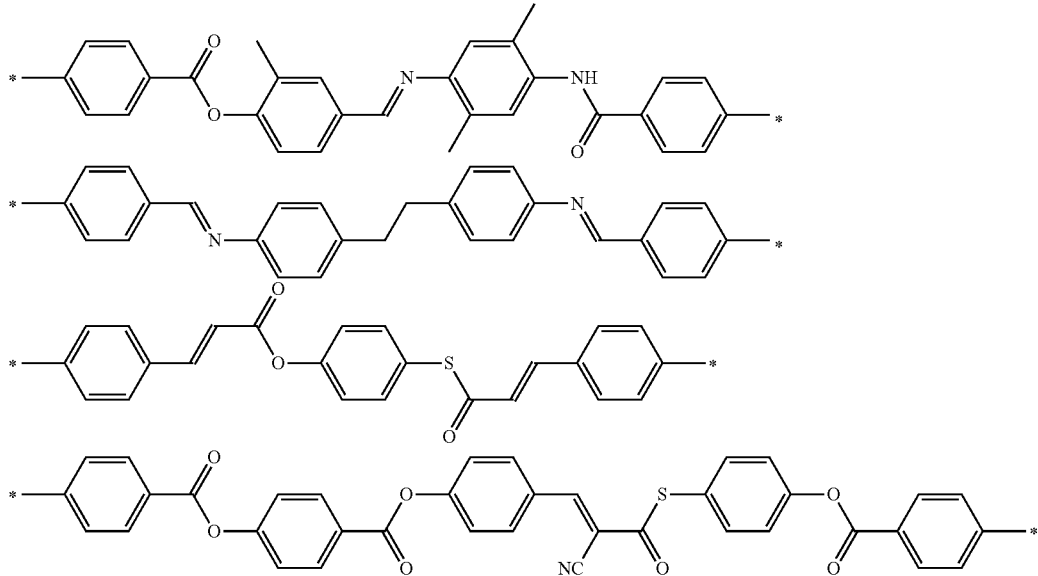

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, and a ureido group having 1 to 10 carbon atoms. These terminal groups may be further substituted with these groups or the polymerizable group described in JP2010-244038k The number of atoms in a main chain of T1 is preferably 1 to 20, more preferably 1 to 15, still more preferably 1 to 10, and particularly preferably 1 to 7. In a case where the number of atoms in the main chain of T1 is 20 or less, the degree of alignment of the light-absorbing anisotropic layer is further improved. Here, the "main chain" in T1 means the longest molecular chain bonded to M1, and the number of hydrogen atoms is not counted as the number of atoms in the main chain of T1. For example, in a case where T1 is an n-butyl group, the number of atoms in the main chain is 4, and in a case where T1 is a sec-butyl group, the number of atoms in the main chain is 3.

A content of the repeating unit (2) is preferably 20% to 100% by mass, more preferably 30% to 99.9% by mass, and still more preferably 40% to 99.0% by mass with respect to 100% by mass of all the repeating units in the high-molecular liquid crystalline compound.

In the present invention, a content of each repeating unit contained in the high-molecular liquid crystalline compound is calculated based on a charged amount (mass) of each monomer used to obtain each repeating unit.

The high-molecular liquid crystalline compound may contain one kind of repeating unit (2) alone or two or more kinds thereof. In a case where the high-molecular liquid crystalline compound contains two or more kinds of the repeating units (2), there are advantages such as improvement in a solubility of the high-molecular liquid crystalline compound in a solvent and easy adjustment of the liquid crystal phase transition temperature. In a case where two or more kinds of the repeating units (2) are contained, a total amount thereof is preferably within the above range.

In a case where two or more kinds of the repeating units (2) are contained, a repeating unit (2) containing no polymerizable group in T1 and a repeating unit (2) containing a polymerizable group in T1 may be used in combination. Thereby, curability of the light-absorbing anisotropic layer is further improved.

In this case, in the high-molecular liquid crystalline compound, a ratio (repeating unit (2) containing a polymerizable group in T1/repeating unit (2) containing no polymerizable group in T1) of the repeating unit (2) containing a polymerizable group in T1 to the repeating unit (2) containing no polymerizable group in T1 is preferably 0.005 to 4 and more preferably 0.01 to 2.4, in terms of a mass ratio. In a case where the mass ratio is 4 or less, there is an advantage that the degree of alignment is excellent. In a case where the mass ratio is 0.05 or more, the curability of the light-absorbing anisotropic layer is further improved.

(Log P Value)

In Formula (2), the difference ($|\log P_1 - \log P_2|$) between the log P value of P1, L1, and SP1 (hereinafter, also referred to as "$\log P_1$") and the log P value of M1 (hereinafter, also referred to as "$\log P_2$") is 4 or more, and from the viewpoint that the degree of alignment of the light-absorbing anisotropic layer is further improved, is preferably 4.25 or more and more preferably 4.5 or more.

In addition, an upper limit value of the difference is preferably 15 or less, more preferably 12 or less, and still more preferably 10 or less, from the viewpoint of adjustment of the liquid crystal phase transition temperature and synthesis suitability.

Here, the log P value is an index expressing properties of hydrophilicity and hydrophobicity of a chemical structure, and may be called a hydrophilic-hydrophobic parameter. The log P value can be calculated using software such as ChemBioDraw Ultra or HSPiP (Ver. 4.1.07). Moreover, the log P value can also be obtained experimentally by a method of OECD Guidelines for the Testing of Chemicals, Sections 1, Test No. 117 or the like. In the present invention, unless otherwise specified, a value calculated by inputting a structural formula of a compound into HSPiP (Ver. 4.1.07) is employed as a log P value.

As described above, log $P_1$ means the log P value of P1, L1, and SP1. The "log P value of P1, L1, and SP1" means a log P value of a structure in which P1, L1, and SP1 are integrated and is not a sum of respective log P values of P1, L1, and SP. Specifically, log $P_1$ is calculated by inputting a series of structural formulae from P to SP1 in Formula (2) into the software.

However, in the calculation of log $P_1$, regarding a part of the group represented by P1 in the series of structural formulae from P1 to SP1, the structure (for example, Formulae (P1-A) to (P1-D)) of the group represented by P1 as it is may be used, or a structure of a group which can become P1 after polymerizing a monomer used to obtain a repeating unit represented by Formula (2) may be used.

Here, specific examples of the latter (group which can become P1) are as follows. In a case where P1 is obtained by polymerization of (meth)acrylic acid ester, the above group is a group represented by $CH_2=C(R^1)-$ ($R^1$ represents a hydrogen atom or a methyl group). In a case where P is obtained by polymerization of ethylene glycol, the above group is ethylene glycol, and in a case where P1 is obtained by polymerization of propylene glycol, the above group is propylene glycol. In a case where P1 is obtained by condensation polymerization of silanol, the above group is silanol (a compound represented by a formula of $Si(R^2)_3$(OH), a plurality of $R^2$'s each independently represent a hydrogen atom or an alkyl group, provided that at least one of the plurality of $R^2$'s represents an alkyl group).

As long as the difference between log $P_1$ and log $P_2$ described above is 4 or more, log $P_1$ may be lower than log $P_2$ or higher than log $P_2$.

Here, a log P value (log $P_2$ described above) of a general mesogenic group tends to be within a range of 4 to 6. At this time, in a case where log $P_1$ is lower than log $P_2$, the value of log $P_1$ is preferably 1 or less and more preferably 0 or less. On the other hand, in a case where log $P_1$ is higher than log $P_2$, the value of log $P_1$ is preferably 8 or more and more preferably 9 or more.

In a case where P1 in Formula (2) is obtained by polymerization of (meth)acrylic acid ester and log $P_1$ is lower than log $P_2$, the log P value of SP1 in Formula (2) is preferably 0.7 or less and more preferably 0.5 or less. On the other hand, in a case where P1 in Formula (2) is obtained by polymerization of (meth)acrylic acid ester and log $P_1$ is higher than log $P_2$, the log P value of SP1 in Formula (2) is preferably 3.7 or more and more preferably 4.2 or more.

In addition, examples of a structure having a log P value of 1 or less include an oxyethylene structure and an oxypropylene structure. Examples of a structure having a log P value of 6 or more include a polysiloxane structure and an alkylene fluoride structure.

The high-molecular liquid crystalline compound used in the present invention preferably contains a repeating unit (3) represented by Formula (3) in addition to the repeating unit (2) represented by Formula (2), from the viewpoint of improvement in film hardness of the light-absorbing anisotropic layer and reinforcement of adhesion between the light-absorbing anisotropic layer and the photo-alignment layer.

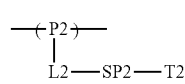
(3)

In Formula (3), P2 represents a main chain of the repeating unit.

In Formula (3), L2 represents a single bond, a divalent alicyclic group which may have a substituent, or a divalent aromatic group which may have a substituent.

In Formula (3), SP2 represents an alkylene group having 10 or more atoms in the main chain. However, one or more $-CH_2-$'s constituting the alkylene group represented by SP2 may be substituted with at least one kind of group (hereinafter, also referred to as a "group 2C") selected from the group consisting of $-O-$, $-S-$, $-N(R^{21})-$, $-C(=O)-$, $-C(=S)-$, $-C(R^{22})=C(R^{23})-$, an alkynylene group, $-Si(R^{24})(R^{25})-$, $-N=N-$, $-C(R^{26})=N-N=C(R^{27})-$, $-C(R^{28})=N-$, and $-S(=O)_2-$, and $R^{21}$ to $R^{28}$ each independently represent a hydrogen atom, a halogen atom, a cyano group, a nitro group, or a linear or branched alkyl group having 1 to 10 carbon atoms. Moreover, the hydrogen atom contained in one or more $-CH_2-$'s constituting the alkylene group represented by SP2 may be substituted with at least one kind of group (hereinafter, also referred to as a "group 2H") selected from the group consisting of a halogen atom, a cyano group, a nitro group, a hydroxyl group, a linear alkyl group having 1 to 10 carbon atoms, and a branched alkyl group having 1 to 10 carbon atoms.

In Formula (3), T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an oxetanyl group which may have a substituent, a phenyl group which may have a substituent, or a maleimide group.

Specific examples and suitable aspects of P2 are the same as those of P1 in Formula (2), and thus descriptions thereof will be omitted.

Specific examples of the divalent alicyclic group, which may have a substituent, represented by L2 are the same as those of the divalent alicyclic group described for A1 in Formula (M1-A), and thus descriptions thereof will be omitted. Moreover, Examples of the substituent include a substituent W described later, and among these, a fluorine atom, a chlorine atom, an alkyl group, a cyano group, a hydroxy group, a carboxy group, an alkoxy group, a nitro group, an acyloxy group, an amino group, a mercapto group, an alkylthio group, an alkylsulfonyl group, an alkylsulfonylamino group, a sulfo group, an alkylsulfinyl group, an epoxycycloalkyl group, or an alkoxycarbonyl group is preferable.

Examples of the divalent aromatic group, which may have a substituent, represented by L2 include a divalent aromatic hydrocarbon group and a divalent aromatic heterocyclic group. Specific examples and suitable aspects of the divalent aromatic hydrocarbon group are the same as those of the divalent aromatic hydrocarbon group described for A1 in Formula (M1-A), and thus descriptions thereof will be omitted. Moreover, specific examples and suitable aspects of the divalent aromatic heterocyclic group are the same as those of the divalent aromatic heterocyclic group described for A1 in Formula (M1-A), and thus descriptions thereof will be omitted. Furthermore, examples of the substituent include the substituent W described later, and among these, a fluorine atom, a chlorine atom, an alkyl group, a cyano group, a hydroxy group, a carboxy group, an alkoxy group, a nitro group, an acyloxy group, an amino group, a mercapto group, an alkylthio group, an alkylsulfonyl group, an alkylsulfonylamino group, a sulfo group, an alkylsulfinyl group, or an alkoxycarbonyl group is preferable.

L2 is preferably a single bond from the viewpoint that the effects of the present invention are further exhibited.

SP2 represents an alkylene group having 10 or more atoms in the main chain, one or more —CH$_2$-'s constituting the alkylene group may be substituted with the above-described group 2C, and the hydrogen atom contained in one or more —CH$_2$-'s constituting the alkylene group may be substituted with the above-described group 2H.

The number of atoms in the main chain of SP2 is 10 or more, and from the viewpoint that a light-absorbing anisotropic layer having superior adhesiveness and surface uniformity is obtained, is preferably 15 or more and more preferably 19 or more. Moreover, the upper limit of the number of atoms in the main chain of SP2 is preferably 70 or less, more preferably 60 or less, and particularly preferably 50 or less, from the viewpoint that a light-absorbing anisotropic layer having a superior degree of alignment is obtained.

Here, the "main chain" in SP2 means a partial structure necessary for directly linking L2 to T2, and "the number of atoms in the main chain" means the number of atoms constituting the partial structure. In other words, the "main chain" in SP2 is a partial structure in which the number of atoms linking L2 to T2 is minimized. For example, in a case where SP2 is a 3,7-dimethyldecanyl group, the number of atoms in the main chain is 10, and in a case where SP2 is a 4,6-dimethyldodecanyl group, the number of atoms in the main chain is 12. Moreover, in Formula (2-1), an inside of a frame expressed by a quadrangle shown by a dotted line corresponds to SP2, and the number (corresponding to the total number of atoms surrounded by a circle shown by a dotted line) of atoms in the main chain of SP2 is 11.

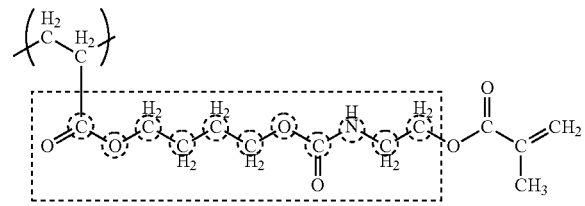

(2-1)

The alkylene group represented by SP2 may be linear or branched.

The number of carbon atoms of the alkylene group represented by SP2 is preferably 8 to 80, more preferably 15 to 80, still more preferably 25 to 70, and particularly preferably 25 to 60, from the viewpoint that a light-absorbing anisotropic layer having a superior degree of alignment is obtained.

From the viewpoint that a light-absorbing anisotropic layer having superior adhesiveness and surface uniformity is obtained, it is preferable that one or more —CH$_2$-'s constituting the alkylene group represented by SP2 are substituted with the above-described group 2C.

In addition, in a case where there are a plurality of —CH$_2$-'s constituting the alkylene group represented by SP2, from the viewpoint that a light-absorbing anisotropic layer having superior adhesiveness and surface uniformity is obtained, it is more preferable that only some of the plurality of —CH$_2$-'s are substituted with the group 2C.

As described above, the group 2C is at least one kind of group selected from the group consisting of —O—, —S—, —N(R$^{21}$)—, —C(=O)—, —C(=S)—, —C(R$^{22}$)=C(R$^{23}$)—, an alkynylene group, —Si(R$^{24}$)(R$^{25}$)—, —N=N—, —C(R$^{26}$)=N—N=C(R$^{27}$)—, —C(R$^{28}$)=N—, and —S(=O)$_2$—, and from the viewpoint that a light-absorbing anisotropic layer having superior adhesiveness and surface uniformity is obtained, at least one kind of group selected from the group consisting of —O—, —N(R$^{21}$)—, —C(=O)—, and —S(=O)$_2$— is preferable and at least one kind of group selected from the group consisting of —O—, —N(R$^{21}$)—, and —C(=O)— is more preferable.

In particular, SP2 is preferably a group containing at least one selected from the group consisting of an oxyalkylene structure in which one or more —CH$_2$-'s constituting the alkylene group are substituted with —O—, an ester structure in which one or more —CH$_2$—CH$_2$-'s constituting the alkylene group are substituted with —O— and —C(=O)—, and a urethane bond in which one or more —CH$_2$—CH$_2$—CH$_2$-'s constituting the alkylene group are substituted with —O—, —C(=O)—, and —NH—.

A hydrogen atom contained in one or more —CH$_2$-'s constituting the alkylene group represented by SP2 may be substituted with the above-described group 2H. In this case, one or more hydrogen atoms contained in —CH$_2$— may be substituted with the group 2H. That is, only one of the hydrogen atoms contained in —CH$_2$— may be substituted with the group 2H, or all (two) of the hydrogen atoms contained in —CH$_2$— may be substituted with the group 2H.

As described above, the group 2H is at least one kind of group selected from the group consisting of a halogen atom, a cyano group, a nitro group, a hydroxyl group, a linear alkyl group having 1 to 10 carbon atoms, and a branched alkyl group having 1 to 10 carbon atoms, is preferably at least one kind of group selected from the group consisting of a hydroxyl group, a linear alkyl group having 1 to 10 carbon atoms, and a branched alkyl group having 1 to 10 carbon atoms, and is more preferably a hydroxyl group.

As described above, T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an oxetanyl group, or a maleimide group.

Among these, from the viewpoint that adhesiveness is improved by cross-linking and/or an interaction with a base layer (for example, a substrate or an alignment film), T2 is preferably a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an oxetanyl group, or a maleimide group, and from the viewpoint that cohesive failure of the light-absorbing anisotropic layer can be further suppressed by cross-linking the light-absorbing anisotropic layer itself and as a result, adhesiveness is further improved, T2 is more preferably a vinyl group, an acryloyloxy group, a methacryloyloxy group, an epoxy group, an oxetanyl group, or a maleimide group.

In a case where the repeating unit (3) has a crosslinkable group as described above, a proportion of the repeating unit (3) is preferably 5% to 30% and more preferably 8% to 20% with respect to a mass of the entire high-molecular liquid crystalline.

Specific examples of the repeating unit (3) include the following structures. Moreover, in the following specific examples, n1 represents an integer of 2 or more and n2 represents an integer of 1 or more.
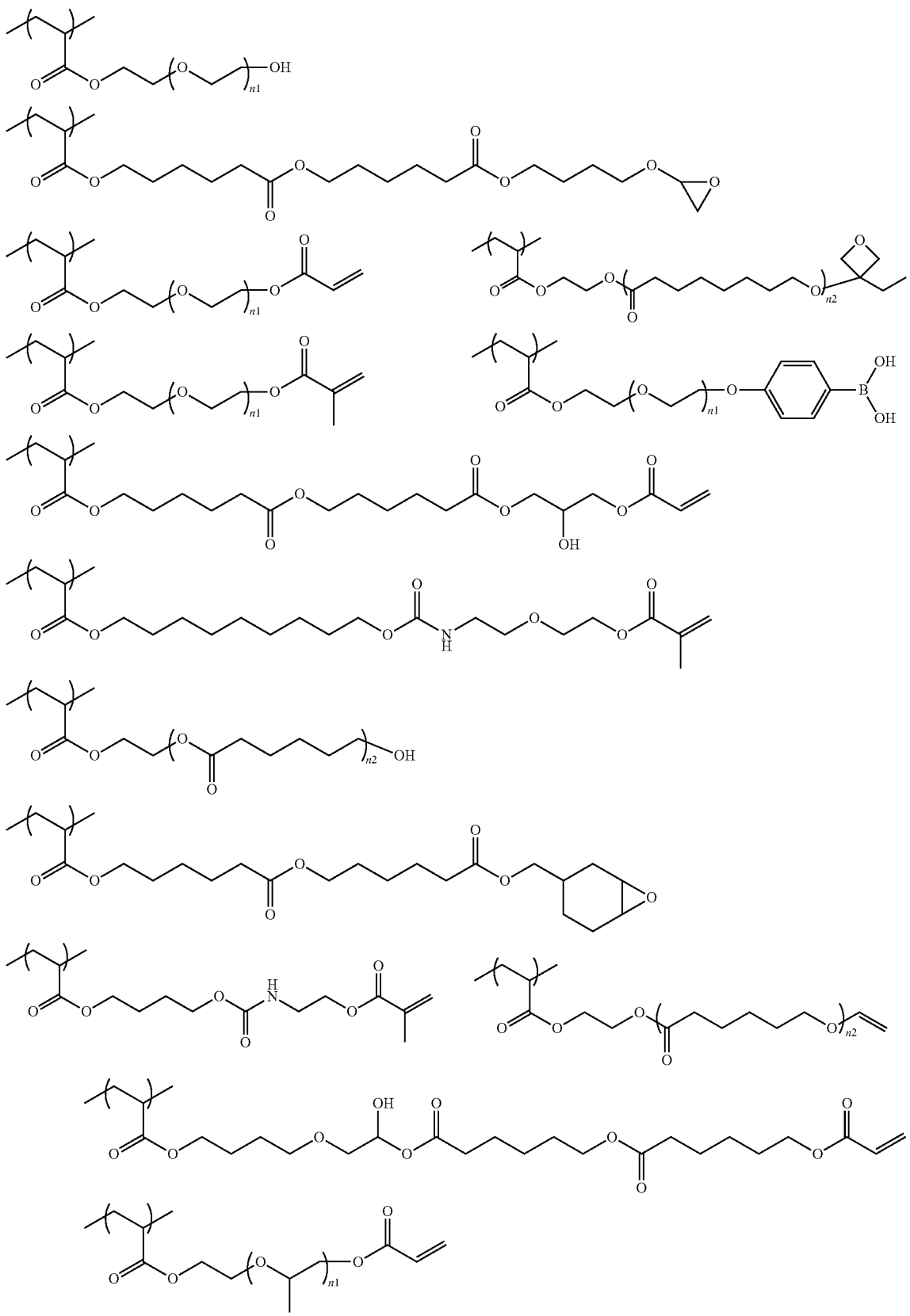

<Dichroic Substance>

The liquid crystal composition used for forming the light-absorbing anisotropic layer contains a dichroic substance.

The dichroic substance is not particularly limited, examples thereof include a visible light-absorbing substance (dichroic coloring agent), a luminescent substance (fluorescent substance and phosphorescent substance), an ultraviolet absorbing substance, an infrared absorbing substance, a nonlinear optical substance, a carbon nanotube, and an inorganic substance (for example, quantum rod), and a dichroic substance (dichroic coloring agent) known in the related art can be used.

Specific examples thereof include the substances described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO016/136561A, paragraphs [0014] to [0033] of WO2017/154835A, paragraphs [0014] to [0033] of WO2017/154695A, paragraphs [0013] to [0037] of WO2017/195833A, paragraphs [0014] to [0034] of WO2018/164252A, and the like.

In the present invention, two or more kinds of the dichroic substances may be used in combination, and for example, from the viewpoint that a color of the light-absorbing anisotropic layer is close to black, at least one kind of coloring agent compound (first dichroic coloring agent) having a maximum absorption wavelength in a wavelength range of 370 to 550 nm and at least one kind of coloring agent compound (second dichroic coloring agent) having a maximum absorption wavelength in a wavelength range of 500 to 700 nm are preferably used in combination.

In the present invention, for a reason that pressing resistance is further improved, it is preferable that the dichroic substance has a crosslinkable group.

Specific examples of the crosslinkable group include a (meth)acryloyl group, an epoxy group, an oxetanyl group, and a styryl group, and among these, a (meth)acryloyl group is preferable.

In the present invention, from the viewpoint that balance between the degree of alignment of the light-absorbing anisotropic layer and uniformity is improved, a content of the dichroic substance contained in the liquid crystal composition is preferably 2% to 35% by mass, more preferably 5% to 25% by mass, still more preferably 5% to 20% by mass, and particularly preferably 10% to 15% by mass, in terms of a solid content proportion.

The liquid crystal composition preferably contains a dichroic substance (hereinafter, also simply referred to as a "specific dichroic coloring agent compound") represented by Formula (4).

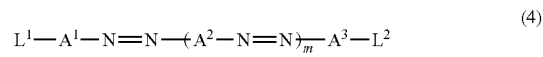

(4)

Here, in Formula (4), $A^1$, $A^2$, and $A^3$ each independently represent a divalent aromatic group which may have a substituent.

In Formula (4), $L^1$ and $L^2$ each independently represent a substituent.

In Formula (4), m represents an integer of 1 to 4, and in a case where m is an integer of 2 to 4, a plurality of $A^2$'s may be the same as or different from each other. Moreover, m is preferably 1 or 2.

In Formula (4), the "divalent aromatic groups which may have a substituent" represented by $A^1$, $A^2$, and $A^3$ will be described.

Examples of the substituent include the substituent group G described in paragraphs [0237] to [0240] of JP2011-237513A, and among these, suitable examples thereof include a halogen atom, an alkyl group, an alkoxy group, an alkoxycarbonyl group (for example, methoxycarbonyl and ethoxycarbonyl), and an aryloxycarbonyl group (for example, phenoxycarbonyl, 4-methylphenoxycarbonyl, and 4-methoxyphenylcarbonyl), more suitable examples thereof include an alkyl group, and still more suitable examples thereof include an alkyl group having 1 to 5 carbon atoms.

On the other hand, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

Furthermore, as the divalent aromatic heterocyclic group, a group derived from a monocyclic or bicyclic heterocycle is preferable. Examples of an atom constituting the aromatic heterocyclic group, other than carbon, include a nitrogen atom, a sulfur atom, and an oxygen atom. In a case where the aromatic heterocyclic group has a plurality of atoms constituting a ring other than carbon, these atoms may be the same as or different from each other. Specific examples of the aromatic heterocyclic group include a pyridylene group (pyridine-diyl group), a quinolylene group (quinoline-diyl group), an isoquinolylene group (isoquinoline-diyl group), a benzothiadizole-diyl group, a phthalimido-diyl group, and a thienothiazole-diyl group (hereinafter, simply referred to as a "thienothiazole group").

Among the divalent aromatic groups, a divalent aromatic hydrocarbon group is preferable.

Here, it is also preferable that any one of $A^1$, $A^2$, or $A^3$ is a divalent thienothiazole group which may have a substituent. Moreover, specific examples of the substituent of the divalent thienothiazole group are the same as those of the substituent in the "divalent aromatic group which may have a substituent" described above, and preferred aspects thereof are also the same.

Furthermore, it is more preferable that among $A^1$, $A^2$, and $A^3$, $A^2$ is a divalent thienothiazole group. In this case, $A^1$ and $A^2$ each represent a divalent aromatic group which may have a substituent.

In a case where $A^2$ is a divalent thienothiazole group, it is preferable that at least one of $A^1$ or $A^2$ is a divalent aromatic hydrocarbon group which may have a substituent, and more preferable that both $A^1$ and $A^2$ are divalent aromatic hydrocarbon groups which may have a substituent.

In Formula (4), the "substituents" represented by $L^1$ and $L^2$ will be described.

As the substituent, a group introduced to enhance a solubility or nematic liquid crystallinity, a group having electron donating properties or electron withdrawing properties and introduced to adjust a tone as a coloring agent, or a group having a crosslinkable group (polymerizable group) and introduced to fix alignment is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms; and examples of the alkyl group include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms; and examples of the alkenyl group include a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms; and examples of the alkynyl group include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms; and examples of the aryl group include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms; and examples of the amino group include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms; and examples of the alkoxy group include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms; and examples of the oxycarbonyl group include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms; and examples of the acyloxy group include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms; and examples of the acylamino group include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms; and examples of the alkoxycarbonylamino group include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms; and examples of the aryloxycarbonylamino group include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms; and examples of the sulfonylamino group include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms; and examples of the sulfamoyl group include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms; and examples of the carbamoyl group include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms; and examples of the alkylthio group include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms; and examples of the arylthio group include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms; and examples of the sulfonyl group include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms; and examples of the sulfinyl group include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms; and examples of the ureido group include an unsubstituted ureido group, a methylureido group, and a phenylureido group), a phosphoric acid amido group (preferably a phosphoric acid amido group having 1 to 20 carbon atoms, more preferably a phosphoric acid amido group having 1 to 10 carbon atoms, and particularly preferably a phosphoric acid amido group having 1 to 6 carbon atoms; and examples of the phosphoric acid amido group include a diethyl phosphoric acid amido group and a phenyl phosphoric acid amido group), a hydroxy group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, for example, a heterocyclic group having a heteroatom such as a nitrogen atom, an oxygen atom, and a sulfur atom; and examples of the heterocyclic group include an epoxy group, an oxetanyl group, an imidazolyl group, a pyridyl group, a quinolyl group, a furyl group, a piperidyl group, a morpholino group, a benzoxazolyl group, a benzimidazolyl group, and a benzothiazolyl group), and a silyl group (preferably a silyl group having 3 to 40 carbon atoms, more preferably a silyl group having 3 to 30 carbon atoms, and particularly preferably a silyl group having 3 to 24 carbon atoms; and examples of the silyl group include a trimethylsilyl group and a triphenylsilyl group).

These substituents may be further substituted with these substituents. Moreover, in a case where two or more of the substituents are contained, the substituents may be the same as or different from each other. Furthermore, if possible, the substituents may be bonded to each other to form a ring.

The substituent represented by $L^1$ or $L^2$ is preferably an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxy group, a cyano group, an imino group, an azo group, a halogen atom, and a heterocyclic group, and more preferably an alkyl group which may have a substituent, an alkenyl group which may have a substituent, an aryl group which may have a substituent, an alkoxy group which may have a substituent, an oxycarbonyl group which may have a substituent, an acyloxy group which may have a substituent, an amino group which may have a substituent, a nitro group, an imino group, and an azo group.

It is preferable that at least one of $L^1$ or $L^2$ contains a crosslinkable group (polymerizable group), and more preferable that both $L^1$ and $L^2$ contain a crosslinkable group.

Specific examples of the crosslinkable group include the polymerizable groups described in paragraphs [0040] to [0050] of JP2010-244038A, and from the viewpoint of reactivity and synthesis suitability, an acryloyl group, a methacryloyl group, an epoxy group, an oxetanyl group, and a styryl group are preferable and an acryloyl group and a methacryloyl group are more preferable.

Examples of suitable aspects of $L^1$ and $L^2$ include an alkyl group substituted with the crosslinkable group, a dialkylamino group substituted with the crosslinkable group, and an alkoxy group substituted with the crosslinkable group.

(Second Dichroic Coloring Agent)

The liquid crystal composition preferably contains a dichroic azo coloring agent represented by Formula (5) from the viewpoint that a high degree of alignment can be achieved on a long wavelength side.

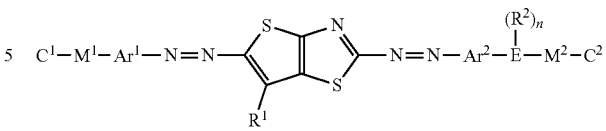

(5)

In Formula (5), $C^1$ and $C^2$ each independently represent a monovalent substituent, provided that at least one of $C^1$ or $C^2$ represents a crosslinkable group.

In Formula (5), $M^1$ and $M^2$ each independently represent a divalent linking group, provided that the number of atoms in a main chain of at least one of $M^1$ or $M^2$ is 4 or more.

In Formula (5), $Ar^1$ and $Ar^2$ each independently represent any one group of a phenylene group which may have a substituent, a naphthylene group which may have a substituent, or a biphenylene group which may have a substituent.

In Formula (5), E represents any one atom of a nitrogen atom, an oxygen atom, or a sulfur atom.

In Formula (5), $R^1$ represents a hydrogen atom or a substituent.

In Formula (5), $R^2$ represents a hydrogen atom or an alkyl group which may have a substituent.

In Formula (5), n represents 0 or 1, provided that in a case where E is a nitrogen atom, n is 1 and in a case where E is an oxygen atom or a sulfur atom, n is 0.

In Formula (5), the monovalent substituents represented by $C^1$ and $C^2$ will be described.

As the monovalent substituent represented by $C^1$ or $C^2$, a group introduced to enhance a solubility of an azo compound or nematic liquid crystallinity, a group having electron donating properties or electron withdrawing properties and introduced to adjust a tone as a coloring agent, or a crosslinkable group (polymerizable group) introduced to fix alignment is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms; and examples of the alkyl group include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms; and examples of the alknyl group include a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms; and examples of the alkynyl group include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms; and examples of the aryl group include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms; and examples of the amino group include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms; and examples of the alkoxy group include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms; and examples of the oxycarbonyl group include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms; and examples of the acyloxy group include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms; and examples of the acylamino group include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms; and examples of the alkoxycarbonylamino group include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms; and examples of the aryloxycarbonylamino group include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms; and examples of the sulfonylamino group include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms; and examples of the sulfamoyl group include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms; and examples of the carbamoyl group include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms; and examples of the alkylthio group include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms; and examples of the arylthio group include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms; and examples of the sulfonyl group include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms; and examples of the sulfinyl group include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms; and examples of the ureido group include an unsubstituted ureido group, a methylureido group, and a phenylureido group), a phosphoric acid amido group (preferably a phosphoric acid amido group having 1 to 20 carbon atoms, more preferably a phosphoric acid amido group having 1 to 10 carbon atoms, and particularly preferably a phosphoric acid amido group having 1 to 6 carbon atoms; and examples of the phosphoric acid amido group include a diethyl phosphoric acid amido group and a phenyl phosphoric acid amido group), a hydroxy group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, for example, a heterocyclic group having a heteroatom such as a nitrogen atom, an oxygen atom, and a sulfur atom; and examples of the heterocyclic group include an epoxy group, an oxetanyl group, an imidazolyl group, a pyridyl group, a quinolyl group, a furyl group, a piperidyl group, a morpholino group, a benzoxazolyl group, a benzimidazolyl group, and a benzothiazolyl group), and a silyl group (preferably a silyl group having 3 to 40 carbon atoms, more preferably a silyl group having 3 to 30 carbon atoms, and particularly preferably a silyl group having 3 to 24 carbon atoms; and examples of the silyl group include a trimethylsilyl group and a triphenylsilyl group).

These substituents may be further substituted with these substituents. Moreover, in a case where two or more of the substituents are contained, the substituents may be the same as or different from each other. Furthermore, if possible, the substituents may be bonded to each other to form a ring.

In Formula (5), at least one of $C^1$ or $C^2$ represents a crosslinkable group, and from the viewpoint that durability of the light-absorbing anisotropic layer is superior, it is preferable that both $C^1$ and $C^2$ are crosslinkable groups.

Specific examples of the crosslinkable group include the polymerizable groups described in paragraphs [0040] to [0050] of JP2010-244038A, and from the viewpoint of reactivity and synthesis suitability, an acryloyl group, a methacryloyl group, an epoxy group, an oxetanyl group, or a styryl group is preferable and an acryloyl group or a methacryloyl group is more preferable.

In Formula (5), the divalent linking groups represented by $M^1$ and $M^2$ will be described.

Examples of the divalent linking group include —O—, —S—, —CO—, —COO—, —OCO—, —O—CO—C—NR$^N$—, —O—CO—NR$^N$—, —SO$_2$—, —SO—, an alkylene group, a cycloalkylene group, an alkenylene group, and a group obtained by combining two or more of these groups.

Among these, a group obtained by combining an alkylene group with one or more kinds of groups selected from the group consisting of —O—, —S—, —CO—, —COO—, —OCO—, —O—CO—O—, —CO—NR$^N$, —O—CO—NR$^N$—, —SO$_2$—, and —SO— is preferable. Moreover, R$^N$ represents a hydrogen atom or an alkyl group.

In addition, the number of atoms in the main chain of at least one of M$^1$ or M$^2$ is 4 or more, preferably 7 or more, and more preferably 10 or more. Moreover, an upper limit value of the number of atoms in the main chain is preferably 20 or less and more preferably 15 or less.

Here, the "main chain" in M$^1$ refers to a portion necessary for directly linking "C$^1$" to "Ar$^1$" in Formula (5), and "the number of atoms in the main chain" refers to the number of atoms constituting the portion. Similarly, the "main chain" in M$^2$ refers to a portion necessary for directly linking "C$^2$" to "E" in Formula (5), and "the number of atoms in the main chain" refers to the number of atoms constituting the portion. Furthermore, "the number of atoms in the main chain" does not include the number of atoms in a branched chain described later.

Specifically, in Formula (D7), the number of atoms in the main chain of M$^1$ is 6 (the number of atoms in a frame shown by a dotted line on a left side of Formula (D7)), and the number of atoms in the main chain of M$^2$ is 7 (the number of atoms in a frame shown by a dotted line on a right side of Formula (D7)).

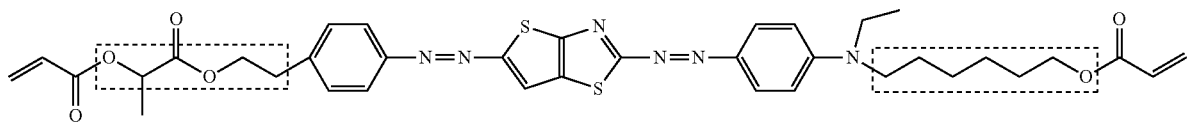

D7

In the present invention, at least one of M$^1$ or M$^2$ may be a group having 4 or more atoms in the main chain, and in a case where the number of atoms in the main chain of one of M$^1$ and M$^2$ is 4 or more, the number of atoms in the main chain of the other of M$^1$ and M$^2$ may be 3 or less.

The total number of atoms in the main chains of M$^1$ and M$^2$ is preferably 5 to 30 and more preferably 7 to 27. In a case where the total number of atoms in the main chains is 5 or more, the dichroic substances are more easily polymerized, and in a case where the total number of atoms in the main chains is 30 or less, a light-absorbing anisotropic layer having an excellent degree of alignment is obtained, or a light-absorbing anisotropic layer having excellent heat resistance is obtained due to an increase in a melting point of the dichroic substance.

M$^1$ and M$^2$ may have a branched chain. Here, the "branched chain" in M refers to a portion other than the portion necessary for directly linking "C$^1$ to "Ar$^1$" in Formula (5). Similarly, the "branched chain" in M2 refers to a portion other than the portion necessary for directly linking "C$^2$" to "E" in Formula (5).

The number of atoms in the branched chain is preferably 3 or less. In a case where the number of atoms in the branched chain is 3 or less, there is an advantage that the degree of alignment of the light-absorbing anisotropic layer is further improved. Moreover, the number of atoms in the branched chain does not include the number of hydrogen atoms.

Examples of preferred structures of M$^1$ and M$^2$ are shown below, but the present invention is not limited to these examples. Moreover, "*" in the following structures represents a linking portion between C$^1$ and Ar$^1$ or a linking portion between C$^2$ and E.

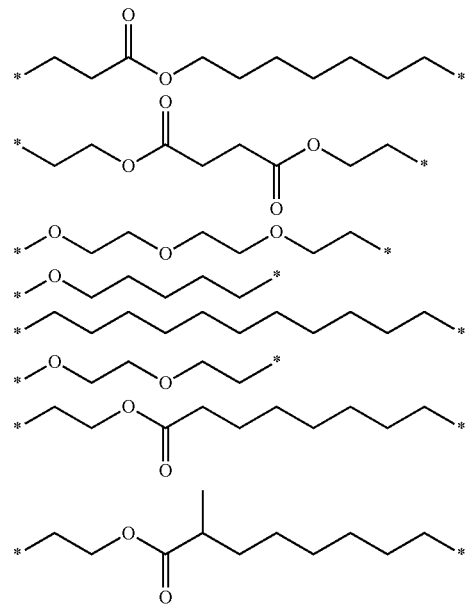

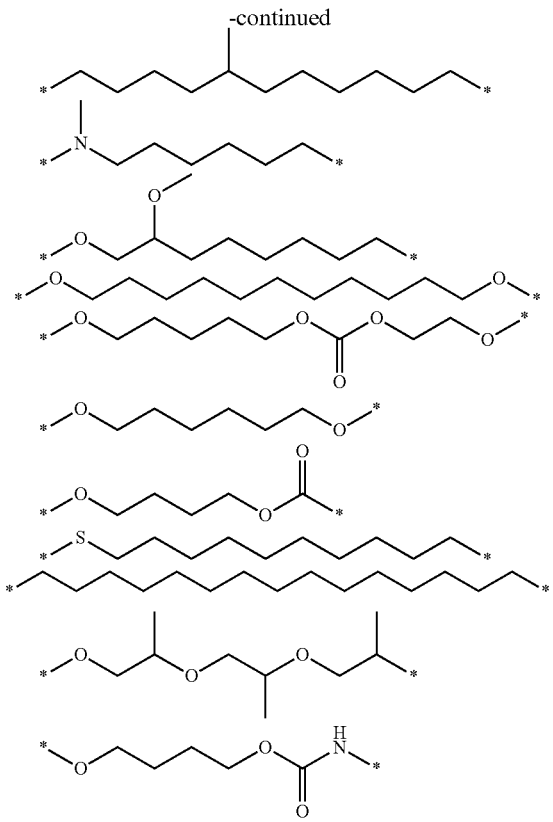

-continued

-continued

[chemical structures]

The "phenylene group which may have a substituent", the "naphthylene group which may have a substituent", and the "biphenylene group which may have a substituent" represented by $Ar^1$ or $Ar^2$ in Formula (5) will be described.

The substituent is not particularly limited, and examples thereof include a halogen atom, an alkyl group, an alkyloxy group, an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, and a ureido group. These substituents may be further substituted with these substituents. Among these, an alkyl group is preferable, an alkyl group having 1 to 5 carbon atoms is more preferable, and from the viewpoint of easy availability of raw materials and the degree of alignment, a methyl group and an ethyl group are preferable.

$Ar^1$ and $Ar^2$ are each a phenylene group which may have a substituent, a naphthylene group which may have a substituent, or a biphenylene group which may have a substituent, but from the viewpoint of easy availability of raw materials and the degree of alignment, a phenylene group which may have a substituent is preferable.

In Formula (5), "$M^1$" and "N" linked to $Ar^1$ are preferably located at a para position in $Ar^1$. Moreover, "E" and "N" linked to $Ar^2$ are preferably located at a para position in $Ar^2$.

In Formula (5), E represents any one atom of a nitrogen atom, an oxygen atom, or a sulfur atom, and from the viewpoint of synthesis suitability, a nitrogen atom is preferable.

In addition, from the viewpoint that a dichroic substance having absorption on a short wavelength side (for example, a substance having a maximum absorption wavelength around 500 to 530 nm) is easily obtained, E in Formula (5) is preferably an oxygen atom.

On the other hand, from the viewpoint that a dichroic substance having absorption on a long wavelength side (for example, a substance having a maximum absorption wavelength around 600 nm) is easily obtained, E in Formula (5) is preferably a nitrogen atom.

In Formula (5), $R^1$ represents a hydrogen atom or a substituent.

Specific examples and suitable aspects of the "substituent" represented by $R^1$ are the same as those of the substituents in $Ar^1$ and $Ar^2$ described above, preferred aspects thereof are also the same, and thus descriptions thereof will be omitted.

In Formula (5), $R^2$ represents a hydrogen atom or an alkyl group which may have a substituent, and is preferably an alkyl group which may have a substituent.

Examples of the substituent include a halogen atom, a hydroxyl group, an ester group, an ether group, and a thioether group.

Examples of the alkyl group include a linear, branched, or cyclic alkyl group having 1 to 8 carbon atoms. Among these, a linear alkyl group having 1 to 6 carbon atoms is preferable, a linear alkyl group having 1 to 3 carbon atoms is more preferable, and a methyl group or an ethyl group is still more preferable.

Furthermore, in a case where E is a nitrogen atom, $R^2$ is a group existing in Formula (5) (that is, this means a case where n is 1). On the other hand, in a case where E is an oxygen atom or a sulfur atom, $R^2$ is a group which does not exist in Formula (5) (that is, this means a case where n is 0).

In Formula (5), n represents 0 or 1, provided that in a case where E is a nitrogen atom, n is 1 and in a case where E is an oxygen atom or a sulfur atom, n is 0.

Specific examples of the dichroic substance are shown below, but the present invention is not limited to these examples.

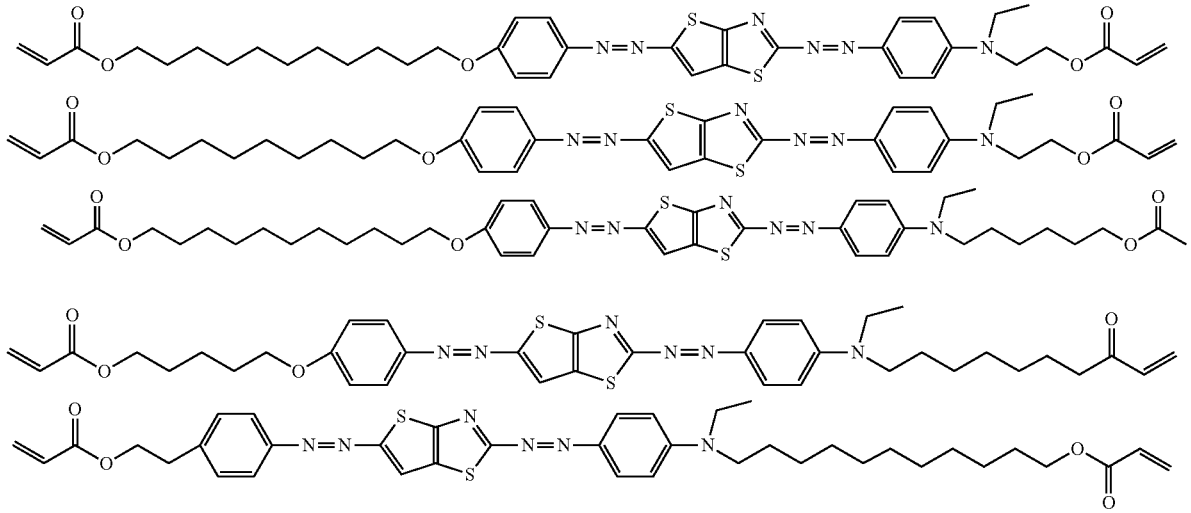

-continued
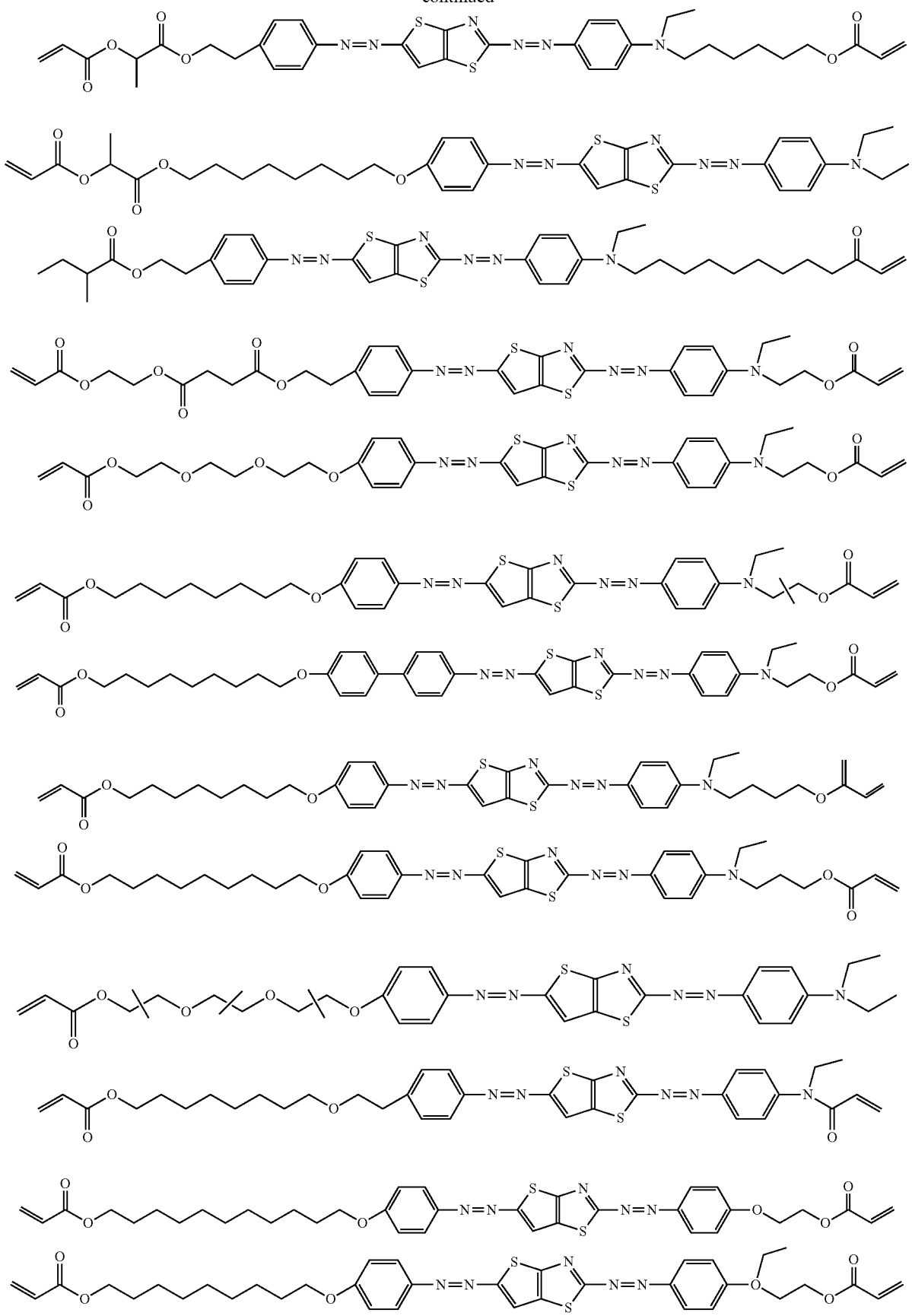

(First Dichroic Coloring Agent)

The liquid crystal composition preferably contains a dichroic azo coloring agent represented by Formula (6) from the viewpoint that a high degree of alignment can be achieved on a short wavelength side.

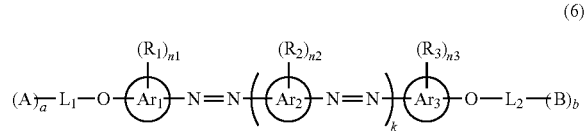

(6)

In Formula (6), A and B each independently represent a crosslinkable group.

In Formula (6), a and b each independently represent 0 or 1, provided that a+b≥1 is satisfied.

In Formula (6), in a case where a is 0, $L_1$ represents a monovalent substituent, and in a case where a is 1, $L_1$ represents a single bond or a divalent linking group. Moreover, in a case where b is 0, $L_2$ represents a monovalent substituent, and in a case where b is 1, $L_2$ represents a single bond or a divalent linking group.

In Formula (6), $Ar_1$ represents an (n1+2)-valent aromatic hydrocarbon group or heterocyclic group, $Ar_2$ represents an (n2+2)-valent aromatic hydrocarbon group or heterocyclic group, and $Ar_3$ represents an (n3+2)-valent aromatic hydrocarbon group or heterocyclic group.

In Formula (6), $R_1$, $R_2$, and $R_3$ each independently represent a monovalent substituent. In a case where n1≥2 is satisfied, a plurality of $R_1$'s may be the same as or different from each other, in a case where n2≥2 is satisfied, a plurality of $R_2$'s may be the same as or different from each other, and in a case where n3≥2 is satisfied, a plurality of $R_3$'s may be the same as or different from each other.

In Formula (6), k represents an integer of 1 to 4. In a case where k≥2 is satisfied, a plurality of $Ar_2$'s may be the same as or different from each other, and the plurality of $R_2$'s may be the same as or different from each other.

In Formula (6), n1, n2, and n3 each independently represent an integer of 0 to 4, provided that in a case where k=1 is satisfied, n1+n2+n3≥0 is satisfied, and in a case where k≥2 is satisfied, n1+n2+n3≥1 is satisfied.

In Formula (6), examples of the crosslinkable groups represented by A and B include the polymerizable groups described in paragraphs [0040] to [0050] of JP2010-244038A. Among these, from the viewpoint of improvement in reactivity and synthesis suitability, an acryloyl group, a methacryloyl group, an epoxy group, an oxetanyl group, and a styryl group are preferable, and from the viewpoint that a solubility can be further improved, an acryloyl group and a methacryloyl group are more preferable.

In Formula (6), a and b each independently represent 0 or 1, but a+b≥1 is satisfied. That is, the dichroic substance has at least one crosslinkable group at a terminal.

Here, it is preferable that both a and b are 1, that is, that the crosslinkable group is introduced at both terminals of the dichroic substance. Thereby, there is an advantage that the solubility of the dichroic substance is further improved or the durability of the light-absorbing anisotropic layer is improved.

In Formula (6), in a case where a is 0, $L_1$ represents a monovalent substituent, and in a case where a is 1, $L_1$ represents a single bond or a divalent linking group. Moreover, in a case where b is 0, $L_2$ represents a monovalent substituent, and in a case where b is 1, $L_2$ represents a single bond or a divalent linking group.

Both $L_1$ and $L_2$ are preferably a single bond or a divalent linking group and more preferably a divalent linking group. Thereby, the solubility of the dichroic substance is further improved.

As the monovalent substituent represented by $L_1$ or $L_2$, a group introduced to enhance the solubility of the dichroic substance or a group having electron donating properties or electron withdrawing properties and introduced to adjust a tone as a coloring agent is preferable.

For example, as the substituent, an alkyl group (preferably an alkyl group having 1 to 20 carbon atoms, more preferably an alkyl group having 1 to 12 carbon atoms, and particularly preferably an alkyl group having 1 to 8 carbon atoms; and examples of the alkyl group include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms; and examples of the alkenyl group include a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms; and examples of the alkynyl group include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms; and examples of the aryl group include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms; and examples of the amino group include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms; and examples of the alkoxy group include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms; and examples of the oxycarbonyl group include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms; and examples of the acyloxy group include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms; and examples of the acylamino group include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms; and examples of the alkoxycarbonylamino group include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms; and examples of the aryloxycarbonylamino group include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms; and examples of the sulfonylamino group include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms; and examples of the sulfamoyl group include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms; and examples of the carbamoyl group include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms; and examples of the alkylthio group include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms; and examples of the arylthio group include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms; and examples of the sulfonyl group include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms; and examples of the sulfinyl group include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms; and examples of the ureido group include an unsubstituted ureido group, a methylureido group, and a phenylureido group), a phosphoric acid amido group (preferably a phosphoric acid amido group having 1 to 20 carbon atoms, more preferably a phosphoric acid amido group having 1 to 10 carbon atoms, and particularly preferably a phosphoric acid amido group having 1 to 6 carbon atoms; and examples of the phosphoric acid amido group include a diethyl phosphoric acid amido group and a phenyl phosphoric acid amido group), a heterocyclic group (preferably a heterocyclic group having 1 to 30 carbon atoms and more preferably a heterocyclic group having 1 to 12 carbon atoms, for example, a heterocyclic group having a heteroatom such as a nitrogen atom, an oxygen atom, and a sulfur atom; and examples of the heterocyclic group include an imidazolyl group, a pyridyl group, a quinolyl group, a furyl group, a piperidyl group, a morpholino group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms; and examples of the silyl group include a trimethylsilyl group and a triphenylsilyl group), a halogen atom (for example, a fluorine atom, a chlorine atom, a bromine atom, and an iodine atom), a hydroxy group, a mercapto group, a cyano group, a nitro group, a hydroxamic acid group, a sulfino group, a hydrazino group, an imino group, an azo group, and the like can be used.

These substituents may be further substituted with these substituents. Moreover, in a case where two or more of the substituents are contained, the substituents may be the same as or different from each other. Furthermore, if possible, the substituents may be bonded to each other to form a ring.

Examples of a group in which the substituent is further substituted with the substituent include a $R_B-(O-R_A)_{na}-$ group in which an alkoxy group is substituted with an alkyl group. Here, in the formula, $R_A$ represents an alkylene group having 1 to 5 carbon atoms, $R_B$ represents an alkyl group having 1 to 5 carbon atoms, and na represents an integer of 1 to 10 (preferably 1 to 5 and more preferably 1 to 3).

Among these, as the monovalent substituent represented by $L_1$ or $L_2$, an alkyl group, an alkenyl group, an alkoxy group, and groups (for example, the $R_B-(O-R_A)_{na}-$ group described above) in which these groups are further substituted with these groups are preferable, and an alkyl group, an alkoxy group, and groups (for example, the $R_B-(O-R_A)_{na}-$ group described above) in which these groups are further substituted with these groups are more preferable.

Examples of the divalent linking group represented by $L_1$ or $L_2$ include —O—, —S—, —CO—, —COO—, —OCO—, —O—CO—O—, —CO—$NR_N$—, —O—CO—$NR_N$—, —$NR_N$—CO—$NR_N$—, —$SO_2$—, —SO—, an alkylene group, a cycloalkylene group, an alkenylene group, and a group obtained by combining two or more of these groups.

Among these, a group obtained by combining an alkylene group with one or more kinds of groups selected from the group consisting of —O—, —COO—, —OCO—, and —O—CO—O— is preferable.

Here, $R_N$ represents a hydrogen atom or an alkyl group. In a case where there are a plurality of $R_N$'s, the plurality of $R_N$'S may be the same as or different from each other.

From the viewpoint that the solubility of the dichroic substance is further improved, the number of atoms in the main chain of at least one of $L_1$ or $L_2$ is preferably 3 or more, more preferably 5 or more, still more preferably 7 or more, and particularly preferably 10 or more. Moreover, an upper limit value of the number of atoms in the main chain is preferably 20 or less and more preferably 12 or less.

On the other hand, from the viewpoint that the degree of alignment of the light-absorbing anisotropic layer is further improved, the number of atoms in the main chain of at least one of $L_1$ or $L_2$ is preferably 1 to 5.

Here, in a case where A exists in Formula (6), the "main chain" in $L_1$ refers to a portion necessary for directly linking "A" to an "O" atom linked to $L_1$, and "the number of atoms in the main chain" refers to the number of atoms constituting the portion. Similarly, in a case where B exists in Formula (6), the "main chain" in $L_2$ refers to a portion necessary for directly linking "B" to an "O" atom linked to $L_2$, and "the number of atoms in the main chain" refers to the number of atoms constituting the portion. Furthermore, "the number of atoms in the main chain" does not include the number of atoms in a branched chain described later.

In addition, in a case where A does not exist, "the number of atoms in the main chain" in $L_1$ refers to the number of atoms in $L_1$ excluding a branched chain. In a case where B does not exist, "the number of atoms in the main chain" in $L_2$ refers to the number of atoms in $L_2$ excluding a branched chain.

Specifically, in Formula (D1), the number of atoms in the main chain of $L_1$ is 5 (the number of atoms in a frame shown by a dotted line on a left side of Formula (D1)), and the number of atoms in the main chain of $L_2$ is 5 (the number of atoms in a frame shown by a dotted line on a right side of Formula (D1)). Moreover, in Formula (D10), the number of atoms in the main chain of $L_1$ is 7 (the number of atoms in a frame shown by a dotted line on a left side of Formula (D10)), and the number of atoms in the main chain of $L_2$ is 5 (the number of atoms in a frame shown by a dotted line on a right side of Formula (D10)).

$L_1$ and $L_2$ may have a branched chain.

Here, in a case where A exists in Formula (6), the "branched chain" in $L_1$ refers to a portion other than the portion necessary for directly linking "A" to the "O" atom linked to $L_1$ in Formula (6). Similarly, in a case where B exists in Formula (6), the "branched chain" in $L_2$ refers to a portion other than the portion necessary for directly linking "B" to the "O" atom linked to $L_2$ in Formula (6).

In addition, in a case where A does not exist in Formula (6), the "branched chain" in $L_1$ refers to a portion other than the longest atomic chain (that is, the main chain) extending from the "O" atom linked to $L_1$ in Formula (6) as a starting point. Similarly, in a case where B does not exist in Formula (6), the "branched chain" in $L_2$ refers to a portion other than the longest atomic chain (that is, the main chain) extending from the "O" atom linked to $L_2$ in Formula (6) as a starting point.

The number of atoms in the branched chain is preferably 3 or less. In a case where the number of atoms in the branched chain is 3 or less, there is an advantage that the degree of alignment of the light-absorbing anisotropic layer is further improved. Moreover, the number of atoms in the branched chain does not include the number of hydrogen atoms.

In Formula (6), $Ar_1$ represents an (n1+2)-valent (for example, trivalent in a case where n1 is 1) aromatic hydrocarbon group or heterocyclic group, $Ar_2$ represents an (n2+2)-valent (for example, trivalent in a case where n2 is 1) aromatic hydrocarbon group or heterocyclic group, and $Ar_3$ represents an (n3+2)-valent (for example, trivalent in a case where n3 is 1) aromatic hydrocarbon group or heterocyclic group. Here, $Ar_1$ to $Ar_3$ can each be referred to as a divalent aromatic hydrocarbon group or a divalent heterocyclic group, which is substituted with n1 to n3 substituents ($R_1$ to $R_3$ described later).

The divalent aromatic hydrocarbon group represented by each of $Ar_1$ to $Ar_3$ may be a single ring or may have a condensed ring structure of two or more rings. The number of rings of the divalent aromatic hydrocarbon group is preferably 1 to 4, more preferably 1 or 2, and still more preferably 1 (that is, a phenylene group) from the viewpoint that the solubility is further improved.

Specific examples of the divalent aromatic hydrocarbon group include a phenylene group, an azulene-diyl group, a naphthylene group, a fluorene-diyl group, an anthracene-diyl group, and a tetracene-diyl group, and from the viewpoint that the solubility is further improved, a phenylene group and a naphthylene group are preferable and a phenylene group is more preferable.

The divalent heterocyclic group may be either aromatic or non-aromatic, but is preferably a divalent aromatic heterocyclic group from the viewpoint that the degree of alignment is further improved.

The divalent aromatic heterocyclic group may be a single ring or may have a condensed ring structure of two or more rings. Examples of an atom constituting the aromatic heterocyclic group, other than carbon, include a nitrogen atom,

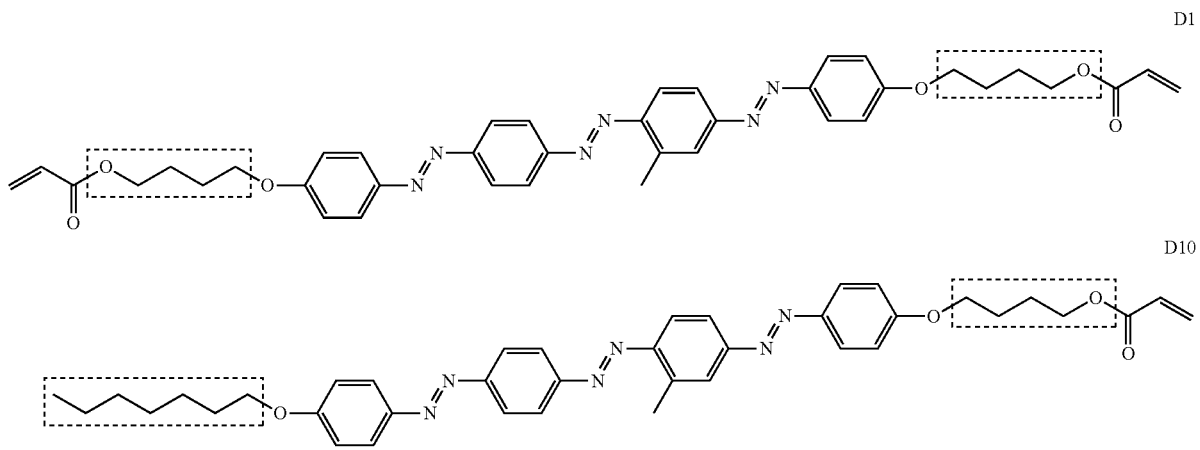

a sulfur atom, and an oxygen atom. In a case where the aromatic heterocyclic group has a plurality of atoms constituting a ring other than carbon, these atoms may be the same as or different from each other.

Specific examples of the aromatic heterocyclic group include a pyridylene group (pyridine-diyl group), thienylene group (thiophene-diyl group), a quinolylene group (quinoline-diyl group), an isoquinolylene group (isoquinoline-diyl group), a thiazole-diyl group, a benzothiadiazole-diyl group, a phthalimido-diyl group, a thienothiazole-diyl group (in the present invention, referred to as a "thienothiazole group"), a thienothiophene-diyl group, and a thienooxazole-diyl group.

Among the groups, as the divalent aromatic heterocyclic group, a group having a single ring or a bicyclic condensed ring structure represented by each of the following structural formulae can be preferably used. Moreover, in the following structural formulae, "*" indicates a bonding position to an azo group or an oxygen atom in Formula (6).

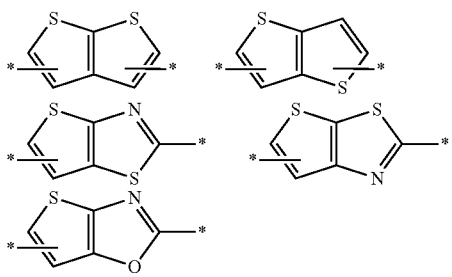

In Formula (6), $Ar_1$ to $Ar_3$ are preferably divalent aromatic hydrocarbon groups, and more preferably phenylene groups.

Here, in a case where $Ar_1$ is a phenylene group, the azo group and the oxygen atom bonded to $Ar_1$ are preferably located at a meta position or a para position and more preferably located at a para position. Thereby, the degree of alignment of the light-absorbing anisotropic layer is further improved. From the same viewpoint, in a case where $Ar_2$ is a phenylene group, the two azo groups bonded to $Ar_2$ are preferably located at a meta position or a para position and more preferably located at a para position. Similarly, in a case where $Ar_3$ is a phenylene group, the azo group and the oxygen atom bonded to $Ar_3$ are preferably located at a meta position or a para position and more preferably located at a para position.

In Formula (6), in a case where $Ar_1$, $Ar_2$, and $Ar_3$ have a condensed ring structure, all of a plurality of rings constituting the condensed ring structure are preferably linked along a longitudinal direction of the structure represented by Formula (6). Thereby, molecules of the dichroic substance can be prevented from becoming bulky in a direction (lateral direction) intersecting the longitudinal direction, and thus alignment properties of the molecules are improved and the degree of alignment of the light-absorbing anisotropic layer is further improved.

Here, the longitudinal direction of the structure represented by Formula (6) refers to a direction in which the structure represented by Formula (6) is extended, and specifically, refers to a direction in which a bond of the azo group bonded to $Ar_1$, $Ar_2$, or $Ar_3$ and a bond of an ether bond (oxygen atom) are extended.

As a specific example of an aspect in which all of the plurality of rings constituting the condensed ring structure are linked along the longitudinal direction of the structure represented by Formula (6), a condensed ring structure represented by Formula (Ar-1) is shown below. That is, in a case where $Ar_1$, $Ar_2$, and A have the condensed ring structure, $Ar_1$, $Ar_2$, and $Ar_3$ preferably have the condensed ring structure represented by Formula (Ar-1).

(Ar-1)

In Formula (Ar-1), $Ar_X$, $Ar_Y$, and $Ar_Z$ each independently represent a benzene ring or a monocyclic heterocycle. n represents an integer of 0 or more. * represents a bonding position to the azo group or the oxygen atom in Formula (6).

As the monocyclic heterocycle in Formula (Ar-1), a monocyclic aromatic heterocycle is preferable. Examples of an atom constituting the monocyclic aromatic, other than carbon, include a nitrogen atom, a sulfur atom, and an oxygen atom. Specific examples of the monocyclic aromatic heterocycle include a pyridine ring, a thiophene ring, a thiazole ring, and an oxazole ring.

Furthermore, $Ar_X$, $Ar_Y$, and $Ar_Z$ may have a substituent. Examples of such a substituent include monovalent substituents in $R_1$ to $R_3$ described later.

n represents an integer of 0 or more, but is preferably 0 to 2, more preferably 0 or 1, and still more preferably 0.

In Formula (6), $R_1$, $R_2$, and $R_3$ each independently represent a monovalent substituent. The monovalent substituent represented by $R_1$, $R_2$, or $R_3$ is preferably a halogen atom, a cyano group, a hydroxy group, an alkyl group, an alkoxy group, an alkyl fluoride group, —O—$(C_2H_4O)$m-R', —O—$(C_3H_6O)$m-R', an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, or a ureido group. Here, R' represents a hydrogen atom, a methyl group, or an ethyl group, and m represents an integer of 1 to 6. These substituents may be further substituted with these substituents.

Among these, from the viewpoint that the solubility of the dichroic substance is further improved, the monovalent substituent represented by $R_1$, $R_2$, or $R_3$ is preferably a fluorine atom, a chlorine atom, a methyl group, an ethyl group, a propyl group, a methoxy group, an ethoxy group, a propoxy group, a hydroxy group, a trifluoromethyl group, —O—$(C_2H_4O)$m-R', or —O—$(C_3H_6O)$m-R', and more preferably a trifluoromethyl group, a methoxy group, a hydroxy group, —O—$(C_2H_4O)$m-R', or —O—$(C_3H_6O)$m-R'.

In the monovalent substituents represented by $R_1$, $R_2$, and $R_3$, the number of atoms in the main chain is preferably 1 to 15 and more preferably 1 to 12 from the viewpoint of balance between the solubility of the dichroic substance and the alignment properties of the light-absorbing anisotropic layer. Here, in the monovalent substituents represented by $R_1$, $R_2$, and $R_3$, "the number of atoms in the main chain" refers to the number of atoms of $R_1$, $R_2$, or $R_3$ excluding a branched chain. Moreover, the "branched chain" refers to a portion other than the longest atomic chain (that is, the main chain) extending from any one of $Ar_1$, ..., or $Ar_3$ in Formula (6) as a starting point.

In a case where Formula (6) has at least one substituent selected from $R_1$, $R_2$, and $R_3$, it is preferable to satisfy at least one condition selected from the following conditions (R1) to (R3). Thereby, the solubility of the dichroic substance is further improved.

Condition (R1): in $Ar_1$, at least one $R_1$ and an azo group are located adjacent to each other Condition (R2): in $Ar_2$, at least one $R_2$ and at least one azo group are located adjacent to each other Condition (R3): in $Ar_3$, at least one $R_3$ and an azo group are located adjacent to each other Specific examples of the condition (R1) include an aspect in which in a case where $Ar_1$ is a phenylene group, $R_1$ is located at an ortho position with respect to the azo group bonded to $Ar_1$. Specific examples of the condition (R2) include an aspect in which in a case where $Ar_2$ is a phenylene group, $R_2$ is located at an ortho position with respect to at least one azo group. Specific examples of the condition (R3) include an aspect in which in a case where $Ar_3$ is a phenylene group, $R_3$ is located at an ortho position with respect to the azo group bonded to $Ar_3$.

In Formula (6), k represents an integer of 1 to 4. Here, from the viewpoint light resistance is also excellent while securing the excellent solubility, k is preferably 2 or more. On the other hand, from the viewpoint that the solubility of the dichroic substance is superior, k is preferably 1.

In Formula (6), n1, n2, and n3 each independently represent an integer of 0 to 4, but are preferably 0 to 3.

Here, in a case where k=1 is satisfied, n1+n2+n3≥0 is satisfied. That is, in a case where Formula (6) has a bisazo structure, the sufficient solubility can be obtained regardless of the presence or absence of the substituents ($R_1$ to $R_3$ in Formula (6)), but from the viewpoint that the solubility is further improved, the substituents are preferably contained.

In a case where k=1 is satisfied, n1+n2+n3 is preferably 0 to 9, more preferably 1 to 9, and still more preferably 1 to 5.

On the other hand, in a case where k≥2 is satisfied, n1+n2+n3≥1 is satisfied. That is, in a case where Formula (6) has a trisazo structure, a tetrakisazo structure, or a pentakisazo structure, at least one of the substituents ($R_1$ to $R_3$ in Formula (6)) is contained.

In a case where k≥2 is satisfied, n1+n2+n3 is preferably 1 to 9 and more preferably 1 to 5.

Specific examples of the dichroic substance represented by Formula (6) are shown below, but the present invention is not limited to these examples. Moreover, in the following specific examples, n represents an integer of 1 to 10.

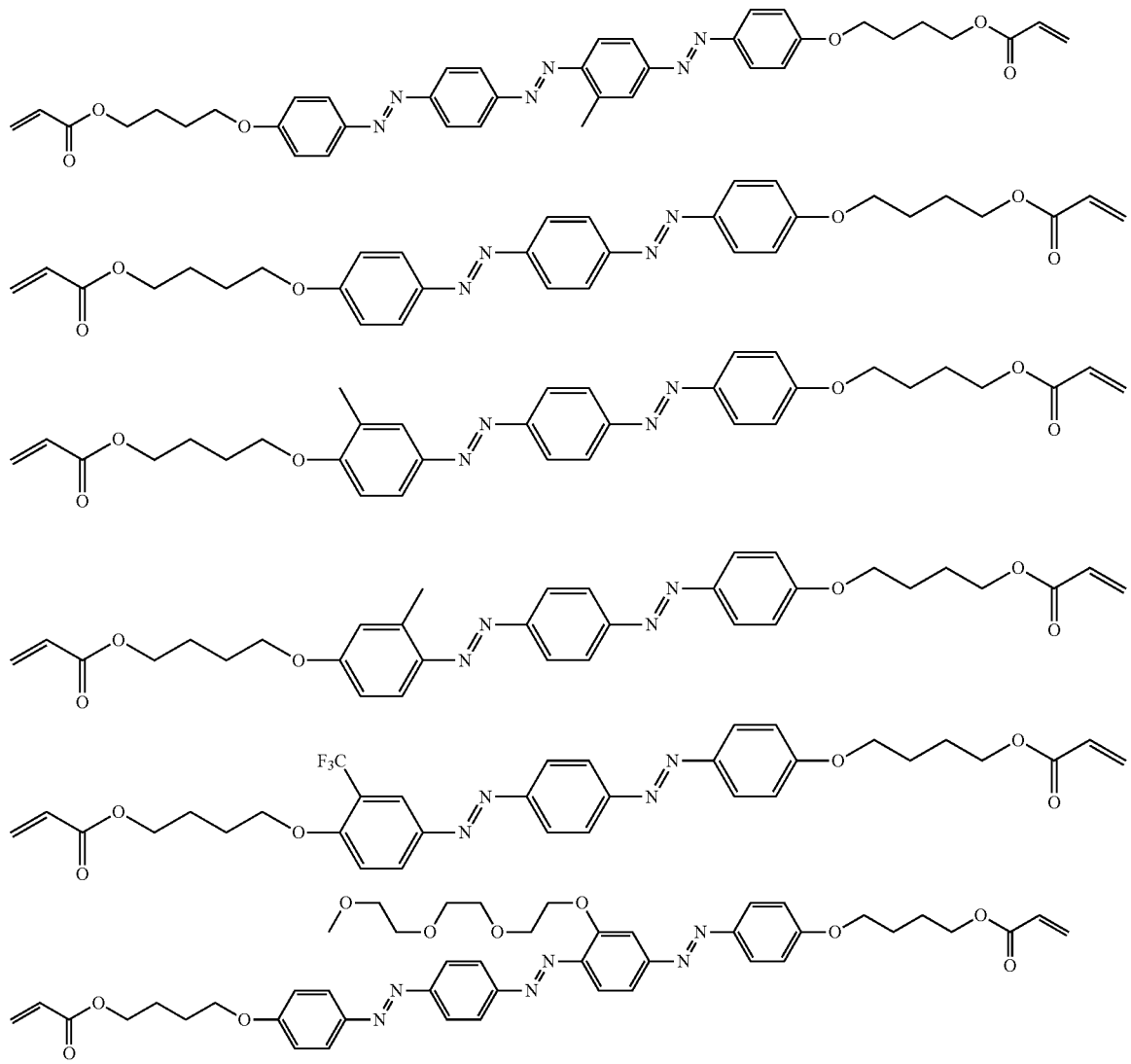

-continued
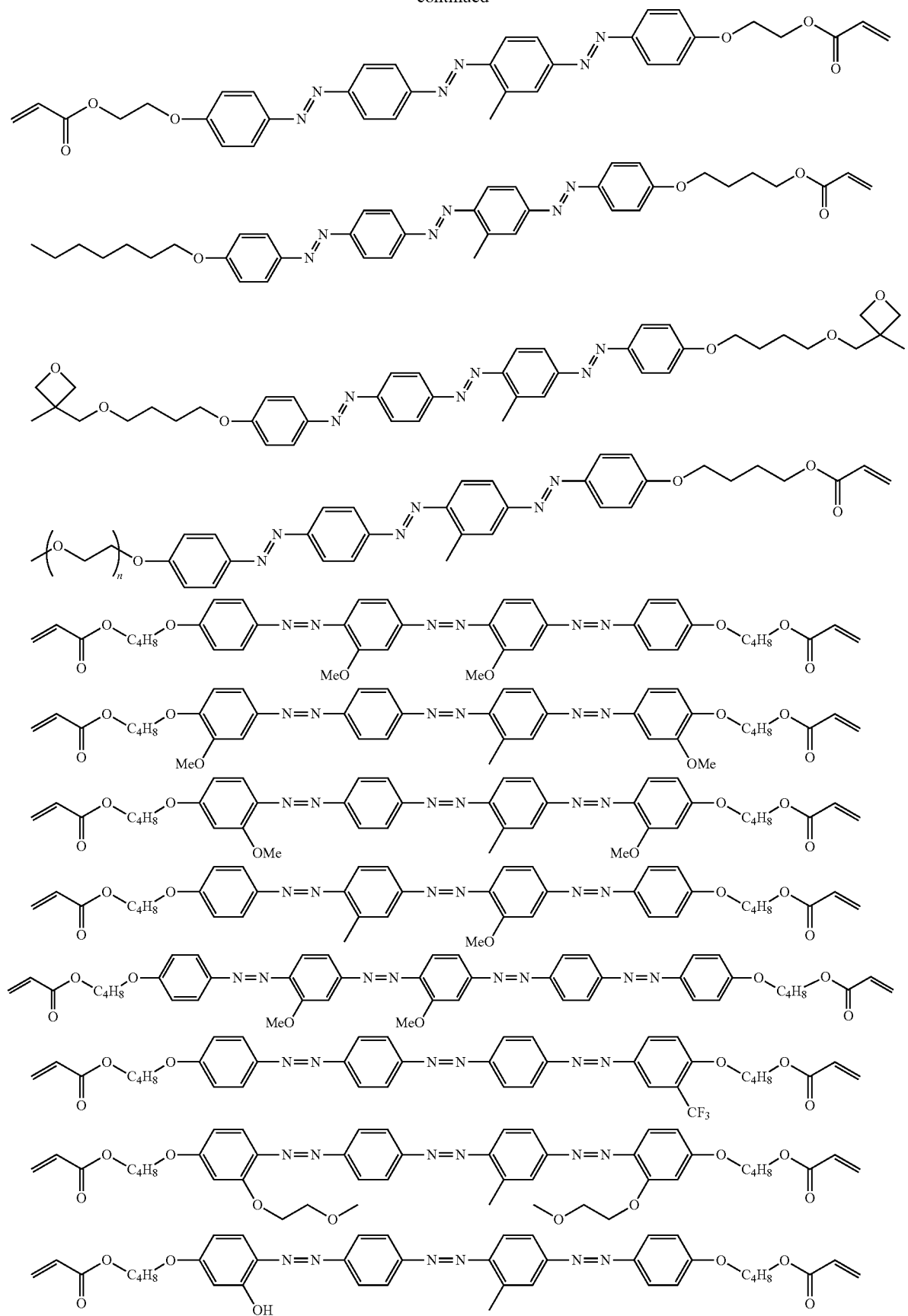

-continued

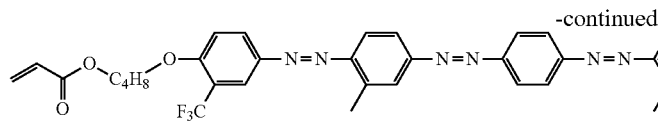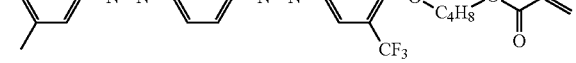

In the present invention, the dichroic substance means a substance having different absorbances depending on a direction.

The dicroic substance may or may not exhibit liquid crystallinity.

In a case where the dichroic substance exhibits the liquid crystallinity, the liquid crystallinity may exhibit any one of nematicity or smecticity. A temperature range showing the liquid crystal phase is preferably room temperature (about 20° C. to 28° C.) to 300° C., and from the view point of handleability and manufacturing suitability, is more preferably 50° C. to 200° C.

The liquid crystal composition may contain one kind of dichroic substance alone or two or more kinds thereof.

<Low-Molecular Liquid Crystalline Compound>

The liquid crystal composition used for forming the light-absorbing anisotropic layer preferably contains a low-molecular liquid crystalline compound in addition to the high-molecular liquid crystalline compound from the viewpoint of the adhesion between the photo-alignment layer and the light-absorbing anisotropic layer. Here, the "low-molecular liquid crystalline compound" refers to a liquid crystalline compound having no repeating unit in the chemical structure.

Examples of the low-molecular liquid crystalline compound include the liquid crystalline compound described in JP2013-228706A, the compound represented by Formula (M1), (M2) or (M3) described in paragraphs [0030] to [0033] of JP2014-077068A, and the low-molecular liquid crystalline compound described in paragraphs [0043] to [0050] of WO2018/199096A.

Among these, from the viewpoint of reactivity and synthesis suitability, a radically polymerizable group is preferable, an acryloyl group, a methacryloyl group, an epoxy group, an oxetanyl group, or a styryl group is preferable, and an acryloyl group or a methacryloyl group is more preferable.

(Molecular Weight)

A molecular weight of the low-molecular liquid crystalline compound is preferably less than 5,000, more preferably 200 to 2,000, and still more preferably 200 or more and less than 1,500.

(Content)

In a case where the liquid crystal composition contains the low-molecular liquid crystalline compound, a content of the low-molecular liquid crystalline compound is preferably 3 to 30 parts by mass and more preferably 5 to 20 parts by mass with respect to 100 parts by mass of the high-molecular liquid crystalline compound.

<Interface Modifier>

The liquid crystal composition used for forming the light-absorbing anisotropic layer preferably contains an interface modifier. By incorporation of the interface modifier, it is anticipated that the smoothness of the coating surface is improved to improve the degree of alignment, or cissing and unevenness are suppressed to improve the in-plane uniformity.

As the interface modifier, a material having a liquid crystalline compound horizontal on the coating surface side is preferable, and the compounds described in paragraphs [0155] to [0170] of WO2016/009648A or the compounds (horizontal alignment agents) described in paragraphs [0253] to [0293] of JP2011-237513A can be used.

In a case where the liquid crystal composition contains the interface modifier, a content of the interface modifier is preferably 0.001 to 5 parts by mass and more preferably 0.01 to 3 parts by mass with respect to 100 parts by mass of the total amount of the dichroic substance and the high-molecular liquid crystalline compound in the liquid crystal composition.

<Polymerization Initiator>

The liquid crystal composition used for forming the light-absorbing anisotropic layer may contain a polymerization initiator.

The polymerization initiator is not particularly limited, but is preferably a photosensitive compound, that is, a photopolymerization initiator.

As the photopolymerization initiator, various kinds of compounds can be used with no particular limitation. Examples of the photopolymerization initiator include α-carbonyl compounds (each of the specifications of U.S. Pat. Nos. 2,367,661A and 2,367,670A), acyloin ether (the specification of U.S. Pat. No. 2,448,828A), α-hydrocarbon-substituted aromatic acyloin compounds (the specification of U.S. Pat. No. 2,722,512A), polynuclear quinone compounds (each of the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (JP1985-105667A (JP-S60-105667A) and the specification of U.S. Pat. No. 4,239,850A), oxadiazole compounds (the specification of U.S. Pat. No. 4,212,970A), o-acyloxime compounds (paragraph [0065] of JP2016-027384A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

A commercially available product can also be used as such a photopolymerization initiator, and examples thereof include IRGACURE184, IRGACURE907, IRGACURE369, IRGACURE651, IRGACURE819, and IRGACURE OXE-01, which are manufactured by BASF SE.

In a case where the liquid crystal composition contains the polymerization initiator, a content of the polymerization initiator is preferably 0.01 to 30 parts by mass and more preferably 0.1 to 15 parts by mass with respect to 100 parts by mass of the total amount of the dichroic substance and the liquid crystalline compound in the liquid crystal composition. In a case where the content of the polymerization initiator is 0.01 parts by mass or more, the curability of the light-absorbing anisotropic layer is improved, and in a case where the content of the polymerization initiator is 30 parts by mass or less, the alignment of the light-absorbing anisotropic layer is improved.

<Solvent>

The liquid crystal composition used for forming the light-absorbing anisotropic layer preferably contains a solvent from the viewpoint of workability or the like.

Examples of the solvent include organic solvents such as ketones (for example, acetone, 2-butanone, methyl isobutyl ketone, cyclopentanone, and cyclohexanone), ethers (for example, dioxane, tetrahydrofuran, 2-methyl tetrahydrofuran, cyclopentyl methyl ether, tetrahydropyran, and dioxolane), aliphatic hydrocarbons (for example, hexane), alicyclic hydrocarbons (for example, cyclohexane), aromatic hydrocarbons (for example, benzene, toluene, xylene, and trimethylbenzene), halocarbons (for example, dichloromethane, trichloromethane, dichloroethane, dichlorobenzene, and chlorotoluene), esters (for example, methyl acetate, ethyl acetate, butyl acetate, and ethyl lactate), alcohols (for example, ethanol, isopropanol, butanol, cyclohexanol, isopentyl alcohol, neopentyl alcohol, diacetone alcohol, and benzyl alcohol), cellosolves (for example, methyl cellosolve, ethyl cellosolve, and 1,2-dimethoxyethane), cellosolve acetates, sulfoxides (for example, dimethyl sulfoxide), amides (for example, dimethylformamide, dimethylacetamide, N-methylpyrrolidone, and N-ethylpyrrolidone), and heterocyclic compounds (for example, pyridine), and water. These solvents may be used alone or in combination of two or more kinds thereof.

Among these solvents, from the viewpoint of utilizing the effect of the excellent solubility, ketones (particularly, cyclopentanone and cyclohexanone), ethers (particularly, tetrahydrofuran, cyclopentylmethyl ether, tetrahydropyran, and dioxolane), and amides (particularly, dimethylformamide, dimethylacetamide, N-methylpyrrolidone, and N-ethylpyrrolidone) are preferable.

In a case where a liquid crystal composition contains the solvent, a content of the solvent is preferably 60% to 99% by mass, more preferably 70% to 95% by mass, and still more preferably 70% to 90% by mass with respect to the total mass of the liquid crystal composition. Moreover, 80% to 99% by mass is preferable, 83% to 97% by mass is more preferable, and 85% to 95% by mass is still more preferable.

<Formation Method>

A method for forming a light-absorbing anisotropic layer using the above-described liquid crystal composition is not particularly limited, and examples thereof include a method including a step (hereinafter, also referred to as a "coating film formation step") of applying the liquid crystal composition onto a photo-alignment layer to form a coating film and a step (hereinafter, also referred to as an "alignment step") of aligning liquid crystalline components contained in the coating film, in this order.

(Coating Film Formation Step)

The coating film formation step is a step of applying a liquid crystal composition on a photo-alignment layer to form a coating film.

By using a liquid crystal composition containing the above-described solvent or using a liquid material such as a molten liquid obtained by heating or the like of a liquid crystal composition, the liquid crystal composition can be easily applied onto the photo-alignment layer.

Specific examples of a method for applying the liquid crystal composition include known methods such as a roll coating method, a gravure printing method, a spin coating method, a wire bar coating method, an extrusion coating method, a direct gravure coating method, a reverse gravure coating method, a die-coating method, a spray method, and an ink jet method.

(Alignment Step)

The alignment step is a step of aligning liquid crystalline components contained in the coating film. Thereby, a light-absorbing anisotropic layer is obtained.

Furthermore, the liquid crystalline component is a component containing not only the above-described liquid crystalline compound but also the dichroic substance having liquid crystallinity in a case where the above-described dichroic substance has liquid crystallinity.

The alignment step may include a drying treatment. Components such as a solvent can be removed from the coating film by the drying treatment. The drying treatment may be performed by a method (for example, natural drying) of leaving the coating film at room temperature for a predetermined time or a method of heating and/or blowing.

Here, the liquid crystalline components contained in the liquid crystal composition may be aligned by the above-described coating film formation step or drying treatment. For example, in an aspect in which the liquid crystal composition is prepared as a coating liquid containing a solvent, by drying the coating film and removing the solvent from the coating film, a coating film (that is, light-absorbing anisotropic layer) having a light absorption anisotropy is obtained.

In a case where the drying treatment is performed at a temperature equal to or higher than a transition temperature of the liquid crystalline component contained in the coating film to a liquid crystal phase, a heating treatment described later may not be performed.

The transition temperature of the liquid crystalline component contained in the coating film to a liquid crystal phase is preferably 10° C. to 250° C. and more preferably 25° C. to 190° C. from the viewpoint of manufacturing suitability or the like. In a case where the transition temperature is 10° C. or higher, a cooling treatment or the like for lowering the temperature to a temperature range in which a liquid crystal phase is exhibited is not required, which is preferable. Moreover, in a case where the transition temperature is 250° C. or lower, a high temperature is not required even in a case of once reaching an isotropic liquid state having a temperature higher than the temperature range in which a liquid crystal phase is exhibited and waste of heat energy and deformation and deterioration of a substrate can be reduced, which is preferable.

The alignment step preferably includes a heating treatment. Thereby, the liquid crystalline components contained in the coating film can be aligned, and thus the coating film after the heating treatment can be suitably used as a light-absorbing anisotropic layer.

The heating treatment is preferably 10° C. to 250° C. and more preferably 25° C. to 190° C. from the viewpoint of manufacturing suitability or the like. Moreover, a heating time is preferably 1 to 300 seconds and more preferably 1 to 60 seconds.

The alignment step may include a cooling treatment performed after the heating treatment. The cooling treatment is a treatment for cooling the heated coating film to about room temperature (20° C. to 25° C.). Thereby, the alignment of the liquid crystalline components contained in the coating film can be fixed. A cooling method is not particularly limited, and can be performed by a known method.

Through the above steps, a light-absorbing anisotropic layer can be obtained.

Furthermore, in the present aspect, as a method of aligning the liquid crystalline components contained in the coating film, a drying treatment and a heating treatment are mentioned, but the method is not limited to the treatments and can be performed by a known alignment treatment.

(Other Steps)

The method for forming the light-absorbing anisotropic layer may include a step (hereinafter, also referred to as a "curing step") of curing the light-absorbing anisotropic layer, after the alignment step.

In a case where the light-absorbing anisotropic layer has a crosslinkable group (polymerizable group), the curing step is performed, for example, by heating and/or light irradiation (exposure). Among these, the curing step is preferably performed by light irradiation.

In addition, in a case where the photo-alignment layer contains a compound having a radically polymerizable group with photoreactivity, an unreacted radically polymerizable group can be remained on the surface of the photo-alignment layer by a method in which the radical polymerization initiator is not contained in the photo-alignment layer or a method in which exposure is performed in an environment with a high oxygen concentration. By reacting an unreacted radically polymerizable group existing on the surface of the photo-alignment layer with a radically polymerizable group of the light-absorbing anisotropic layer in the "curing step", the adhesiveness between the photo-alignment layer and the light-absorbing anisotropic layer can be enhanced.

As a light source used for curing, various light sources such as an infrared ray, visible light, and an ultraviolet ray can be used, but an ultraviolet ray is preferable. Moreover, in a case of curing, ultraviolet rays may be radiated while heating, or ultraviolet rays may be radiated through a filter which transmits only a specific wavelength.

In a case where exposure is performed while heating, a heating temperature in a case of exposure depends on the transition temperature of the liquid crystalline component contained in the light-absorbing anisotropic layer to a liquid crystal phase, but is preferably 25° C. to 140° C.

Furthermore, the exposure may be performed under a nitrogen atmosphere. In a case where curing of the light-absorbing anisotropic layer proceeds by radical polymerization, inhibition of polymerization due to oxygen is reduced, and thus the exposure is preferably performed under a nitrogen atmosphere.

In the present invention, a thickness of the light-absorbing anisotropic layer is not particularly limited, but is preferably 0.1 to 5.0 μm and more preferably 0.3 to 1.5 sm.

The method for manufacturing an optical laminate according to the embodiment of the present invention preferably includes a step of bringing a surface of the photo-alignment layer on a side where the liquid crystal composition is applied into contact with a transporting roll between the above-described photo-alignment layer formation step and the above-described light-absorbing anisotropic layer formation step, for a reason that the surface of the photo-alignment layer is more likely to be rubbed and usefulness of the present invention is increased.

In addition, for the same reason, a step of winding a polymer film on which the photo-alignment layer is formed is preferably provided between the above-described photo-alignment layer formation step and the above-described light-absorbing anisotropic layer formation step.

[Optical Laminate]

The optical laminate according to the embodiment of the present invention is an optical laminate including the photo-alignment layer and the light-absorbing anisotropic layer and having a front transmittance of 60% or less.

In addition, in the optical laminate according to the embodiment of the present invention, the light-absorbing anisotropic layer is a layer formed of the liquid crystal composition containing the dichroic substance and the high-molecular liquid crystalline compound.

Moreover, the optical laminate according to the embodiment of the present invention is assumed to be a polarizer, and has a front transmittance of 60% or less, preferably 25% to 60%, and more preferably 35% to 55%.

Furthermore, the optical laminate according to the embodiment of the present invention may have a transparent polymer film and/or an oxygen shielding layer on a side of the photo-alignment layer.

Figure 1B:
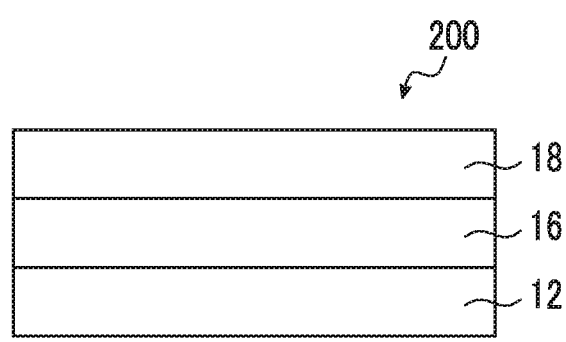
FIG. 1B is a schematic cross-sectional view showing another example of the optical laminate according to the embodiment of the present invention.

FIGS. 1A and 1B are schematic cross-sectional views showing an example of the optical laminate according to the embodiment of the present invention.

Here, an optical laminate 100 shown in FIG. 1A is an optical laminate having a layer configuration (hereinafter, also simply referred to as a "configuration A") including a transparent polymer film 12, an oxygen shielding layer 14, a photo-alignment layer 16, and a light-absorbing anisotropic layer 18 in this order.

Moreover, an optical laminate 200 shown in FIG. 1B is an optical laminate having a layer configuration (hereinafter, also simply referred to as a "configuration B") including the transparent polymer film 12, the photo-alignment layer 16, and the light-absorbing anisotropic layer 18 in this order.

Figure 1C:
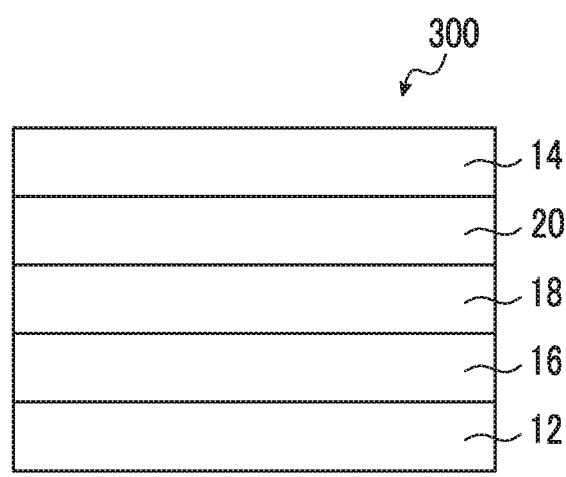
FIG. 1C is a schematic cross-sectional view showing still another example of the optical laminate according to the embodiment of the present invention.

Furthermore, an optical laminate 300 shown in FIG. 1C is an optical laminate having a layer configuration (hereinafter, also simply referred to as a "configuration C") including the transparent polymer film 12, the photo-alignment layer 16, the light-absorbing anisotropic layer 18, a cured layer 20, and the oxygen shielding layer 14 in this order.

Hereinafter, an optional oxygen shielding layer or the like included in the optical laminate according to the embodiment of the present invention will be described in detail. Moreover, the photo-alignment layer and the light-absorbing anisotropic layer included in the optical laminate according to the embodiment of the present invention are the same as those described in the above-described method for manufacturing an optical laminate according to the embodiment of the present invention.

[Cured Layer]

The optical laminate according to the embodiment of the present invention may include a cured layer having a thickness of 100 nm or less on a side of the light-absorbing anisotropic layer opposite to the photo-alignment layer, for the purpose of reducing a refractive index difference between the light-absorbing anisotropic layer and an adjacent layer.

Such a cured layer is not particularly limited, and various known layers can be used. Examples thereof include a layer containing a liquid crystalline compound and a layer obtained by curing a composition containing a polyfunctional monomer. It is preferable to have a refractive index which allows index matching with the light-absorbing anisotropic layer.

[Oxygen Shielding Layer]

The optical laminate according to the embodiment of the present invention may include an oxygen shielding layer on one or both of a side of the photo-alignment layer opposite to the light-absorbing anisotropic layer and a side of the light-absorbing anisotropic layer opposite to the photo-alignment layer, for the purpose of improving light resistance. Furthermore, in the following description, an oxygen shielding layer provided on the side of the photo-alignment layer opposite to the light-absorbing anisotropic layer is also simply referred to as an "oxygen shielding layer 1" and an oxygen shielding layer provided on the side of the light-absorbing anisotropic layer opposite to the photo-alignment layer is also simply referred to as an "oxygen shielding layer 2".

The "oxygen shielding layer" is an oxygen shielding film having an oxygen shielding function, and specific examples thereof include a layer containing an organic compound such as polyvinyl alcohol, polyethylene vinyl alcohol, polyvinyl ether, polyvinyl pyrrolidone, polyacrylamide, polyacrylic acid, cellulose ether, polyamide, polyimide, a styrene-maleic acid copolymer, gelatin, vinylidene chloride, and cellulose nanofiber.

Furthermore, the oxygen shielding function in the present specification is not limited to a state where oxygen is not passed at all, but also includes a state where oxygen is slightly passed depending on desired performance.

In a case where the oxygen shielding layer is provided on the transparent polymer film and the photo-alignment layer having the azobenzene compound represented by General Formula (I) is provided thereon, from the viewpoint that the alignment properties are enhanced, polyvinyl alcohol having a degree of saponification of 95 mol % or more or modified polyvinyl alcohol having a degree of saponification of 95 mol % or more is preferably used for the oxygen shielding layer.

In addition, a thin layer (thin metal compound layer) consisting of a metal compound is also exemplified. As a method for forming the thin metal compound layer, any method can be used as long as a desired thin layer can be formed by the method. For example, a sputtering method, a vacuum deposition method, an ion plating method, and a plasma chemical vapor deposition (CVD) method are suitable, and specifically, the formation methods described in JP3400324B, JP2002-322561 A, and JP2002-361774A can be employed.

A component contained in the thin metal compound layer is not particularly limited as long as the component exhibits the oxygen shielding function, and for example, an oxide, a nitride, an oxynitride, or the like containing one or more kinds of metals selected from Si, Al, In, Sn, Zn, Ti, Cu, Ce, and Ta can be used. Among these, an oxide, a nitride, or an oxynitride of a metal selected from Si, Al, In, Sn, Zn, and Ti is preferable, and an oxide, a nitride, or an oxynitride of a metal selected from Si, Al, Sn, and Ti is particularly preferable. The oxide, the nitride, or the oxynitride may contain other elements as secondary components.

In addition, the oxygen shielding layer may be in a form in which a layer containing the organic material and the thin metal compound layer are laminated, for example, as described in U.S. Pat. No. 6,413,645B, JP2015-226995A, JP2013-202971A, JP2003-335880A, JP1978-012953B (JP-S53-012953B), and JP1983-217344A (JP-S58-217344A), or may be a layer in which an organic compound and an inorganic compound are hybridized, as described in WO2011/011836A, JP2013-248832A, and JP3855004B.

In a case where the optical laminate according to the embodiment of the present invention includes a λ/4 plate described later and the λ/4 plate is a phase difference film in which an optically anisotropic layer having a λ/4 function is provided on a support, the oxygen shielding layer may also serve as an alignment film of the optically anisotropic layer having a λ/4 function. In such a case, an oxygen shielding layer containing polyvinyl alcohol, polyamide, or polyimide is preferable.

In a case of the layer containing the organic compound, a film thickness of the oxygen shielding layer is preferably 0.1 to 10 μm and more preferably 0.5 to 5.5 μm. In a case of the thin metal compound layer, the film thickness of the oxygen shielding layer is preferably 5 nm to 500 nm and more preferably 10 nm to 200 nm.

[Pressure Sensitive Adhesive Layer]

In a case where the optical laminate according to the embodiment of the present invention includes the above-described oxygen shielding layer 2 on the above-described side of the light-absorbing anisotropic layer opposite to the photo-alignment layer, a pressure sensitive adhesive layer may be provided on the side of the above-described oxygen shielding layer 2 opposite to the light-absorbing anisotropic layer side, from the viewpoint of adhering other functional layers (for example, a λ/4 plate described later).

Examples of a pressure sensitive adhesive contained in the pressure sensitive adhesive layer include a rubber-based pressure sensitive adhesive, an acrylic pressure sensitive adhesive, a silicone-based pressure sensitive adhesive, a urethane-based pressure sensitive adhesive, a vinylalkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive.

Among these, from the viewpoint of transparency, weather fastness, and heat resistance, an acrylic pressure sensitive adhesive (pressure-sensitive adhesive) is preferable.

The pressure sensitive adhesive layer can be formed, for example, by a method in which a solution of the pressure sensitive adhesive is applied onto a release sheet and dried and then the resultant is transferred to a surface of a transparent resin layer, a method in which a solution of the pressure sensitive adhesive is directly applied onto a surface of a transparent resin layer and dried; or the like.

For example, the solution of the pressure sensitive adhesive is prepared as a solution of about 10% to 40% by mass in which the pressure sensitive adhesive is dissolved or dispersed in a solvent such as toluene or ethyl acetate.

As a coating method, a roll coating method such as reverse coating and gravure coating, a spin coating method, a screen coating method, a fountain coating method, a dipping method, and a spray method can be employed.

In addition, examples of a constituent material of the release sheet include appropriate thin leaf-like materials, for example, a synthetic resin film such as polyethylene, polypropylene, and polyethylene terephthalate; a rubber sheet; paper; a fabric; a non-woven fabric; a net; a foam sheet and a metal foil.

In the present invention, a thickness of any pressure sensitive adhesive layer is not particularly limited, but is preferably 3 μm to 50 μm, more preferably 4 μm to 40 μm, and still more preferably 5 μm to 30 μm.

[Functional Layer]

A functional layer having a function of reducing short-wavelength light is preferably provided closer to a visibly recognized side than the light-absorbing anisotropic layer. By reducing the short-wavelength light, photodegradation of a coloring agent compound is suppressed, and an optical laminate having excellent light resistance can be provided.

As one aspect, it is preferable that the above-described pressure sensitive adhesive layer or oxygen shielding layer has a function of reducing short-wavelength light.

As another aspect, it is also preferable that a layer having a function of reducing short-wavelength light is newly provided closer to the visibly recognized side than the light-absorbing anisotropic layer.

A method of reducing short-wavelength light is not particularly limited, and examples thereof include a method using light absorption by an absorbent or the like and a method using wavelength selective reflection by a multilayer film.

The above-described short-wavelength light refers to light having a wavelength of 430 nm or less. By reducing the light having a wavelength of 430 nm or less, it is possible to suppress photodegradation of a coloring agent compound by sunlight or light source light used in the light resistance test of JIS B 7751 and JIS B 7754.

Furthermore, in order not to affect performance of a polarizer in visible light, the functional layer is preferably transparent in a wavelength range of 450 nm or more.

[λ/4 Plate]

The optical laminate according to the embodiment of the present invention may include a λ/4 plate on the above-described side of the pressure sensitive adhesive layer opposite to the light-absorbing anisotropic layer or the oxygen shielding layer 2 side.

Here, the "λ/4 plate" is a plate having a λ/4 function, and specifically, is a plate having a function of converting linearly polarized light having a specific wavelength to circularly polarized light (or converting circularly polarized light to linearly polarized light).

Specific examples of the λ/4 plate include the plates described in US2015/0277006A.

Specific examples of an aspect in which the λ/4 plate has a single-layered structure include a stretched polymer film and a phase difference film in which an optically anisotropic layer having a λ/4 function is provided on a support, and specific examples of an aspect in which the λ/4 plate has a double-layered structure include a broadband λ/4 plate obtained by laminating a λ/4 plate and a λ/2 plate.

The phase difference film provided with an optically anisotropic layer having a λ/4 function is more preferably a phase difference film of one or more layers, which contains at least one of liquid crystalline compounds (disk-like liquid crystal compound or rod-like liquid crystal compound) formed by polymerizing liquid crystal monomers developing nematic phase or smectic phase.

Furthermore, as the λ/4 plate having excellent optical performance, a liquid crystalline compound having reverse wavelength dispersibility is still more preferably used. Specifically, a liquid crystalline compound represented by General Formula (II) described in WO2017/043438A is preferably used. Regarding a method for producing a λ/4 plate using the liquid crystalline compound having reverse wavelength dispersibility, reference can be made to Examples 1 to 10 in WO2017/043438A or Example 1 in JP2016-091022A.

[Application]

The optical laminate according to the embodiment of the present invention can be used as a polarizing element (polarizing plate), and specifically, can be used as a linearly polarizing plate or a circularly polarizing plate, for example.

In a case where the optical laminate according to the embodiment of the present invention does not have an optically anisotropic layer such as the λ/4 plate, the optical laminate can be used as a linearly polarizing plate. On the other hand, in a case where the optical laminate according to the embodiment of the present invention has the λ/4 plate, the optical laminate can be used as a circularly polarizing plate.

[Image Display Device]

An image display device according to the embodiment of the present invention includes the above-described optical laminate according to the embodiment of the present invention.

A display element used in the image display device according to the embodiment of the present invention is not particularly limited, and examples thereof include a liquid crystal cell, an organic electroluminescent (hereinafter, abbreviated as "EL") display panel, and a plasma display panel.

Among these, a liquid crystal cell or an organic EL display panel is preferable and a liquid crystal cell is more preferable. That is, as the image display device according to the embodiment of the present invention, a liquid crystal display device using a liquid crystal cell as a display element or an organic EL display device using an organic EL display panel as a display element is preferable, and a liquid crystal display device is more preferable.

[Liquid Crystal Display Device]

The liquid crystal display device which is an example of the image display device according to the embodiment of the present invention is a liquid crystal display device including the above-described optical laminate (provided that the λ/4 plate is not included) according to the embodiment of the present invention and a liquid crystal cell.

Furthermore, in the present invention, among the optical laminates provided on both sides of the liquid crystal cell, it is preferable that the optical laminate according to the embodiment of the present invention is used as a polarizing element on a front side, and more preferable that the optical laminate according to the embodiment of the present invention is used as polarizing elements on the front side and a rear side.

Hereinafter, the liquid crystal cell constituting the liquid crystal display device will be described in detail.

<Liquid Crystal Cell>

The liquid crystal cell used for the liquid crystal display device is preferably in a vertical alignment (VA) mode, an optically compensated bend (OCB) mode, an in-plane-switching (IPS) mode, or a twisted nematic (TN) mode, but is not limited thereto.

In a liquid crystal cell in the TN mode, rod-like liquid crystalline molecules (rod-like liquid crystal compound) are substantially horizontally aligned with no application of a voltage, and twist-aligned by 60° to 120°. The liquid crystal cell in the TN mode is most frequently used as a color TFT liquid crystal display device, and is described in many documents.

In a liquid crystal cell in the VA mode, rod-like liquid crystalline molecules are substantially vertically aligned with no application of a voltage. The liquid crystal cell in the VA mode includes (1) a narrowly-defined liquid crystal cell in the VA mode in which rod-like liquid crystalline molecules are substantially vertically aligned with no application of a voltage, and are substantially horizontally aligned with the application of a voltage (described in JP1990-176625A (JP-H02-176625A)), (2) a liquid crystal cell (in the multi-domain vertical alignment (MVA) mode) in which the VA mode is made into multi-domains in order to expand the viewing angle (described in SID97, Digest of tech. Papers (proceedings) 28 (1997) 845), (3) an liquid crystal cell in a mode (the n-axially symmetric aligned microcell (ASM) mode) in which rod-like liquid crystalline molecules are substantially vertically aligned with no application of a voltage, and are twistedly aligned in multi-domains with the application of a voltage (described in the proceedings 58 and 59 of Japanese Liquid Crystal Conference (1998)), and (4) a liquid crystal cell in the SURVIVAL mode (announced at liquid crystal display (LCD) international 98). In addition, the liquid crystal cell in the VA mode may be any one of a patterned vertical alignment (PVA) type, an optical alignment type, and a polymer-sustained alignment (PSA) type. Details of these modes are described in JP2006-215326A and JP2008-538819A.

In a liquid crystal cell in the IPS mode, rod-like liquid crystalline molecules are substantially aligned in parallel to a substrate, and the liquid crystalline molecules respond in a planar manner with the application of an electric field in parallel to a substrate surface. The IPS mode displays a black image in a case where no electric field is applied thereto, and absorption axes of a pair of upper and lower polarizing plates are orthogonal to each other. A method of improving the viewing angle by reducing light leakage caused in a case where a black image is displayed in an oblique direction using an optical compensation sheet is disclosed in JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A(JP-H10-307291A), and the like.

[Organic EL Display Device]

As an organic EL display device which is an example of the image display device according to the embodiment of the present invention, an aspect in which the above-described optical laminate (provided that the pressure sensitive adhesive layer and the λ/4 plate are included) according to the embodiment of the present invention and an organic EL display panel are provided in this order from the visibly recognized side is suitably exemplified. In a case of the aspect of the configuration A, in the optical laminate, a transparent support which is removed as needed, a transparent oxygen shielding layer, an alignment layer which is provided as needed, a light-absorbing anisotropic layer, a transparent oxygen shielding layer which is provided as needed, a pressure sensitive adhesive layer, and a λ/4 plate are disposed in this order from the visibly recognized side.

On the other hand, in a case of the aspects of the configurations B and C, in the optical laminate, a transparent oxygen shielding layer which is provided as needed, a cured layer which is provided as needed, a light-absorbing anisotropic layer, an alignment layer which is removed as needed, a transparent support which is removed as needed, a pressure sensitive adhesive layer, and a λ/4 plate are disposed in this order from the visibly recognized side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

EXAMPLES

Hereinafter, the present invention will be described in more detail with reference to Examples. The materials, the amounts of materials used, the ratios, the treatment details, the treatment procedure, or the like shown in the following Examples can be appropriately modified without departing from the spirit of the present invention. Therefore, the scope of the present invention will not be restrictively interpreted by the following Examples.

Production Examples 1 to 22

[Preparation of Compositions E1 to E6 for Forming Photo-Alignment Layer]

<Preparation of Composition E1 for Forming Photo-Alignment Layer>

With the following composition, a composition E1 for forming a photo-alignment layer was prepared, dissolved for 1 hour while stirring, and filtered with a filter of 0.45 μm.

Composition E1 for forming photo-alignment layer

| The following photoactive compound E-1 | 0.3 parts by mass |
| 2-Butoxyethanol | 41.6 parts by mass |
| Dipropylene glycol monomethyl ether | 41.6 parts by mass |
| Pure water | 16.5 parts by mass |

Photoactive compound E-1

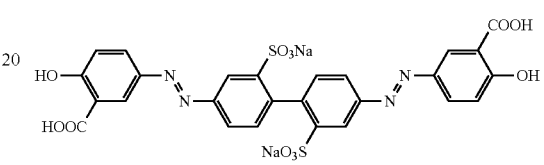

<Preparation of Composition E2 for Forming Photo-Alignment Layer>

A composition E2 for forming a photo-alignment layer was prepared by the same method as for the composition E1 for forming a photo-alignment layer, except that the photoactive compound E-1 was changed to the following photoactive compound E-2.

Photoactive Compound E-2

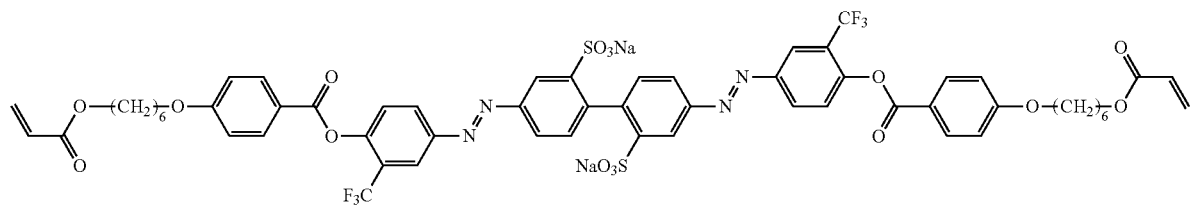

<Preparation of Composition E3 for Forming Photo-Alignment Layer>

With the following composition, a composition E3 for forming a photo-alignment layer was prepared, dissolved for 1 hour while stirring, and filtered with a filter of 0.45 μm.

Composition E3 for forming photo-alignment layer

| The following photoactive compound E-3 | 2.0 parts by mass |
| 1,1,2-Trichloroethane | 98.0 parts by mass |

Photoactive compound E-3 (weight-average molecular weight: 48,000)

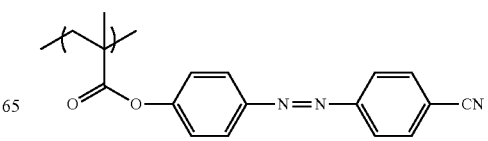

<Preparation of Composition E4 for Forming Photo-Alignment Layer>

With the following composition, a composition E4 for forming a photo-alignment layer was prepared, dissolved for 1 hour while stirring, and filtered with a filter of 0.45 µm. Composition E4 for forming photo-alignment layer

| | |
|---|---|
| The following photoactive compound E-4 | 5.0 parts by mass |
| Cyclopentanone | 98.0 parts by mass |

Photoactive compound E-4 (weight-average molecular weight: 51,000)

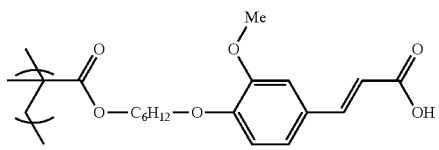

<Preparation of Composition E5 for Forming Photo-Alignment Layer>

With the following composition, a composition E5 for forming a photo-alignment layer was prepared, dissolved for 1 hour while stirring, and filtered with a filter of 0.45 µm. Composition E5 for forming photo-alignment layer

| | |
|---|---|
| The following photoactive compound E-5 | 2.5 parts by mass |
| Tetrahydrofuran | 97.5 parts by mass |

Photoactive compound E-5 (weight-average molecular weight: 28,700)

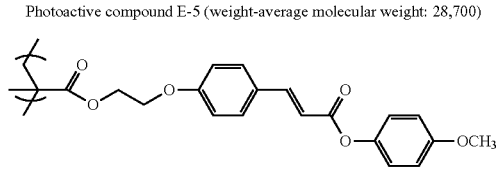

<Preparation of Composition E6 for Forming Photo-Alignment Layer>

(Synthesis of Polymer E-6)

Into a reaction vessel comprising a stirrer, a thermometer, a dripping funnel, and a reflux cooling pipe were introduced 100.0 parts by mass of 2-(3,4-epoxycyclohexyl)ethyltrimethoxysilane, 500 parts by mass of methyl isobutyl ketone, and 10.0 parts by mass of triethylamine, and the mixture was stirred at room temperature. Next, 100 parts by mass of deionized water was added dropwise to the obtained mixture for 30 minutes with the dripping funnel, and then allowed to undergo a reaction at 80° C. for 6 hours while mixing the mixture under reflux. After completion of the reaction, the organic phase was extracted and washed with a 0.2%-by-mass aqueous ammonium nitrate solution until water after the washing became neutral. Thereafter, the solvent and water were distilled off under reduced pressure from the obtained organic phase to obtain a polyorganosiloxane having an epoxy group as a viscous transparent liquid.

The polyorganosiloxane having an epoxy group was subjected to $^1$H-Nuclear Magnetic Resonance (NMR) analysis, and thus, it was confirmed that peaks based on an oxiranyl group around a chemical shift (δ) of 3.2 ppm were obtained as per a theoretical strength, and a side reaction of the epoxy group did not occur during the reaction. A weight-average molecular weight Mw and an epoxy equivalent of the polyorganosiloxane having an epoxy group were 2,200 and 186 g/mol, respectively.

Next, into a 100-mL three-neck flask were introduced 10.1 parts by mass of the polyorganosiloxane having an epoxy group obtained above, 0.5 parts by mass of an acryloyl group-containing carboxylic acid (manufactured by TOAGOSEI CO., LTD., product name "ARONIX M-5300", ω-carboxypolycaprolactone acrylate (a degree of polymerization n=2)), 20 parts by mass of butyl acetate, 1.5 parts by mass of a cinnamic acid derivative obtained by the method of Synthesis Example 1 of JP2015-026050A, and 0.3 parts by mass of tetrabutylammonium bromide, and the obtained mixture was stirred at 90° C. for 12 hours. After stirring, the mixture was diluted with butyl acetate in the same amount (mass) as that of the obtained mixture, and the diluted mixture was washed with water three times. An operation in which the obtained mixture was concentrated and diluted with butyl acetate was repeated twice to finally obtain a solution containing polyorganosiloxane (the following polymer E-6) having a cinnamoyl group. A weight-average molecular weight Mw of the polymer E-6 was 9,000. In addition, as a result of $^1$H-NMR analysis, the amount of the components having a cinnamate group in the polymer E-6 was 23.7% by mass.

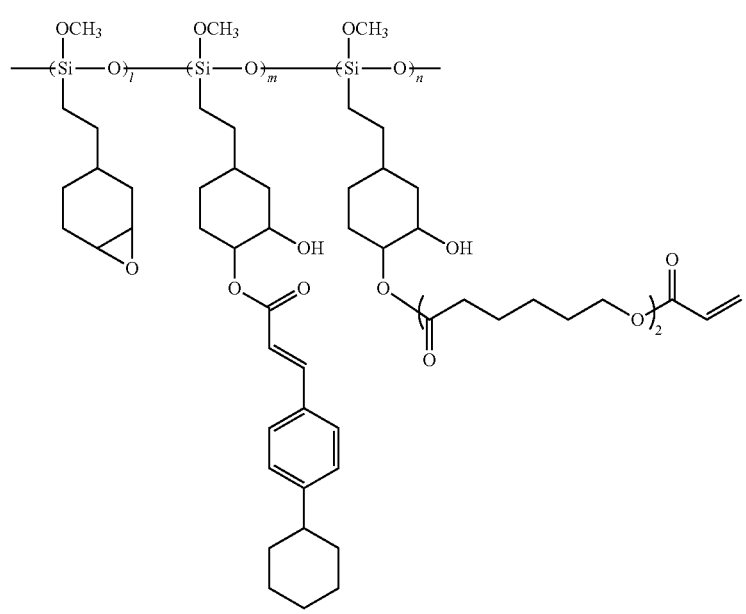

Polymer E-6

(Preparation of Composition E6 for Photo-Alignment Layer)

The following components were mixed to prepare a composition E6 for forming a photo-alignment layer.

| | |
|---|---|
| The above polymer E-6 | 10.67 parts by mass |
| The following low-molecular compound R-1 | 5.17 parts by mass |
| The following additive (B-1) | 0.53 parts by mass |
| Butyl acetate | 8287.37 parts by mass |
| Propylene glycol monomethyl ether acetate | 2071.85 parts by mass |

Low-molecular compound R-1

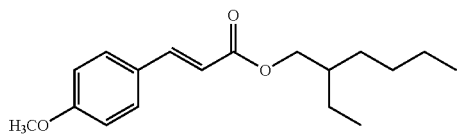

Additive (B-1): TA-60B manufactured by San-Apro Ltd. (refer to the following structural formula)

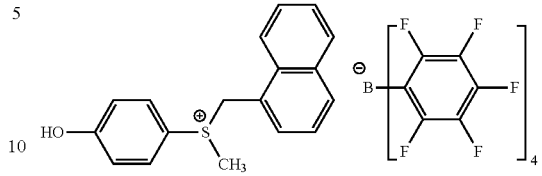

[Preparation of Liquid Crystal Compositions P1 to P16]

<Preparation of Liquid Crystal Composition P1>

With the following composition, a liquid crystal composition P1 was prepared, heated and dissolved at 50° C. for 3 hours while stirring, and filtered with a filter of 0.45 µm.

Liquid crystal composition P1

| | |
|---|---|
| The following dichroic substance D1 | 2.1 parts by mass |
| The following dichroic substance D2 | 9.3 parts by mass |
| The following high-molecular liquid crystalline compound M1 | 72.2 parts by mass |
| Polymerization initiator IRGACURE819 (manufactured by BASF SE) | 0.8 part by mass |
| The following interface modifier F-1 | 0.6 parts by mass |
| Cyclopentanone | 457.5 parts by mass |
| Tetrahydrofuran | 457.5 parts by mass |

Dichroic substance D1

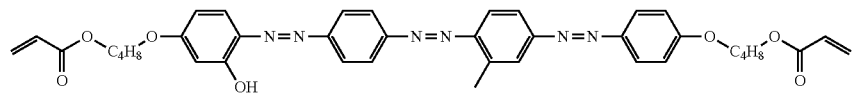

Dichroic substance D2

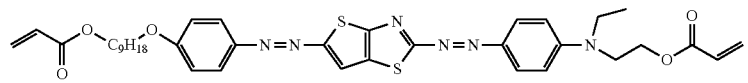

High-molecular liquid crystalline compound M1 (weight-average molecular weight: 16,000)

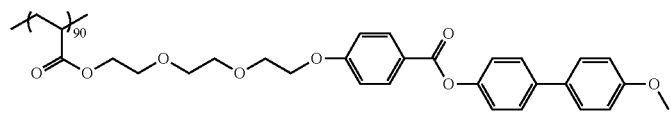

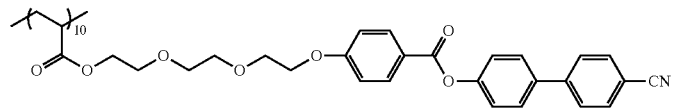

Interface modifier F-1

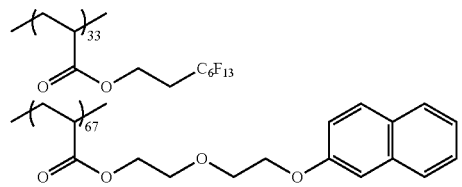

<Preparation of Liquid Crystal Compositions P2 to P14>

With the same manner as for P1, the dichroic substances and the liquid crystalline compounds were changed as shown in Table 1 below to prepare liquid crystal compositions P2 to P14.

TABLE 1

| | \multicolumn{14}{c}{Liquid crystal composition} | | | | | | | | | | | | | |
|---|---|---|---|---|---|---|---|---|---|---|---|---|---|---|
| | P1 | P2 | P3 | P4 | P5 | P6 | P7 | P8 | P9 | P10 | P11 | P12 | P13 | P14 |
| Dichroic substance D1 | 2.1 | 1.0 | 3.7 | 4.8 | 8.4 | — | 2.1 | 3.7 | 4.8 | 2.1 | — | — | — | 2.1 |
| Dichroic substance D2 | 9.3 | 4.4 | 16.2 | 21.0 | 37.0 | — | 9.3 | 16.2 | 21.0 | 9.3 | — | — | — | 9.3 |
| Dichroic substance D3 | — | — | — | — | — | 2.1 | — | — | — | — | — | — | — | — |
| Dichroic substance D4 | — | — | — | — | — | 9.3 | — | — | — | — | — | — | — | — |
| Dichroic substance D5 | — | — | — | — | — | — | — | — | — | — | 2.7 | 8.6 | 2.7 | — |
| Dichroic substance D6 | — | — | — | — | — | — | — | — | — | — | 2.7 | 8.6 | 2.7 | — |
| Dichroic substance D7 | — | — | — | — | — | — | — | — | — | — | 2.7 | 8.6 | 2.7 | — |
| High-molecular liquid crystalline compound M1 | 72.2 | 78.2 | 63.8 | 57.8 | 38.3 | — | — | — | — | — | 75.5 | 57.8 | — | — |
| High-molecular liquid crystalline compound M2 | — | — | — | — | — | 72.2 | — | — | — | — | — | — | — | — |
| High-molecular liquid crystalline compound M3 | — | — | — | — | — | — | 72.2 | 63.8 | 57.8 | — | — | — | — | — |
| Liquid crystalline compound M4 | — | — | — | — | — | — | — | — | — | — | — | — | 75.5 | 72.2 |

The structures of the dichroic substance D3 and the like in Table 1 are shown below.

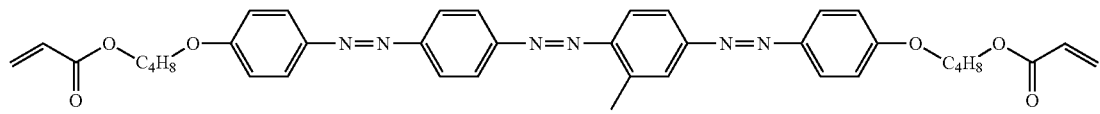

Dichroic substance D3

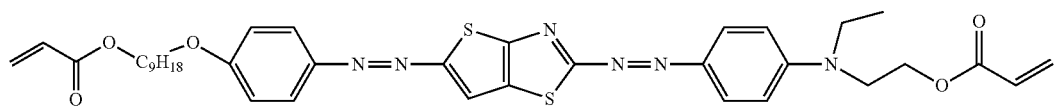

Dichroic substance D4

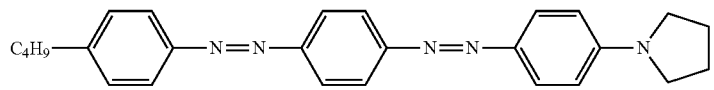

Dichroic substance D5

Dichroic substance D6

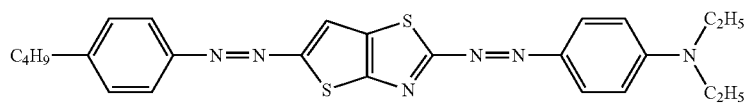

Dichroic substance D7

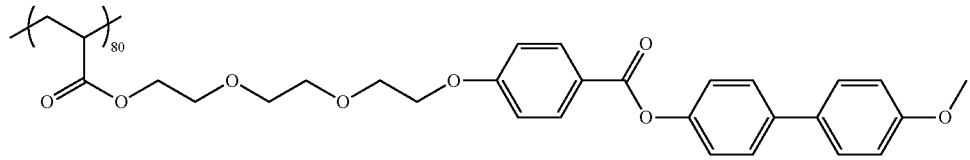

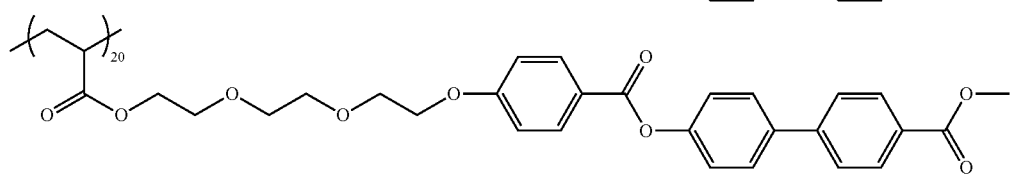

High-molecular liquid crystalline compound M2 (average molecular weight: 15,000)

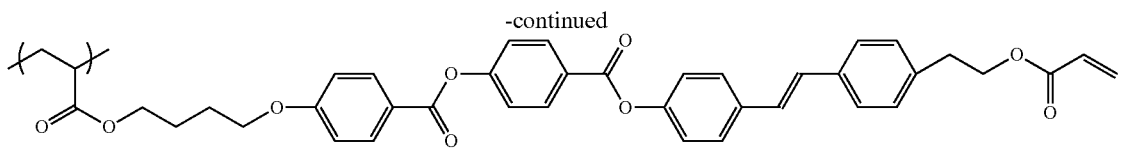

High-molecular liquid crystalline compound M3 (average molecular weight: 18,000)

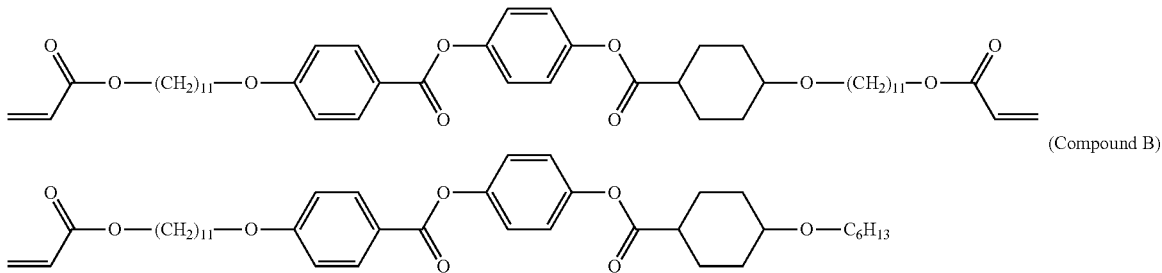

Liquid crystalline compound M4 (mixing so that compound A/compound B was 75/25)

<Preparation of Liquid Crystal Composition P15>

With the following composition, a liquid crystal composition P15 was prepared, heated and dissolved at 80° C. for 2 hours while stirring, and filtered with a filter of 0.45 μm.

Liquid Crystal Composition P15

| | |
|---|---|
| The above dichroic substance D5 | 2.7 parts by mass |
| The above dichroic substance D6 | 2.7 parts by mass |
| The above dichroic substance D7 | 2.7 parts by mass |
| The above high-molecular liquid crystalline compound M1 | 73.0 parts by mass |
| Polymerization initiator IRGACURE369 (manufactured by BASF SE) | 3.0 part by mass |
| BYK361N (manufactured by BYK Japan KK) | 0.9 parts by mass |
| Cyclopentanone | 925.0 parts by mass |

<Preparation of Liquid Crystal Composition P16>

With the following composition, a liquid crystal composition P16 was prepared, heated and dissolved at 80° C. for 2 hours while stirring, and filtered with a filter of 0.45 μm.

Liquid Crystal Composition P16

| | |
|---|---|
| The above dichroic substance D5 | 2.7 parts by mass |
| The above dichroic substance D6 | 2.7 parts by mass |
| The above dichroic substance D7 | 2.7 parts by mass |
| The above liquid crystalline compound M4 | 73.0 parts by mass |
| Polymerization initiator IRGACURE369 (manufactured by BASF SE) | 3.0 part by mass |
| BYK361N (manufactured by BYK Japan KK) | 0.9 parts by mass |
| Cyclopentanone | 925.0 parts by mass |

[Production of Optical Laminate 1 of Production Example 1]

<Production of Photo-Alignment Layer>

The above-described composition E1 for forming a photo-alignment layer was applied onto a polyethylene terephthalate film (COSMOSHINE, manufactured by TOYOBO Co., LTD.) and dried at 60° C. for 2 minutes.

Thereafter, the obtained coating film was irradiated with linearly polarized ultraviolet rays (an illuminance of 4.5 mW, an irradiation amount of 500 mJ/cm$^2$) using a polarized ultraviolet exposure device to produce a photo-alignment layer 1 having a thickness of 0.03 μm.

<Formation of Light-Absorbing Anisotropic Layer>

The above-described liquid crystal composition P1 was applied onto the obtained photo-alignment layer 1 with a wire bar.

Next, the layer was heated at 140° C. for 90 seconds and cooled to room temperature (23° C.).

Subsequently, the layer was heated at 80° C. for 60 seconds and cooled again to room temperature.

Thereafter, by irradiating the layer with light for 60 seconds under an irradiation condition of an illuminance of 28 mW/cm$^2$, using a high-pressure mercury lamp, a light-absorbing anisotropic layer having a thickness of 0.6 μm was formed, whereby an optical laminate 1 of Production Example 1 could be produced. The degree of alignment measured by the following method was 0.95, and the front transmittance was 60% or less.

[Production of Optical Laminates 2 to 25 of Production Examples 2 to 25]

Optical laminates 2 to 25 of Production Examples 2 to 25 were prepared by the same method as for the optical laminate 1 of Production Example 1, except that the compositions for forming a photo-alignment layer and the liquid crystal compositions were changed as shown in Table 2 below.

Provided that application amounts of the compositions were adjusted so that application amounts of the dichroic substances were the same as that in Production Example 1.

In addition, the application amounts of the compositions were adjusted so that the thickness of the photo-alignment layer was 0.03 μm in a case of E1 and E2, was 0.1 μm in a case of E3 and E4, was 0.2 μm in a case of E5, and was 0.3 μm in a case of E6.

Furthermore, front transmittances of the produced optical laminates 2 to 25 were all 60% or less.

<Evaluation of Alignment Defect>

In a case of producing the optical laminate, after a surface of the photo-alignment layer was subjected to roll transport by applying surface pressure of 100 N/300 mm so as to touch a coated surface, a light-absorbing anisotropic layer was formed, whereby a laminate for evaluation of an alignment defect was produced.

The touched portion of the coated surface was placed on a schaukasten while overlapping a polarizer, the presence or absence of alignment defects was visually observed, and evaluation was performed based on the following standards. The results are shown in Table 2 below.

(Defect Evaluation Standard)
A: No alignment defects are visible at all
B: Alignment defects are slightly visible, but there is no practical problem
C: Alignment defects are visible and problematic applying surface pressure of 200 N/300 mm so as to touch a coated surface, a light-absorbing anisotropic layer was formed, whereby a laminate for compulsory evaluation of an alignment defect was produced.

The touched portion of the coated surface was placed on a schaukasten while overlapping a polarizer, the presence or absence of alignment defects was visually observed, and evaluation was performed based on the following standards. The results are shown in Table 3 below.

TABLE 2

| | Photo-alignment layer | | | Light-absorbing anisotropic layer | | | | | | Evaluation result | |
| --- | --- | --- | --- | --- | --- | --- | --- | --- | --- | --- | --- |
| | | | | | Dichroic substance | | | Liquid crystalline compound | | | |
| | Composition | Photoactive compound | Composition | Kind | | | Solid content proportion (% by mass) | Kind | Type | Solid content proportion (% by mass) | Alignment defect | Note |
| Production Example 1 | E1 | E-1 | P1 | D1 | D2 | — | 13.4 | M1 | High-molecular | 84.9 | A | Example |
| Production Example 2 | E1 | E-1 | P2 | D1 | D2 | — | 6.4 | M1 | High-molecular | 92.0 | A | Example |
| Production Example 3 | E1 | E-1 | P3 | D1 | D2 | — | 23.4 | M1 | High-molecular | 75.0 | A | Example |
| Production Example 4 | E1 | E-1 | P4 | D1 | D2 | — | 30.4 | M1 | High-molecular | 68.0 | A | Example |
| Production Example 5 | E1 | E-1 | P5 | D1 | D2 | — | 53.3 | M1 | High-molecular | 45.0 | B | Example |
| Production Example 6 | E2 | E-2 | P1 | D1 | D2 | — | 13.4 | M1 | High-molecular | 84.9 | A | Example |
| Production Example 7 | E3 | E-3 | P1 | D1 | D2 | — | 13.4 | M1 | High-molecular | 84.9 | A | Example |
| Production Example 8 | E1 | E-1 | P6 | D3 | D4 | — | 13.4 | M2 | High-molecular | 84.9 | A | Example |
| Production Example 9 | E1 | E-1 | P7 | D1 | D2 | — | 13.4 | M3 | High-molecular | 84.9 | A | Example |
| Production Example 10 | E1 | E-1 | P8 | D1 | D2 | — | 23.4 | M3 | High-molecular | 75.0 | A | Example |
| Production Example 11 | E1 | E-1 | P9 | D1 | D2 | — | 30.4 | M3 | High-molecular | 68.0 | B | Example |
| Production Example 12 | E1 | E-1 | P10 | D1 | D2 | — | 89.1 | — | — | 0.0 | C | Comparative Example |
| Production Example 13 | E1 | E-1 | P11 | D5 | D6 | D7 | 9.5 | M1 | High-molecular | 88.8 | A | Example |
| Production Example 14 | E1 | E-1 | P12 | D5 | D6 | D7 | 30.4 | M1 | High-molecular | 68.0 | A | Example |
| Production Example 15 | E3 | E-3 | P11 | D5 | D6 | D7 | 9.5 | M1 | High-molecular | 88.8 | A | Example |
| Production Example 16 | E1 | E-1 | P13 | D5 | D6 | D7 | 9.5 | M4 | Low-molecular | 88.8 | C | Comparative Example |
| Production Example 17 | E3 | E-3 | P13 | D5 | D6 | D7 | 9.5 | M4 | Low-molecular | 88.8 | C | Comparative Example |
| Production Example 18 | E1 | E-1 | P14 | D1 | D2 | — | 13.4 | M4 | Low-molecular | 84.9 | C | Comparative Example |
| Production Example 19 | E2 | E-2 | P14 | D1 | D2 | — | 13.4 | M4 | Low-molecular | 84.9 | C | Comparative Example |
| Production Example 20 | E4 | E-4 | P15 | D5 | D6 | D7 | 9.5 | M1 | High-molecular | 85.9 | A | Example |
| Production Example 21 | E5 | E-5 | P15 | D5 | D6 | D7 | 9.5 | M1 | High-molecular | 85.9 | A | Example |
| Production Example 22 | E6 | E-6 | P15 | D5 | D6 | D7 | 9.5 | M1 | High-molecular | 85.9 | A | Example |
| Production Example 23 | E4 | E-4 | P16 | D5 | D6 | D7 | 9.5 | M4 | Low-molecular | 85.9 | C | Comparative Example |
| Production Example 24 | E5 | E-5 | P16 | D5 | D6 | D7 | 9.5 | M4 | Low-molecular | 85.9 | C | Comparative Example |
| Production Example 25 | E6 | E-6 | P16 | D5 | D6 | D7 | 9.5 | M4 | Low-molecular | 85.9 | C | Comparative Example |

From the results shown in Table 2, it was found that in a case where the liquid crystal composition obtained by formulating the high-molecular liquid crystalline compound together with the dichroic substance was used for forming the light-absorbing anisotropic layer, the alignment defects were unlikely to occur in the light-absorbing anisotropic layer despite rubbing the surface of the photo-alignment layer.

<Compulsory Evaluation of Alignment Defect>

In a case of producing each of the optical laminates of Production Examples 13 and 20 to 22, after a surface of the photo-alignment layer was subjected to roll transport by (Defect Evaluation Standard)
AAA: No alignment defects are visible even in a case where the coated surface is touched with either surface pressure of 200 N/300 mm or surface pressure of 100 N/300 mm
AA: Alignment defects are slightly visible in a case where the coated surface is touched with surface pressure of 200 N/300 mm, and no alignment defects are visible in a case where the coated surface is touched with surface pressure of 100 N/300 mm
A: Alignment defects are visible in a case where the coated surface is touched with surface pressure of 200 N/300 mm, but no alignment defects are visible in a case where the coated surface is touched with any surface pressure of surface pressure of 100 N/300 mm

TABLE 3

| | Photo-alignment layer | | Light-absorbing anisotropic layer | | | | | | | Compulsory evaluation | |
|---|---|---|---|---|---|---|---|---|---|---|---|
| | | | | Dichroic substance | | | Liquid crystalline compound | | | | |
| | Composition | Photoactive compound | Composition | Kind | | | Solid content proportion (% by mass) | Kind | Type | Solid content proportion (% by mass) | Alignment detect | Note |
| Production Example 13 | E1 | E-1 | P11 | D5 | D6 | D7 | 9.5 | M1 | High-molecular | 88.8 | A | Example |
| Production Example 20 | E4 | E-4 | P15 | D5 | D6 | D7 | 9.5 | M1 | High-molecular | 85.9 | AA | Example |
| Production Example 21 | E5 | E-5 | P15 | D5 | D6 | D7 | 9.5 | M1 | High-molecular | 85.9 | AA | Example |
| Production Example 22 | E6 | E-6 | P15 | D5 | D6 | D7 | 9.5 | M1 | High-molecular | 85.9 | AAA | Example |

From the results shown in Table 3, in a comparison of Production Example 13 and Production Examples 20 and 21, it was found that the alignment defects were less likely to occur in the photo-alignment layer formed of the photoactive compound having a cinnamate group than in the photo-alignment layer formed of the photoactive compound having an azobenzene group.

Furthermore, in a comparison of Production Examples 20 and 21 and Production Example 22, it was found that the alignment defects were far less likely to occur in the photo-alignment layer formed of the photo-alignment copolymer which has the repeating unit A containing a cinnamoyl group and the repeating unit B containing a crosslinkable group as a photoactive compound.

Production Examples 26 to 32

The optical laminate produced in the same manner as in Production Examples 1, 2, 3, 8, 13, 20, and 22 was placed in a vacuum film deposition apparatus, an oxygen shielding layer having a thickness of 20 nm and consisting of silicon oxide represented by SiOxCy was formed on the surface of the light-absorbing anisotropic layer by a plasma CVD method under the following conditions, and thus laminates 26 to 32 in which the oxygen shielding layer was formed on the light-absorbing anisotropic layer were produced.

Used gas: mixed gas of 5 sccm of hexamethyldisiloxane (HMDSO)/50 sccm of oxygen

Applied frequency: 13.56 MHz

Applied electric power: 0.5 kW

<Evaluation of Light Resistance>

Xenon light was radiated at 150 W/m$^2$ (300 to 400 nm) for 300 hours from each support side of the produced laminates 26 to 32 with a SUPER XENON WEATHER METER "SX-75" (manufactured by Suga Test Instruments Co., Ltd., condition of 60° C. and 50% RH). After a lapse of a predetermined time, a change in the degree of alignment of the laminate was measured. In the laminates which were produced in Production Examples 26 to 32 and in which the oxygen shielding layer was formed on the light-absorbing anisotropic layer, a decrease in the degree of alignment was suppressed as compared with laminates produced in Production Examples 1 to 25.

Production Examples 33 to 39

[Production of λ/4 Phase Difference Film 1]

<Preparation of Coating Liquid 1 for Optically Anisotropic Layer>

A coating liquid 1 for an optically anisotropic layer having the following composition was prepared.

Coating liquid 1 for optically anisotropic layer

| | |
|---|---|
| The following liquid crystalline compound L-3 | 42.00 parts by mass |
| The following liquid crystalline compound L-4 | 42.00 parts by mass |
| The following polymerizable compound A-1 | 16.00 parts by mass |
| The following low-molecular compound B-2 | 6.00 parts by mass |
| The following polymerization initiator S-1 (oxime-type) | 0.50 parts by mass |
| The following leveling agent G-1 | 0.20 parts by mass |
| HISOLVE MTEM (manufactured by TOHO Chemical Industry Co., Ltd.) | 2.00 parts by mass |
| NK ESTER A-200 (manufactured by Shin-Nakamura Chemical Co., Ltd.) | 1.00 part by mass |
| Methyl ethyl ketone | 424.8 parts by mass |

In addition, a group adjacent to the acryloyloxy group of each of the following liquid crystalline compounds L-3 and L4 represents a propylene group (a group in which is a methyl group is substituted with an ethylene group), and the following liquid crystalline compounds L-3 and L4 represent a mixture of regioisomers having different positions of the methyl groups.

L-3

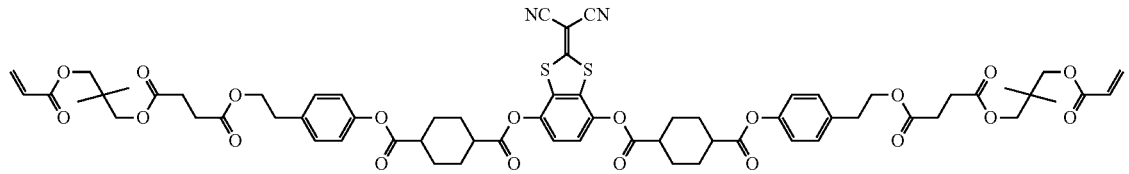

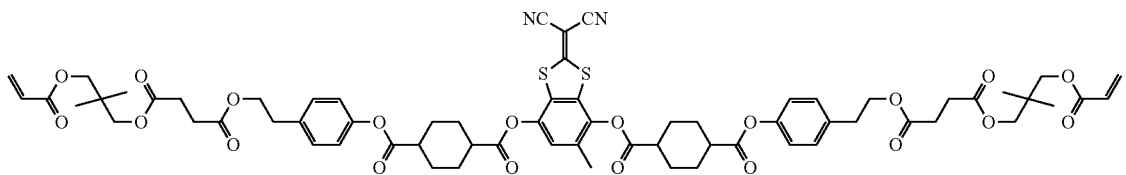

L-4

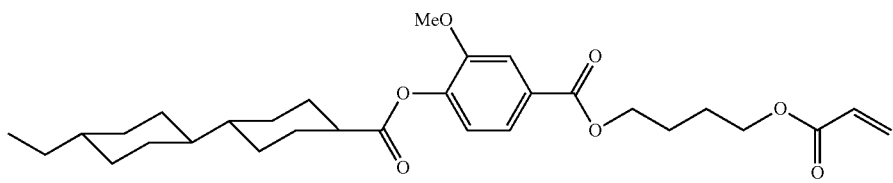

A-1

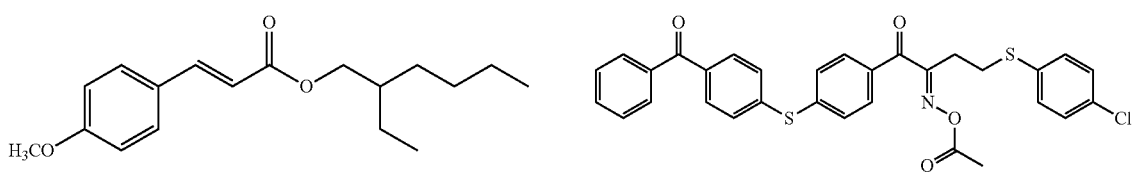

B-2

S-1

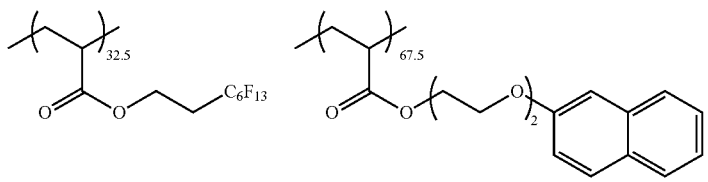

G-1

<Preparation of Coating Liquid 2 for Optically Anisotropic Layer>

A coating liquid 2 for an optically anisotropic layer having the following composition was prepared.

Coating liquid 2 for optically anisotropic layer

| | |
|---|---|
| The following liquid crystalline compound L-5 | 24.0 parts by mass |
| The following liquid crystalline compound L-6 | 6.0 parts by mass |
| Polymerization initiator IRGACURE369 (manufactured by BASF Japan Ltd.) | 1.0 part by mass |
| Polymerization initiator OXE-03 (manufactured by BASF Japan Ltd.) | 0.9 parts by mass |
| Polymerization initiator ADEKA ARKLS NCI-831 (manufactured by ADEKA CORPORATION) | 0.9 parts by mass |
| BYK361N (manufactured by BYK Japan KK) | 0.2 parts by mass |
| N-Methyl-2-pyrrolidone | 25.0 parts by mass |
| Cyclopentanone | 42.0 parts by mass |

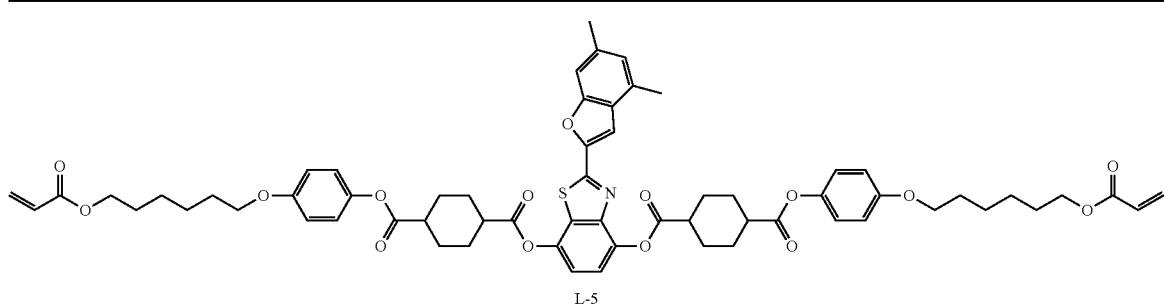

L-5

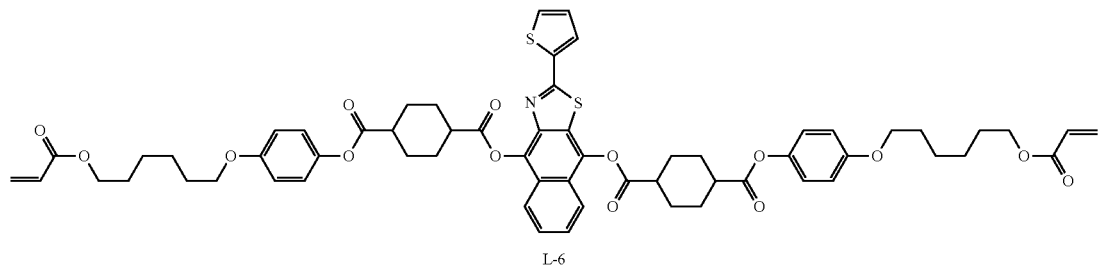 [SMILES: C=CC(=O)OCCCCCCOc1ccc(OC(=O)C2CCC(C(=O)Oc3c4ccccc4c(OC(=O)C4CCC(C(=O)Oc5ccc(OCCCCCCOC(=O)C=C)cc5)CC4)c4sc(-c5cccs5)nc34)CC2)cc1]

L-6

<Production of Cellulose Acylate Film 1>
(Production of Core Layer Cellulose Acylate Dope)

The following composition was introduced into a mixing tank and stirred to dissolve the respective components, thereby preparing a cellulose acetate solution for use as a core layer cellulose acylate dope.

Core Layer Cellulose Acylate Dope

| | |
|---|---|
| Cellulose acetate having degree of acetyl substitution of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

Compound F

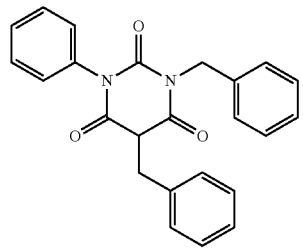

(Production of Outer Layer Cellulose Acylate Dope)

To 90 parts by mass of the core layer cellulose acylate dope was added 10 parts by mass of the following matting agent solution to prepare a cellulose acetate solution for use as an outer layer cellulose acylate dope.

Matting Agent Solution

| | |
|---|---|
| Silica particle having average particle size of 20 nm (AEROSIL R972, manufactured by NIPPON AEROSIL CO., LTD.) | 2 parts by mass |
| Methylene chloride (first solvent) | 76 parts by mass |
| Methanol (second solvent) | 11 parts by mass |
| The above core layer cellulose acylate dope | 1 part by mass |

(Production of Cellulose Acylate Film 1)

The core layer cellulose acylate dope and the outer layer cellulose acylate dope were filtered through filter paper having an average pore diameter of 34 μm and a sintered metal filter having an average pore diameter of 10 μm, and then three layers of the core layer cellulose acylate dope and the outer layer cellulose acylate dopes on both sides thereof were cast on a drum at 20° C. from casting ports at the same time (band casting machine).

Subsequently, the film was peeled in the state where the solvent content reached approximately 20% by mass, the both terminals of the film in the width direction were fixed with tenter clips, and the film was dried while being stretched at a stretching ratio of 1.1 times in the cross direction.

Thereafter, the film was transported between rolls in a heat treatment device and further dried to produce an optical film having a thickness of 40 μm, which was used as a cellulose acylate film 1. An in-plane retardation of the obtained cellulose acylate film 1 was 0 nm.

<Production of λ/4 Phase Difference Film 1>

The composition E6 for forming a photo-alignment layer prepared in advance was applied onto a surface on one side of the produced cellulose acylate film 1 with a bar coater.

After the application, the film was dried on a hot plate at 120° C. for 1 minute to remove the solvent, thereby forming a photoisomerization composition layer having a thickness of 0.3 μm.

The obtained photoisomerization composition layer was irradiated with polarized ultraviolet rays (10 mJ/cm$^2$, using an ultra-high-pressure mercury lamp) to form a photo-alignment layer.

Subsequently, the coating liquid for an optically anisotropic layer prepared in advance was applied onto the photo-alignment layer with a bar coater to form a composition layer.

The formed composition layer was first heated on a hot plate to 110° C. and then cooled to 60° C. to stabilize the alignment.

Thereafter, while keeping the temperature at 60° C., the alignment was fixed by irradiation with ultraviolet rays (500 mJ/cm$^2$, using an ultra-high-pressure mercury lamp) under a nitrogen atmosphere (an oxygen concentration of 100 ppm) to form an optically anisotropic layer having a thickness of 2.3 μm, whereby a λ/4 phase difference film 1 was produced. An in-plane retardation of the obtained optical laminate was 140 nm.

[Production of λ/4 Phase Difference Film 2]

The composition E4 for forming a photo-alignment layer prepared in advance was applied onto a surface on one side of the produced cellulose acylate film 1 with a bar coater.

After the application, the film was dried on a hot plate at 80° C. for 1 minute to remove the solvent, thereby forming a photoisomerization composition layer having a thickness of 0.3 μm.

The obtained photoisomerization composition layer was irradiated with polarized ultraviolet rays (90 mJ/cm$^2$, using an ultra-high-pressure mercury lamp) to form a photo-alignment layer.

Subsequently, the coating liquid 2 for an optically anisotropic layer prepared in advance was applied onto the photo-alignment layer with a bar coater to form a composition layer.

The formed composition layer was first heated on a hot plate to 120° C. and then cooled to 60° C. to stabilize the alignment.

Thereafter, while keeping the temperature at 60° C., the alignment was fixed by irradiation with ultraviolet rays (800 mJ/cm$^2$, using an ultra-high-pressure mercury lamp) under a nitrogen atmosphere (an oxygen concentration of 100 ppm) to form an optically anisotropic layer having a thickness of 2.3 μm, whereby a λ/4 phase difference film 2 was produced. An in-plane retardation of the obtained λ/4 phase difference film 2 was 143 nm.

[Production of Positive C-Plate Film 1]

A commercially available triacetyl cellulose film "Z-TAC" (manufactured by FUJIFILM Corporation) was used as a temporary support (the film was referred to as a cellulose acylate film 2). The cellulose acylate film 2 was allowed to pass through a dielectric heating roll at a temperature of 60° C., the film surface temperature was elevated up to 40° C., then an alkali solution having the composition shown below was applied onto one surface of the film at an application amount of 14 ml/m2 using a bar coater, and the film was transported for 10 seconds under a steam-type far infrared heater manufactured by NORITAKE CO., LIMITED while heating at 110° C.

Next, pure water was applied at 3 ml/m2 using the same bar coater.

Subsequently, water-washing using a fountain coater and drainage using an air knife were repeated three times, and then, the film was transported to a drying zone at 70° C. for 10 seconds for drying to produce a cellulose acylate film 2 which had been subjected to an alkali saponification treatment.

Composition (Parts by Mass) of Alkali Solution

| | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_2O)_{20}H$) | 1.0 part by mass |
| Propylene glycol | 14.8 parts by mass |

A coating liquid for forming an alignment layer having the following composition was continuously applied with a wire bar of #8, using the cellulose acylate film 2 which had been subjected to an alkali saponification treatment. The resultant was dried with hot air at 60° C. for 60 seconds and further dried with hot air at 100° C. for 120 seconds to form an alignment layer.

Composition of Coating Liquid for Forming Alignment Layer

| | |
|---|---|
| Polyvinyl alcohol (manufactured by KURARAY CO., LTD., PVA 103) | 2.4 parts by mass |
| Isopropyl alcohol | 1.6 parts by mass |
| Methanol | 36 parts by mass |
| Water | 60 parts by mass |

The following coating liquid N was applied onto the cellulose acylate film 2 having the alignment layer produced above, aged at 60° C. for 60 seconds, and then irradiated with ultraviolet rays at 1000 mJ/cm$^2$ in air using an air-cooled metal halide lamp (manufactured by EYE GRAPHICS Co., Ltd.) at 70 mW/cm$^2$, and the alignment state was fixed to vertically align a rod-like polymerizable liquid crystal compound, thereby producing a positive C-plate film 1. The Rth at a wavelength of 550 nm was −60 nm.

Composition of Coating Liquid N for Optically Anisotropic Layer

| | |
|---|---|
| The following liquid crystalline compound L-1 | 80 parts by mass |
| The following liquid crystalline compound L-2 | 20 parts by mass |
| The following vertical alignment agent (S01) for liquid crystalline compound | 1 part by mass |
| Ethylene oxide-modified trimethylol propane triacrylate (V#360, manufactured by OSAKA ORGANIC CHEMICAL INDUSTRY LTD.) | 8 parts by mass |
| IRGACURE907 (manufactured by BASF SE) | 3 parts by mass |
| KAYACURE DETX (manufactured by Nippon Kayaku Co., Ltd.) | 1 part by mass |
| The following compound B03 | 0.4 parts by mass |
| Methyl ethyl ketone | 170 parts by mass |
| Cyclohexanone | 30 parts by mass |

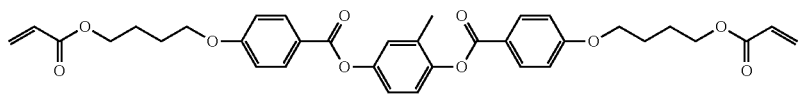

L-1

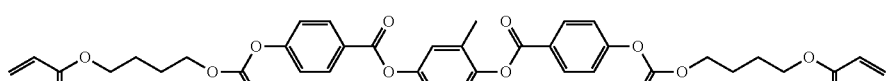

L-2

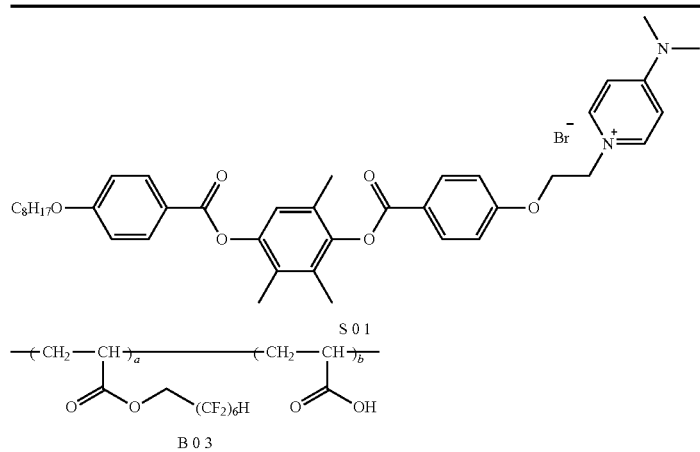

<Production of Circularly Polarizing Plate>

The side of the optically anisotropic layer of the positive C-plate film 2 produced above was adhered to the side of the optically anisotropic layer of the λ/4 phase difference film 1 through a pressure sensitive adhesive, and the cellulose acylate film 2 and the alignment layer were removed.

Moreover, each of the optical laminates 26 to 32 produced in Production Examples 26 to 32 was adhered to the side of the λ/4 phase difference film through a pressure sensitive adhesive to obtain a circularly polarizing plate. A very thin circularly polarizing plate (about 50 μm) was obtained as compared with a normal circularly polarizing plate (about 110 μm).

GALAXY S5 manufactured by SAMSUNG, having an organic EL panel (organic EL display element) installed therein, was disassembled, the touch panel with a circularly polarizing plate was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, and the circularly polarizing plate produced above was adhered to the touch panel so that the positive C-plate film side was the panel side, thereby producing an organic EL display device.

With regard to the produced organic EL display device, the same evaluation as in a case of using PURE-ACE WR (manufactured by TEIJIN LIMITED) as a λ/4 plate was performed, and thus, it was confirmed that the same effect was exhibited even in a case of using the optical laminate of the λ/4 phase difference film 1 and the positive C-plate film 2 as a λ/4 plate.

Production Examples 40 to 48

[Preparation of Compositions E7 to E12 for Forming Photo-Alignment Layer]

<Preparation of Composition E7 for Forming Photo-Alignment Layer>

The following components were mixed to prepare a composition E7 for forming a photo-alignment layer.

| | |
|---|---|
| The following polymer E-7 | 100.00 parts by mass |
| The following acid generator SAN-AID SI-B2A | 5.00 parts by mass |
| The following acid generator CPI-110TF | 0.005 parts by mass |
| Xylene | 700.00 parts by mass |
| Methyl isobutyl ketone | 70.00 parts by mass |

Polymer E-7

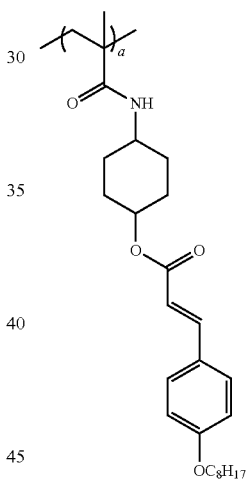

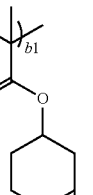

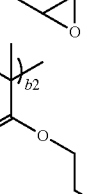

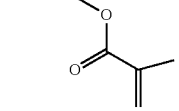

In the above formulae, the mass ratios of a, b1, and b2 in the polymers E-7 to E-12 are shown below.

E-7: a/b1/b2=8/77/15

E-8: a/b1/b2=12/88/0

E-9: a/b1/b2=8/84/8

E-10: a/b1/b2=8/70/22

E-11: a/b1/b2=8/62/30

E-12: a/b1/b2=8/42/50

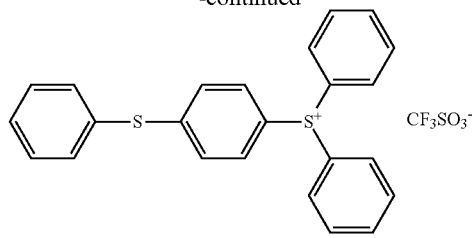

Acid generator CPI-110TF

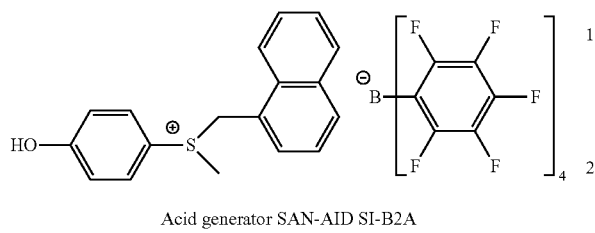

Acid generator SAN-AID SI-B2A

<Preparation of Compositions E8 to E12 for Forming Photo-Alignment Layer>

Compositions E8 to E12 for forming a photo-alignment layer were prepared by the same method as for the composition E7 for forming a photo-alignment layer, except that the polymer E-7 was changed to polymers E-8 to E-12.

[Preparation of Liquid Crystal Compositions P17 to P20]

<Preparation of Liquid Crystal Composition P17>

With the following composition, a liquid crystal composition P17 was prepared, heated and dissolved at 50° C. for 3 hours while stirring, and filtered with a filter of 0.45 μm.

Composition of Liquid Crystal Composition P17

| | |
|---|---|
| The above dichroic substance D3 | 0.36 parts by mass |
| The above dichroic substance D4 | 0.53 parts by mass |
| The following dichroic substance D8 | 0.31 parts by mass |
| The following high-molecular liquid crystalline compound M5 | 3.59 parts by mass |
| Polymerization Initiator IRGACURE OXE-02 (manufactured by BASF SE) | 0.050 parts by mass |
| The following interface modifier F-2 | 0.025 parts by mass |
| Cyclopentanone | 47.50 parts by mass |
| Tetrahydrofuran | 47.50 parts by mass |

D-8

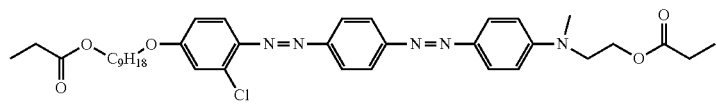

M5 (weight-average molecular weight: 18,000)

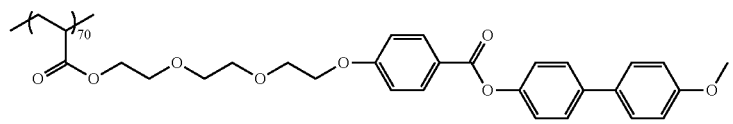

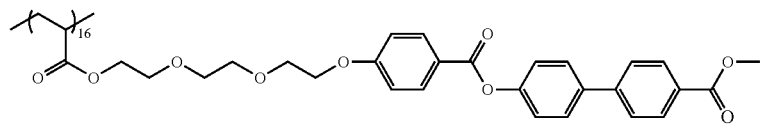

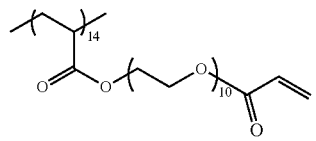

F-2

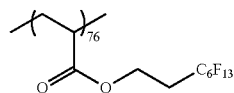

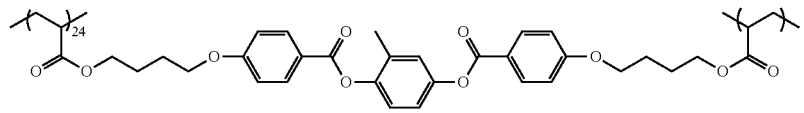

<Preparation of Liquid Crystal Composition P18>

With the following composition, a liquid crystal composition P18 was prepared, heated and dissolved at 50° C. for 3 hours while stirring, and filtered with a filter of 0.45 μm. Composition of Liquid Crystal Composition P18

| | |
|---|---|
| The above dichroic substance D3 | 0.36 parts by mass |
| The above dichroic substance D4 | 0.53 parts by mass |
| The above dichroic substance D8 | 0.31 parts by mass |
| The above high-molecular liquid crystalline compound M5 | 3.23 parts by mass |
| The following liquid crystalline compound M6 | 0.36 parts by mass |
| Polymerization Initiator IRGACURE OXE-02 (manufactured by BASF SE) | 0.050 parts by mass |
| The above interface modifier F-2 | 0.025 parts by mass |
| Cyclopentanone | 47.50 parts by mass |
| Tetrahydrofuran | 47.50 parts by mass |

Liquid crystalline compound M6

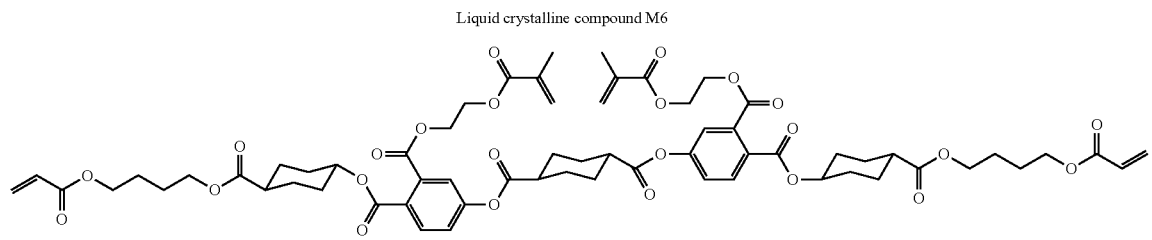 [SMILES: C=CC(=O)OCCCCOC(=O)C1CCC(OC(=O)c2ccc(OC(=O)C3CCC(C(=O)Oc4ccc(C(=O)OC5CCC(C(=O)OCCCCOC(=O)C=C)CC5)c(C(=O)OCCOC(=O)C(=C)C)c4)CC3)cc2C(=O)OCCOC(=O)C(=C)C)CC1]

<Preparation of Liquid Crystal Composition P19>

With the following composition, a liquid crystal composition P19 was prepared, heated and dissolved at 50° C. for 3 hours while stirring, and filtered with a filter of 0.45 μm. Composition of Liquid Crystal Composition P19

| | |
|---|---|
| The above dichroic substance D3 | 0.36 parts by mass |
| The above dichroic substance D4 | 0.53 parts by mass |
| The above dichroic substance D8 | 0.31 parts by mass |
| The above high-molecular liquid crystalline compound M2 | 3.59 parts by mass |
| Polymerization Initiator IRGACURE OXE-02 (manufactured by BASF SE) | 0.050 parts by mass |
| The above interface modifier F-2 | 0.025 parts by mass |
| Cyclopentanone | 47.50 parts by mass |
| Tetrahydrofuran | 47.50 parts by mass |

<Preparation of Liquid Crystal Composition P20>

With the following composition, a liquid crystal composition P20 was prepared, heated and dissolved at 50° C. for 3 hours while stirring, and filtered with a filter of 0.45 μm. Composition of Liquid Crystal Composition P20

| | |
|---|---|
| The above dichroic substance D3 | 0.36 parts by mass |
| The above dichroic substance D4 | 0.53 parts by mass |
| The above dichroic substance D8 | 0.31 parts by mass |
| The above high-molecular liquid crystalline compound M5 | 3.58 parts by mass |
| Poly(ethylene oxide) (average molecular weight of up to 8,000,000: manufactured by Sigma-Aldrich Co. LLC.) | 0.01 parts by mass |
| Polymerization Initiator IRGACURE OXE-02 (manufactured by BASF SE) | 0.050 parts by mass |
| The above interface modifier F-2 | 0.025 parts by mass |
| Cyclopentanone | 45.00 parts by mass |
| Tetrahydrofuran | 45.00 parts by mass |
| Benzyl alcohol | 5.00 parts by mass |

[Preparation of Coating Liquids K1 and K2 for Forming Cured Layer]

<Preparation of Coating Liquid K1 for Forming Cured Layer>

With the following composition, a coating liquid K1 for forming a cured layer was prepared, and was stirred and dissolved.

| | |
|---|---|
| The following mixture L-6 of rod-like liquid crystal compounds | 2.61 parts by mass |
| The following modified trimethylol propane triacrylate | 0.10 parts by mass |
| The following photopolymerization initiator I-1 | 0.05 parts by mass |
| The above interface modifier F-1 | 0.03 parts by mass |
| Polyethylene glycol diacrylate (Shin-Nakamura Chemical Co., Ltd., A-400) | 0.21 parts by mass |
| Methyl isobutyl ketone | 297 parts by mass |

<Preparation of Coating Liquid K2 for Forming Cured Layer>

With the following composition, a coating liquid K2 for forming a cured layer was prepared, and was stirred and dissolved.

| | |
|---|---|
| The following mixture L-6 of rod-like liquid crystal compounds | 2.63 parts by mass |
| The following modified trimethylol propane triacrylate | 0.11 parts by mass |
| The following photopolymerization initiator I-1 | 0.05 parts by mass |
| The following surfactant F-3 | 0.21 parts by mass |
| Methyl isobutyl ketone | 297 parts by mass |

Mixture L-6 of rod-like liquid crystal compounds (the numerical values in the following formulae represent % by mass, and R represents a group bonded by an oxygen atom.)

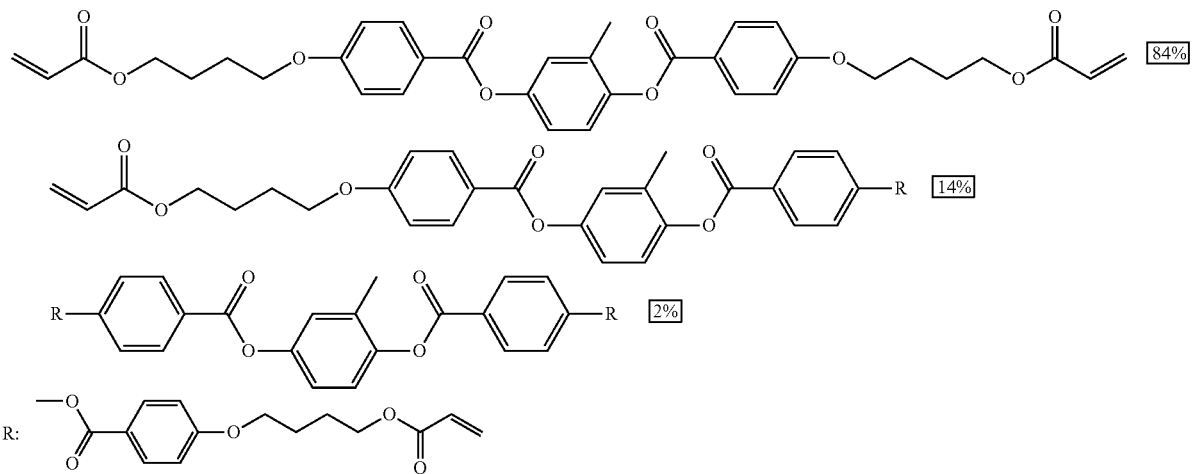

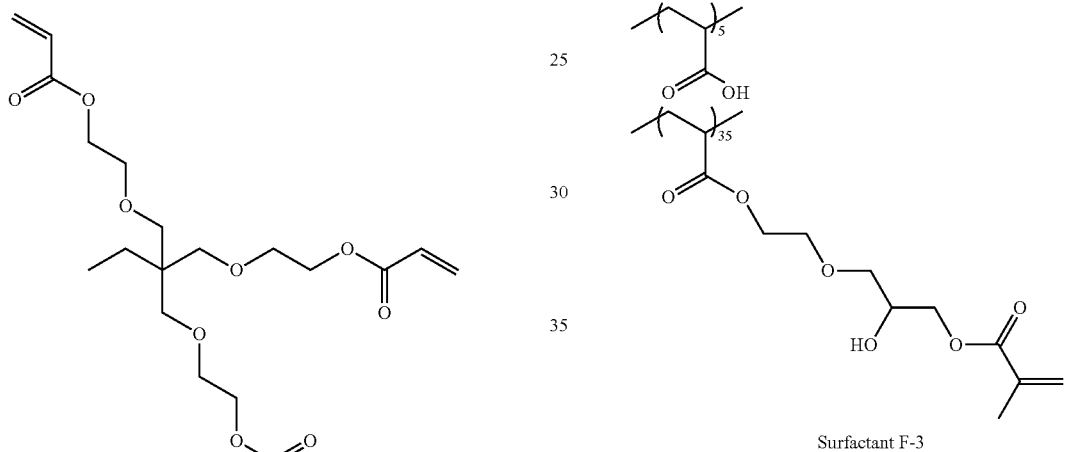

Modified trimethylol propane triacrylate

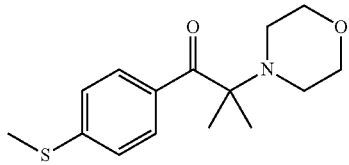

Photopolymerization initiator I-1

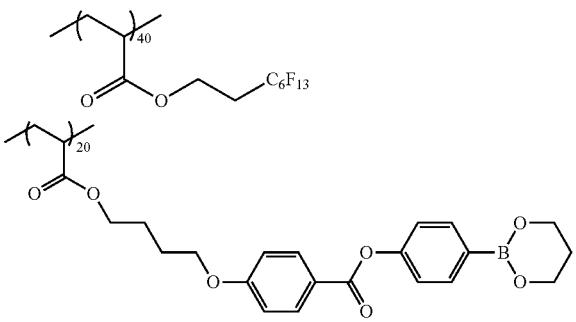

Surfactant F-3

[Production of Optical Laminate 40 of Production Example 40]

<Formation of Photo-Alignment Layer 40>

The above-described composition E7 for forming a photo-alignment layer was continuously applied onto a TAC film TJ40UL (thickness of 40 μm, manufactured by FUJIFILM Corporation) with a wire bar. The support on which the coating film was formed was dried with hot air at 140° C. for 120 seconds, and subsequently, the coating film was irradiated with polarized ultraviolet rays (10 mJ/cm², using an ultra-high-pressure mercury lamp) to form a photo-alignment layer 40, whereby a TAC film with a photo-alignment layer was obtained. A film thickness of the photo-alignment layer was 1.0 μm.

<Formation of Light-Absorbing Anisotropic Layer P17>

The above-described liquid crystal composition P17 was continuously applied onto the obtained photo-alignment layer 40 with a wire bar to form a coating layer P17.

Next, the coating layer P17 was heated at 140° C. for 30 seconds and a coating layer P17 was cooled to room temperature (23° C.).

Subsequently, the coating layer was heated at 90° C. for 60 seconds and cooled again to room temperature.

Thereafter, the coating layer was irradiated with light for 2 seconds under an irradiation condition of an illuminance of 200 mW/cm², using a LED lamp (center wavelength of 365 nm), to produce a light-absorbing anisotropic layer P17 on the photo-alignment layer 40. A film thickness of the formed light-absorbing anisotropic layer was 0.4 μm.

<Formation of Cured Layer K1>

The above-described coating liquid K1 for forming a cured layer was continuously applied onto the obtained light-absorbing anisotropic layer P17 with a wire bar to form a cured layer K1.

Subsequently, the cured layer K1 was dried at room temperature and then irradiated with light for 15 seconds under an irradiation condition of an illuminance of 20 mW/cm², using a high-pressure mercury lamp, in a room temperature environment to produce the cured layer K1 on the light-absorbing anisotropic layer P1. A film thickness of the cured layer K1 was 50 nm.

<Formation of Oxygen Shielding Layer B1>

A coating liquid having the following composition was continuously applied onto the cured layer K1 with a wire bar.

Thereafter, the layer was dried with hot air at 90° C. for 2 minutes to form a laminated film B1 in which a polyvinyl alcohol (PVA) alignment layer having a thickness of 1.0 μm was formed on the cured layer K1, whereby an optical laminate 40 was produced. Moreover, a front transmittance of the produced optical laminate 40 was 60% or less.

Composition of Composition B1 for Forming Oxygen Shielding Layer

| | |
|---|---|
| The following modified polyvinyl alcohol | 3.80 parts by mass |
| Initiator Irg2959 | 0.20 parts by mass |
| Water | 70 parts by mass |
| Methanol | 30 parts by mass |

Modified polyvinyl alcohol

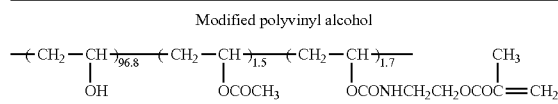

[Production of Optical Laminates 41 to 48 of Production Examples 41 to 48]

Optical laminates 41 to 48 were produced by the same method as for the optical laminate 40, except that the compositions used for forming the photo-alignment layer, the light-absorbing anisotropic layer, and the cured layer were changed to compositions shown in Table 4 below.

Furthermore, front transmittances of the produced optical laminates 41 to 48 were all 60% or less.

<Compulsory Evaluation of Alignment Defect>

The compulsory evaluation of an alignment defect was performed on the produced optical laminates 40 to 48 in the same manner as for the optical laminates produced in Production Examples 13 and 20 to 22. The results are shown in Table 4 below.

<Evaluation of Adhesiveness>

The produced optical laminates 40 to 48 were cut into a size of 25 mm×150 mm, a pressure sensitive adhesive tape consisting of a laminate of a pressure sensitive adhesive SK2057 (manufactured by Soken Chemical & Engineering Co., Ltd.) and TJ40UL was adhered to the surface of the oxygen shielding layer B1 of the laminate using a roller of 1 kg, and then the support of the optical laminate was peeled off. A test in which the same pressure sensitive adhesive tape was adhered to a peeled surface and then peeled off was performed, a maximum value of a load required in a case of peeling-off was measured, an average value of n10 was taken, and evaluation was performed according to the following standards. The results are shown in Table 4 below.

AAA: 4.0 N/10 mm or more

AA: 3.0 N/10 mm or more and less than 4.0 N/10 mm

A: 2.0 N/10 mm or more and less than 3.0 N/10 mm

B: 1.0 N/10 mm or more and less than 2.0 N/10 mm

C: less than 1.0 N/10 mm

TABLE 4

| | Photo-alignment layer | | Light-absorbing anisotropic layer | | | | | |
|---|---|---|---|---|---|---|---|---|
| | | | | Dichroic substance | | | Liquid crystalline compound | |
| | Composition | Photoactive compound | Composition | Kind | | Solid content proportion (% by mass) | Kind | Type |
| Production Example 40 | E7 | E-7 | P17 | D3 D4 | D8 | 24.7 | M5 | High-molecular |
| Production Example 41 | E7 | E-7 | P18 | D3 D4 | D8 | 24.7 | M5 M6 | High-molecular |
| Production Example 42 | E8 | E-8 | P19 | D3 D4 | D8 | 24.7 | M2 | High-molecular |
| Production Example 43 | E6 | E-6 | P19 | D3 D4 | D8 | 24.7 | M2 | High-molecular |
| Production Example 44 | E9 | E-9 | P17 | D3 D4 | D8 | 24.7 | M5 | High-molecular |
| Production Example 45 | E10 | E-10 | P17 | D3 D4 | D8 | 24.7 | M5 | High-molecular |
| Production Example 46 | E11 | E-11 | P17 | D3 D4 | D8 | 24.7 | M5 | High-molecular |
| Production Example 47 | E12 | E-12 | P17 | D3 D4 | D8 | 24.7 | M5 | High-molecular |
| Production Example 48 | E12 | E-12 | P20 | D3 D4 | D8 | 24.7 | M5 | High-molecular |

TABLE 4-continued

|  | Light-absorbing anisotropic layer Liquid crystalline compound | | | Evaluation result | | |
|---|---|---|---|---|---|---|
|  | Solid content proportion (% by mass) | Cured layer Composition | Oxygen shielding layer Composition | Alignment defect (compulsory) | Adhesiveness | Note |
| Production Example 40 | 73.8 | K1 | B1 | AAA | AA | Example |
| Production Example 41 | 73.8 | K1 | B1 | AAA | AAA | Example |
| Production Example 42 | 73.8 | K1 | B1 | AAA | B | Example |
| Production Example 43 | 73.8 | K1 | B1 | AAA | A | Example |
| Production Example 44 | 73.8 | K1 | B1 | AAA | A | Example |
| Production Example 45 | 73.8 | K1 | B1 | AAA | AAA | Example |
| Production Example 46 | 73.8 | K1 | B1 | AAA | AAA | Example |
| Production Example 47 | 73.8 | K1 | B1 | B | AAA | Example |
| Production Example 48 | 73.6 | K2 | B1 | AAA | AAA | Example |

From the results shown in Table 4, it can be confirmed that the optical laminate, which includes the light-absorbing anisotropic layer formed of the liquid crystal composition containing the high-molecular liquid crystalline compound having a radically polymerizable group, and the photo-alignment layer formed of the composition for forming a photo-alignment layer containing the photo-alignment copolymer having a cinnamoyl group and a radically polymerizable group, has excellent adhesiveness between the light-absorbing anisotropic layer and the photo-alignment layer in addition to having few alignment defects.

Production Examples 49 to 57

A low-reflection surface protective film was produced with reference to Sample No. 1 of Example 1 of JP2008-262187A.

A side of a support of the surface protective film was adhered to the oxygen shielding layer B1 of each of the optical laminates produced in Production Examples 40 to 48 using SK2057 (manufactured by Soken Chemical & Engineering Co., Ltd.) having a thickness of 20 μm as a pressure sensitive adhesive N1, and only a TJ40 film was removed to produce surface protective films 40 to 48 with a light-absorbing anisotropic layer.

<Production of Circularly Polarizing Plate>

The side of the optically anisotropic layer of the positive C-plate film 1 produced above was adhered to the side of the optically anisotropic layer of the λ/4 phase difference film 2 produced above through the pressure sensitive adhesive N1, and the cellulose acylate film 1 and the photo-alignment layer were removed.

Furthermore, the side of the photo-alignment layer of each of the surface protective films 40 to 48 with a light-absorbing anisotropic layer was adhered to the side (side of the surface exposed by removing the photo-alignment layer) of the optically anisotropic layer of the λ/4 phase difference film 2 through the pressure sensitive adhesive N1, the cellulose acylate film 2 and the alignment layer were removed to obtain surface protective films 40 to 48 with a circularly polarizing plate.

GALAXY S5 manufactured by SAMSUNG, having an organic EL panel (organic EL display element) installed therein, was disassembled, the touch panel with a circularly polarizing plate was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, and the surface protective film with a circularly polarizing plate produced above was adhered to the touch panel so that the positive C-plate film side was the panel side, thereby producing an organic EL display device.

With regard to the produced organic EL display device, the same evaluation as in a case of using PURE-ACE WR (manufactured by TEIJIN LIMITED) as a λ/4 plate was performed, and thus, it was confirmed that the same effect was exhibited even in a case of using the optical laminate of the λ/4 phase difference film 1 and the positive C-plate film 2 as a λ/4 plate.

EXPLANATION OF REFERENCES 100, 200, 300: Optical laminate
12: Transparent polymer film
14: Oxygen shielding layer
16: Photo-alignment layer
18: Light-absorbing anisotropic layer
20: Cured layer

What is claimed is:
1. An optical laminate comprising:
a photo-alignment layer; and
a light-absorbing anisotropic layer,
wherein a front transmittance of the optical laminate is 60% or less, and
the light-absorbing anisotropic layer is a layer formed of a liquid crystal composition containing a dichroic substance and a high-molecular liquid crystalline compound, and wherein the liquid crystal composition contains a high-molecular liquid crystalline compound having a repeating unit represented by Formula (1),

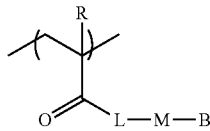

(1)

in Formula (1),
R represents a hydrogen atom or a methyl group;
L represents a single bond or a divalent linking group;
B represents a hydrogen atom, a halogen atom, a cyano group, an alkyl group, an alkoxy group, an amino group, an oxycarbonyl group, an acyloxy group, an acylamino group, an alkoxycarbonylamino group, a sulfonylamino group, a sulfamoyl group, a carbamoyl group, an alkylthio group, a sulfonyl group, a sulfinyl group, a ureido group, or a crosslinkable group; and
M represents a mesogenic group represented by Formula (1-1),

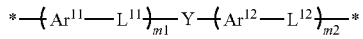

(1-1)

in Formula (1-1),
$Ar^{11}$ and $Ar^{12}$ each independently represent a phenylene group or a biphenylene group which may have a substituent;
$L^{11}$ and $L^{12}$ each independently represent a single bond or a divalent linking group including no an azo group;
Y represents an imino group, a —OCO—CH═CH— group, or a —CH═CH—$CO_2$— group;
m1 and m2 each independently represent an integer of 1 to 3;
in a case where m1 is an integer of 2 or 3, a plurality of $Ar^{11}$'s may be the same as or different from each other and a plurality of $L^{11}$'s may be the same as or different from each other; and
in a case where m2 is an integer of 2 or 3, a plurality of $Ar^{12}$'s may be the same as or different from each other and a plurality of $L^{12}$'s may be the same as or different from each other.

2. The optical laminate according to claim 1,
wherein in the liquid crystal composition, a proportion of a solid content of the high-molecular liquid crystalline compound is 55% to 95% by mass and a proportion of a solid content of the dichroic substance is 2% to 35% by mass.

3. The optical laminate according to claim 1,
wherein in the liquid crystal composition, the proportion of the solid content of the high-molecular liquid crystalline compound is 75% to 95% by mass and the proportion of the solid content of the dichroic substance is 5% to 25% by mass.

4. An optical laminate comprising:
a photo-alignment layer; and
a light-absorbing anisotropic layer,
wherein a front transmittance of the optical laminate is 60% or less, and
the light-absorbing anisotropic layer is a layer formed of a liquid crystal composition containing a dichroic substance and a high-molecular liquid crystalline compound, and
wherein the liquid crystal composition contains a high-molecular liquid crystalline compound having a repeating unit represented by Formula (2), and
in Formula (2), a difference between a logP value of P1, L1, and SP1 and a logP value of M1 is 4 or more,

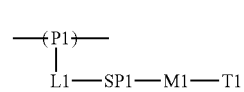

(2)

in Formula (2),
P1 represents a main chain of the repeating unit, L1 represents a single bond or a divalent linking group, SP1 represents a spacer group, M1 represents a mesogenic group, and T1 represents a terminal group,
provided that in a case where M1 has a linking group, an azo group is not included as a linking group.

5. The optical laminate according to claim 1,
wherein the liquid crystal composition contains a high-molecular liquid crystalline compound having a radically polymerizable group.

6. The optical laminate according to claim 1,
wherein the liquid crystal composition contains a low-molecular liquid crystalline compound having a radically polymerizable group.

7. The optical laminate according to claim 1,
wherein the photo-alignment layer is a layer formed of a composition containing a compound having a cinnamoyl group.

8. The optical laminate according to claim 1,
wherein the photo-alignment layer is a layer formed of a composition containing a compound having a cinnamoyl group and a crosslinkable group.

9. The optical laminate according to claim 1,
wherein the photo-alignment layer is a layer formed of a composition containing a compound having a cinnamoyl group and a radically polymerizable group.

10. The optical laminate according to claim 1,
wherein the photo-alignment layer is a photo-alignment layer which contains a photoactive compound having an azo group as a photoactive group, and the photoactive compound is a low-molecular compound which has a molecular weight of 1,000 or less and does not have a polymerizable group.

11. The optical laminate according to claim 1, further comprising:
a λ/4 plate.

12. An image display device comprising:
the optical laminate according to claim 1.

* * * * *